__US005311476A__

United States Patent [19]

Kajimoto et al.

[11] Patent Number: 5,311,476
[45] Date of Patent: May 10, 1994

[54] SEMICONDUCTOR MEMORY, COMPONENTS AND LAYOUT ARRANGEMENTS THEREOF, AND METHOD OF TESTING THE MEMORY

[75] Inventors: Takeshi Kajimoto; Yutaka Shimbo; Katsuyuki Sato; Masahiro Ogata; Kanehide Kenmizaki; Shouji Kubono; Nobuo Kato, all of Tokyo; Kiichi Manita, Kawagoe; Michitaro Kanamitsu, Tokyo, all of Japan

[73] Assignees: Hitachi, Ltd.; Hitachi VLSI Engineering Corp., both of Tokyo, Japan

[21] Appl. No.: 943,341

[22] Filed: Jun. 18, 1992

Related U.S. Application Data

[62] Division of Ser. No. 496,531, Mar. 20, 1990, Pat. No. 5,161,120.

[30] Foreign Application Priority Data

Mar. 20, 1990 [JP] Japan ................................ 1-65842

[51] Int. Cl.$^5$ ........................................... G11C 11/403
[52] U.S. Cl. ..................................... 365/222; 331/57; 331/186
[58] Field of Search ................ 365/222; 331/57, 186, 331/176; 307/296.2

[56] References Cited

U.S. PATENT DOCUMENTS

| 4,804,929 | 2/1989 | Kato et al. ........................... 331/57 |
| 4,811,295 | 3/1989 | Shinoda ........................... 365/189.05 |
| 4,853,654 | 8/1989 | Sakurai ........................... 331/57 |

OTHER PUBLICATIONS

Hitachi IC Memory Data Book, Hitachi, Ltd., pp. 229–234.

*Primary Examiner*—Joseph A. Popek
*Attorney, Agent, or Firm*—Antonelli, Terry, Stout & Kraus

[57] ABSTRACT

There is provided in connection with a semiconductor memory, such as of the pseudostatic RAM, a layout of the circuit components thereof including a method of testing the memory. There is provided an oscillation circuit which is capable of withstanding bumping of the power source voltage (varying) which effects stabilization regarding the operation of the circuits included therewith including a refresh timer circuit. There is also provided for testing a refresh timer circuit and a semiconductor memory which includes a refresh timer circuit. There is further provided for an output buffer which is capable of high speed operation with respect to memory data readout, a voltage generating circuit which is capable of stable operation and a fuse circuit, such as provided in connection with redundant circuitry in the memory and which is characterized as having a configuration of a fuse logic gate circuit employing complementary channel MOSFETs together with a fuse. With respect to the semiconductor memory, such as the pseudostatic RAM, the initial count of the refresh timer counter circuit of the refresh timer circuit can be set at an optional value by applying a signal to an address input terminal, and a test mode can be effected in which the refresh period can be set at an optional value by accordingly applying a test control signal to a predetermined external terminal. Therefore, the discharge current of the oscillation circuit capacitor associated with the refresh timer circuit becomes stabilized, noting the particular layout arrangement regarding the polycrystalline silicon layer forming the resistor of the oscillation circuit, and the fact that same parasitic capacitances are effectively connected between the polycrystalline silicon resistor and the supply voltage of the circuit and between the polycrystalline silicon resistor and the ground potential of the circuit thereby cancelling any variation of the output of the power source. Therefore, variation of the oscillation frequency of the oscillation circuit attributable to the bumping of the power source can be effectively suppressed.

42 Claims, 55 Drawing Sheets

READ MODIFY WRITE CYCLE

ADDRESS REFRESH CYCLE

AUTO REFRESH CYCLE

SELF REFRESH CYCLE

SEMICONDUCTOR MEMORY, COMPONENTS AND LAYOUT ARRANGEMENTS THEREOF, AND METHOD OF TESTING THE MEMORY

This is a division of application Ser. No. 07/496,531, filed Mar. 20, 1990, now U.S. Pat. No. 5,161,120.

BACKGROUND OF THE INVENTION

1. Field of the Invention

The present invention relates to a semiconductor memory and, more specifically, to techniques particularly effectively applied to pseudostatic RAMs (random access memories).

2. Description of the Related Art

A known pseudostatic RAM is designed on the basis of a dynamic RAM which can be constructed in a large scale of integration, and has an interface compatibility with an ordinary static RAM. The pseudostatic RAM has, in addition to an ordinary read/write mode, an address refresh mode and an autorefresh mode in which a refreshing action is executed once in response to an external control action, and a self-refresh mode in which a self-controlled refreshing action is executed periodically, for example, while the pseudostatic RAM is backed up by a battery. The pseudostatic RAM is provided internally with a refresh counter for sequentially specifying word lines for refreshing action in the autorefresh mode and the self-refresh mode, and a refresh timer circuit for periodically starting the refreshing action in the self-refresh mode.

The pseudostatic RAM having the autorefresh and self-refresh modes is described, for example, in "Hitachi IC Memory Data Book", Hitachi, Ltd., pp. 229–234, March, 1987.

The mean current consumption of the memory arrays of the pseudostatic RAM or the like in the self-refresh mode increases approximately in proportion to the reciprocal of the refresh period, i.e., the number of refresh cycles in a unit time. The refresh period in the self-refresh mode is dependent on the intrinsic information holding ability of the memory cells and the stability of the refresh timer circuit for setting the refresh period. Such conditions are restrictions on the reduction of the power consumption of the pseudostatic RAM or the like in operation backed up by batteries.

Prior to the present invention, the inventors of the present invention intended to stabilize the refresh period of the pseudostatic RAM and to increase the refresh period as near to the intrinsic information holding ability of the memory cells as possible by constructing the refresh timer circuit of an oscillation circuit, which is less dependent on the supply voltage, and a refresh timer counter circuit which counts the pulses of a pulse signal provided by the oscillation circuit and generates a predetermined refresh start signal, and by selectively opening corresponding fuse means to set an optional initial count for the refresh timer counter circuit.

However, the operating current of the oscillation circuit is limited, and the oscillation circuit needs a capacitor having a comparatively long charging or discharging period, and a comparatively large resistance, hence a comparatively long polycrystalline silicon resistor must necessarily be formed on a semiconductor substrate. Accordingly, the discharge current varies or the bumping (varying) of the supply voltage cannot be absorbed rapidly due to a large substrate capacitance, which is parasitic to the semiconductor substrate and the polycrystalline silicon resistor causing the variation of the frequency of oscillation of the oscillation circuit, for example, when the supply voltage applied to the oscillation circuit bumps (varies) during the discharge period of the capacitor. Therefore, the frequency of oscillation of the oscillation circuit must have a margin in relation with the information holding ability of the memory cells.

Although the oscillation circuit and refresh timer counter circuit of the pseudostatic RAM is capable of selectively changing the refresh period of the pseudostatic RAM, there is no means for testing and confirming the oscillation characteristics and variation characteristics. Accordingly, the refresh period is set inevitably by a trial-and-error method unless data of those characteristics is available. This fact, similarly, requires the frequency to be set with a margin in relation with the information holding ability of the memory cells, restricts the reduction of the power consumption of the pseudostatic RAM and increases the amount of work required for testing the pseudostatic RAM.

SUMMARY OF THE PRESENT INVENTION

It is a principal object of the present invention to provide an oscillation circuit capable of coping with the bumping of the power source to stabilize the actions of circuits including a refresh timer circuit.

It is another object of the present invention to provide a method of testing a refresh timer circuit and a semiconductor memory including a refresh timer circuit capable of precisely and efficiently testing the refresh timer circuit and the semiconductor memory including a refresh timer circuit.

It is a further object of the present invention to provide an output buffer capable of high-speed operation, a voltage generating circuit capable of stable operation and a fuse circuit of a simple construction, and to provide a method of laying out circuit components suitable for the pseudostatic RAM.

It is still a further object of the present invention to provide improvements in the power consumption, stability in operation and operating speed of the pseudostatic RAM having a self-refresh mode and comprising the foregoing circuits.

The above and other objects and novel features of the present invention will become more apparent from the detailed description given in this specification with reference to the accompanying drawings.

Representative aspects of the present invention disclosed in this application, which will be described in greater detail subsequently, will now be described briefly hereunder.

The reference potential of a MOSFET for setting the discharge current of the capacitor of an oscillation circuit included in the refresh timer circuit or the like of a pseudostatic RAM is supplied from other capacitors floating during the discharge period of the former capacitor. A well region connected to the supply voltage of the circuit is formed under one half of a polycrystalline silicon layer serving as the resistor of the oscillation circuit, and another well region connected to the ground potential of the circuit is formed under the other half of the polycrystalline silicon layer. The pseudostatic RAM or the like is provided with a test mode in which an optional initial count can be set for the refresh timer counter circuit of the refresh timer circuit by applying a signal, for example, to an address input terminal, and a test mode in which an optional refresh period can be set by applying a test control signal to a predetermined external terminal.

As a result of the foregoing means, the discharge current of the capacitor of the oscillation circuit of the refresh timer or the like becomes stabilized and the variation of the power supply is nullified noting that substantially the same parasitic capacitances are provided between the polycrystalline silicon layer and the supply voltage and between the polycrystalline silicon layer and the ground potential. Hence, the variation of the oscillating frequency of the oscillation circuit attributable to the bumping of the power supply can be suppressed. Since the dependence of the performance characteristics of the oscillation circuit and the refresh timer counter circuit and the information holding ability of the memory cells on the address can efficiently be tested, the refresh period of the pseudostatic RAM can precisely be set at a value closer to the information holding ability of the memory cells. Consequently, the operation of the pseudostatic RAM can be stabilized and the reduction of power consumption of the pseudostatic RAM can be effected.

DESCRIPTION OF THE PREFERRED EMBODIMENTS

Basic Construction or Method and Their Features 1.1.1 Construction

Figure 1:
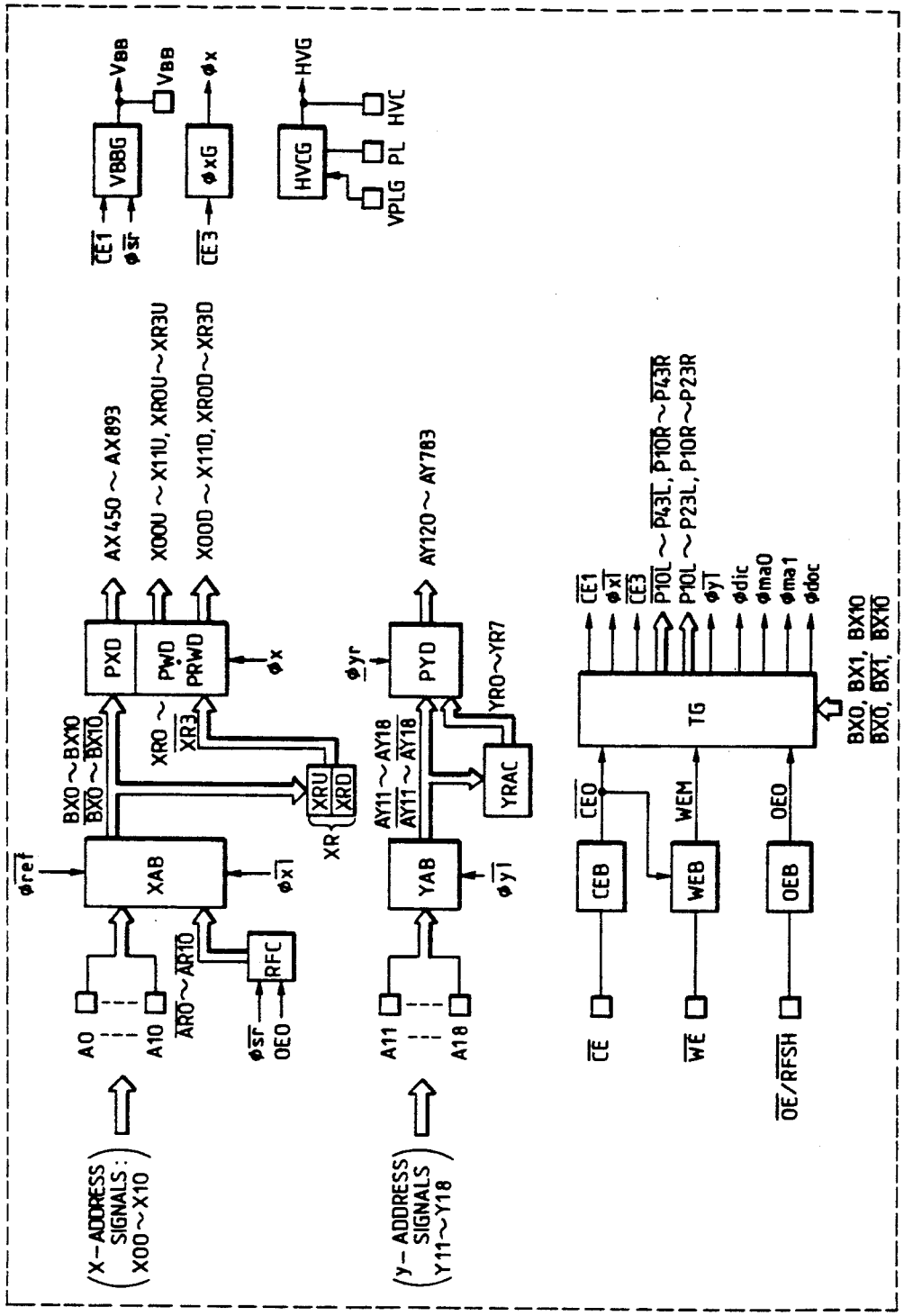
FIGS. 1 to 3 are block diagrams of a pseudostatic RAM embodying the present invention.
Figure 2:
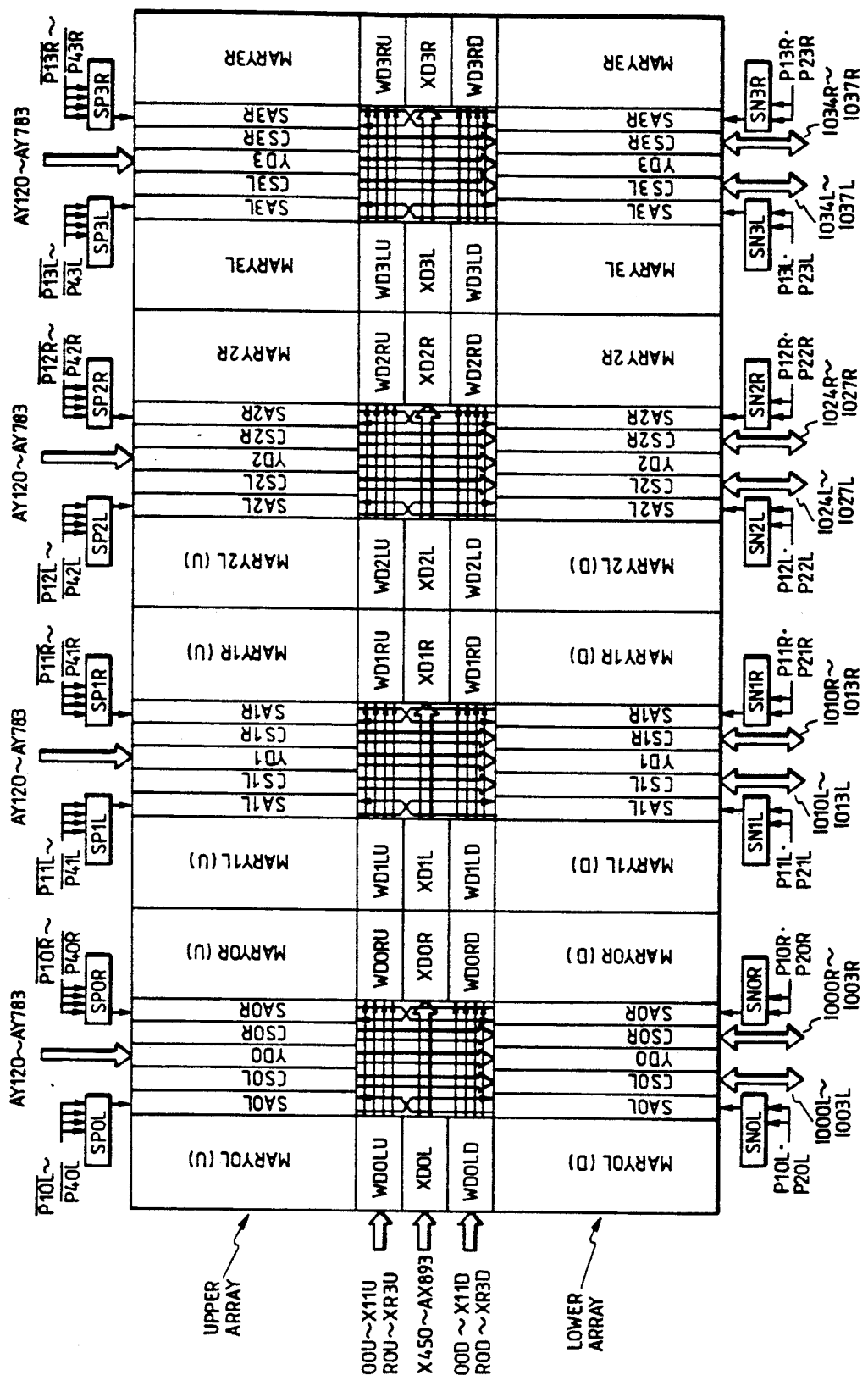
Figure 3:
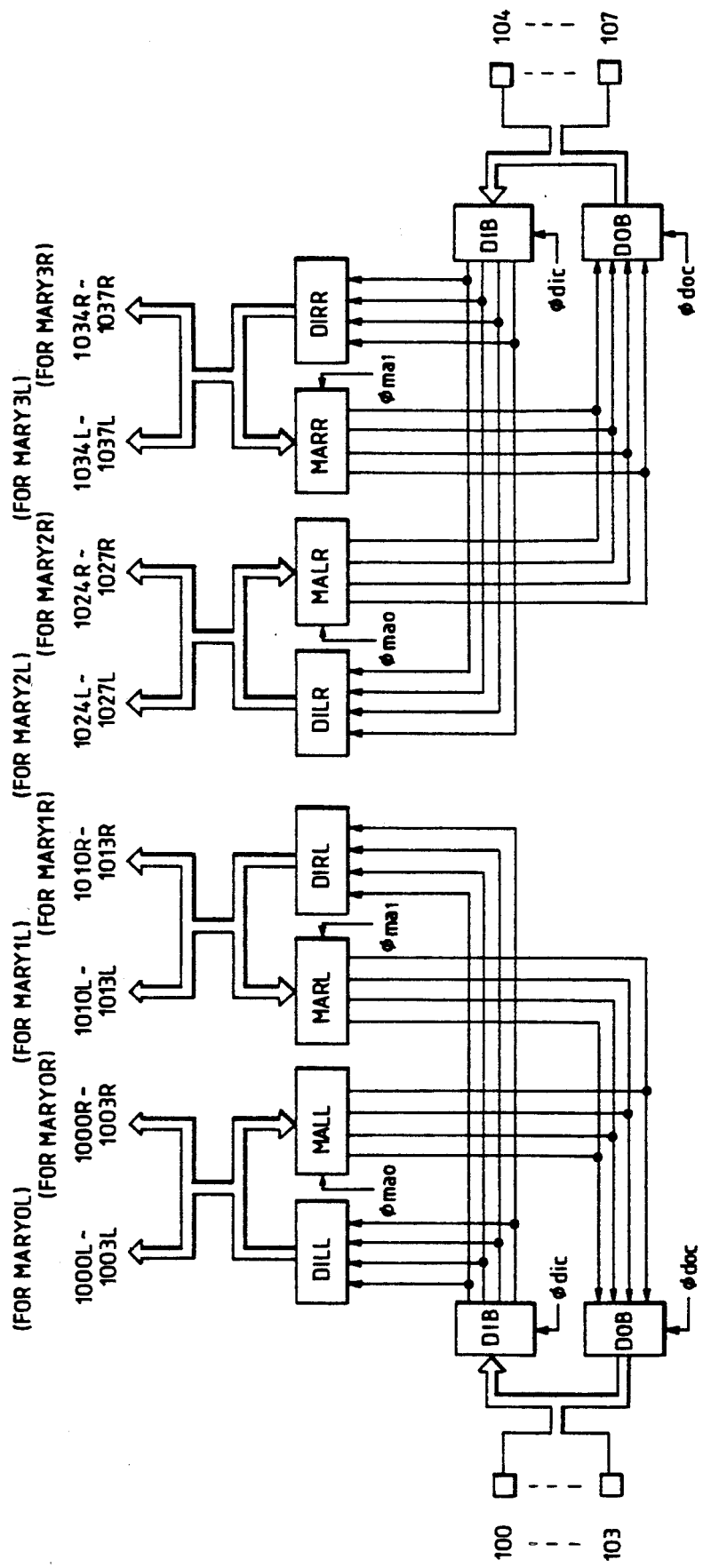

FIG. 1 is a block diagram of a selecting circuit and a timing signal generating circuit included in a pseudostatic RAM to which the present invention is applied, and a voltage generating circuit in a preferred embodiment according to the present invention. FIGS. 2 and 3 are block diagrams of the memory arrays and direct peripheral circuits of the pseudostatic RAM, and a data input circuit/data output circuit in a preferred embodiment according to the present invention, respectively. Although there is no particular restriction, the component circuit elements of the circuits shown in FIGS. 1 to 3 are formed on a single semiconductor substrate formed of a p-type single silicon crystal. In FIGS. 1 to 3 and the rest of the circuit diagrams, signal lines relating to input and output signals have their starting point on bonding pads. The specific construction, operation and features of each circuit will be described subsequently.

Basically, the pseudostatic RAM embodying the present invention has a construction similar to that of a dynamic RAM, and has memory arrays comprising memory cells of a so-called one-element dynamic type to form the circuit in a high degree of integration and to reduce power consumption. X-address signals X0 to X10 and Y-address signals Y11 to Y18 are applied respectively to individual address input terminals A0 to A10 and address input terminals A11 to A18. A chip enable signal $\overline{CE}$, a write enable signal $\overline{WE}$ and an output enable signal $\overline{OE}$ are used as control signals to provide an I/O interface capable of replacing an ordinary static RAM. The pseudostatic RAM has an address refresh mode in which a refresh operation is performed once every time a refresh address is specified by an external device (in this specification, the type of refresh operation or test operation is designated as "mode", and expressed, for example, as "address refresh mode", and actual memory access in each mode is designated as "operating cycle"), an autorefresh mode in which a refresh operation is performed once every time a refresh address is specified by an internal refresh counter RFC, and a self-refresh mode in which refresh operation relating to all the word lines is carried out intermittently and autonomously at a predetermined period by using the refresh counter RFC, an internal refresh timer circuit TMR and an internal refresh timer counter circuit SRC.

In this embodiment, although there is no particular restriction, the output enable signal $\overline{OE}$ is used also as a refresh control signal $\overline{RFSH}$. The operating mode of the pseudostatic RAM is set selectively by the output enable signal $\overline{OE}$ and the write enable signal $\overline{WE}$.

Referring to FIG. 1, the chip enable signal $\overline{CE}$, the write enable signal $\overline{WE}$ and the output enable signal $\overline{OE}$ (the refresh control signal $\overline{RFSH}$) supplied from an external device as start control signals are transferred through corresponding input buffers CEB, WEB and OEB to a timing signal generating circuit TG. An X-address buffer XAB applies three bits of complementary internal address signals BX0, BX1 and BX10 (the complementary internal address signal BX0, for example, represents a noninverted internal address signal BX0 and an inverted internal address signal $\overline{BX0}$ collectively, which applies similarly to other complementary signals) to the timing signal generating circuit TG. The timing signal generating circuit TG generates timing signals necessary for controlling the operation of the circuits of the pseudostatic RAM on the basis of the chip enable signal $\overline{CE}$, the write enable signal $\overline{WE}$, the output enable signal $\overline{OE}$ and the complementary internal address signals BX0, BX1 and BX10.

Although there is no particular restriction, eleven bits of external X-address signals X0 to X10 are applied respectively through the address input terminals A0 to A10 to one of the input terminals of an X-address buffer xAB, and eight bits of Y-address signals Y11 to Y18 are applied to a Y-address buffer YAB. The refresh counter RFC applies eleven bits of refresh address signals AR0 to AR10 to the other input terminal of the X-address buffer XAB. The timing signal generating circuit TG applies inverted timing signals $\overline{\phi ref}$ and $\overline{\phi xl}$ to the X-address buffer XAB, and applies an inverted timing signal $\overline{\phi yl}$ to the Y-address buffer YAB. As will be described afterward, the inverted timing signal $\overline{\phi ref}$ goes LOW selectively to select the autorefresh mode or the self-refresh mode of the pseudostatic RAM. When the pseudostatic RAM is in the selected state, the timing signals $\overline{\phi xl}$ and $\overline{\phi yl}$ go LOW selectively upon the decision of the levels of the X-address signals X0 to X10, the refresh address signals AR0 to AR10 or the Y-address signals Y11 to Y18.

The X-address buffer XAB accepts the X-address signals X0 to X10 through the external terminals in synchronism with the inverted timing signal $\overline{\phi xl}$ and holds the same when the pseudostatic RAM is in an ordinary write or read mode and the inverted timing signal $\overline{\phi ref}$ is HIGH. When the pseudostatic RAM is in the refresh mode and the inverted timing signal $\overline{\phi ref}$ is LOW, the X-address buffer XAB accepts the refresh address signals $\overline{AR0}$ to $\overline{AR10}$ provided by the refresh address counter RFC in synchronism with the inverted timing signal $\overline{\phi xl}$ and holds the same. The X-address buffer XAB produces the complementary internal address signals $\underline{BX0}$ to $\underline{BX10}$ on the basis of the X-address signals X0 to X10 or the refresh address signals AR0 to AR10. As mentioned above, the complementary internal address signals $\underline{BX0}$ and $\underline{BX1}$, corresponding to the two (2) lowermost significant bits thereof, are applied to the timing signal generating circuit TG, and three bits of complementary internal address signals $\underline{BX2}$, $\underline{BX3}$ and $\underline{BX10}$ are applied to a selective word line driving signal generating circuit PWD. The complementary internal address signals $\underline{BX4}$ to $\underline{BX9}$ of the remaining six bits are applied to an X-predecoder PXD and an X redundant circuit XR.

Each of the memory arrays of the pseudostatic RAM is provided with four redundant word lines and eight sets of redundant complementary data lines. The X redundant circuit XR (XRU, XRD) compares and collates bad addresses assigned to the redundant word lines and the complementary internal address signals $\underline{BX2}$ to $\underline{BX9}$ given thereto through the X-address buffer XAB bit by bit. When the addresses coincide with all the bits, corresponding inverted redundant word line selection signals $\overline{XR0}$ to $\overline{XR3}$ go LOW selectively. The inverted redundant word line selection signals $\overline{XR0}$ to $\overline{XR3}$ are applied to a selective redundant word line driving signal generating circuit PRWD provided in combination with the selective word line driving signal generating circuit PWD.

The selective word line driving signal generating circuit PWD produces selective word line driving signals X00U to X11U and X00d to X11D selectively on the basis of the complementary internal address signals $\underline{BX2}$, $\underline{BX3}$ and $\underline{BX10}$, and a word line driving signal $\phi x$ given thereto by a word line driving signal generating circuit $\phi XG$. The selective redundant word line driving signal generating circuit PRWD produces selective redundant word line driving signals XR0U to XR3U or XR0D to XR3D selectively on the basis of the corresponding word line driving signal $\phi x$, the inverted redundant word line selection signals $\overline{XR0}$ to $\overline{XR3}$ and the complementary internal address signal $\underline{BX10}$. The word line driving signal ox, the selective word line driving signals X00U to X11U (X00D to X11D) and the selective redundant word line driving signals XR0U to XR3U (XR0D to XR3D) are of a boost level exceeding the supply voltage of the circuit.

The X-predecoder PXD combines the successive two bits of complementary internal address signals $\underline{BX4}$ to $\underline{BX9}$ sequentially for decoding to produce corresponding predecode signals AX450 to AX453, AX670 to AX673 and AX890 to AX893 alternatively. These predecode signals are applied in common to the X-decoders.

Similarly, the Y-address buffer YAB accepts the Y-address signals Y11 to Y18 through the external terminals in synchronism with the inverted timing signal $\overline{\phi yl}$ and holds the same when the pseudostatic RAM is in the ordinary read or write mode, and then produces complementary internal address signals $\underline{AY11}$ to $\underline{AY18}$ on the basis of those Y-address signals. The complementary internal address signals $\underline{AY11}$ to $\underline{AY18}$ are applied to a Y-predecoder PYD and a Y redundant circuit YRAC.

The Y redundant circuit YRAC compares and collates bad addresses assigned to the redundant data lines and the complementary internal address signals $\underline{AY11}$ to $\underline{AY18}$ given thereto through the Y-address buffer YAB in memory access bit by bit. When the addresses coincides with all the bits, corresponding redundant data line selection signals YR0 to YR7 go HIGH selectively. The redundant data line selection signals YR0 to YR7 are applied through the Y-predecoder PYD to Y-decoders.

The Y-predecoder PYD combines the successive two bits of complementary internal address signals $\underline{AY11}$ to $\underline{AY18}$ sequentially for decoding to produce corresponding predecode signals AY120 to AY123, AR340 to AY343, AY560 to AY563 and AY780 to AY783 alternatively. These predecode signals are applied in common through corresponding signal lines to the Y-decoders. In this embodiment, the signal lines for transferring the predecode signals AY560 to AY563 and AY780 to AY783 to the Y-decoders are used also as signal lines for transferring the redundant data line selection signals YR0 to YR7. Thus, the Y-predecoder PYD also has a function to transfer the predecode signals AY560 to AY563 and AY780 to AY783 or the redundant data selection signals YR0 to YR7 selectively to the signal lines according to a complementary internal control signal $\overline{\phi yr}$ applied thereto by the Y redundant circuit YRAC.

As shown in FIG. 1, the pseudostatic RAM is provided further with a substrate back bias voltage generating circuit VBBG which generates a substrate back bias voltage VBB of a negative potential from the supply voltage of the circuit, a voltage generating circuit HVC which generates an internal voltage HVC approximately half the supply voltage of the circuit, and a word line driving signal generating circuit cxG which produces the word line driving signal $\phi x$.

Referring to FIG. 2, the pseudostatic RAM is provided with eight memory arrays MARY0L and MARY0R to MARY3L and MARY3R, which are divided substantially by the word lines. These memory arrays and corresponding sense amplifiers SA0L and SA0R to SA3L and SA3R and corresponding column switches CS0L and CS0R to CS3L and CS3R are arranged symmetrically respectively with respect to the corresponding Y-address decoders YD0 to YD3. The sense amplifiers, the column switches and the Y-decoders respectively corresponding to the memory arrays are divided by and disposed on opposite sides of the corresponding X-address decoders XD0L and XD0R to XD3L and XD3R. Such divisions of the sense amplifiers, the column switches and the Y-decoders are identified by marks (U) and (D) in the respectively corresponding arrays. In the following description, the marks (U) and (D) will be omitted for simplicity, except when necessary. The group of the memory arrays disposed above the X-decoders is denoted as an upper array, and that of the memory arrays disposed below the X-decoders is denoted as a lower array. Incidentally, the memory arrays MARY0L to MARY3L and MARY0R to MARY3R are brought selectively into the active state by alternatively bringing a specified word line into the selected state. In this embodiment, two of the eight memory arrays, namely, the memory arrays MARY0L and MARY2L (or MARY0R and MARY2R) or the memory arrays MARY1L and MARY3L (or MARY1R and MARY3R), are brought simultaneously into the active state to set the pseudostatic RAM in the ordinary read or write mode or the autorefresh mode. In such a case, the upper array or the lower array is brought alternatively into the active state according to the complementary internal address signal BX10, and the four sets of selected data lines of the two memory arrays in the active state are connected simultaneously to corresponding main amplifiers MARL and MARR or main amplifiers MARL and MARR, or the corresponding unit circuits of write circuits DILL and DILR or write circuits DIRL and DIRR. Thus, the pseudostatic RAM functions as a so-called x8-bit RAM capable of simultaneously accepting or sending out eight bits of data.

Although there is no particular restriction, the eight memory arrays are brought simultaneously into the active state to set the pseudostatic RAM in the self-refresh mode. In such a case, the memory arrays of the upper array or the lower array are brought selectively into the active state according to the complementary internal address signal BX10 of the most significant bit for the simultaneous refreshing of the eight word lines to be brought into the selected state of these memory arrays. This refresh cycle is repeated autonomously and periodically at a period four times the ordinary refresh period, and the refresh address counter RFC is updated sequentially. Consequently, the refresh rate in the self-refresh mode is diminished to one-fourth and the mean current consumption of the memory arrays is reduced accordingly.

Referring to FIG. 3, the pseudostatic RAM is provided with eight data input-output terminals IO0 to IO7 respectively for accepting or sending out eight bits of data, a data input buffer DIB having eight unit circuits, i.e. corresponding in number to the number of data input-output terminals, and a data output buffer DOB having eight unit circuits, i.e. corresponding in number to the number of data input-output terminals. The data input-output terminals IO0 to IO7 are connected to the input terminals of the corresponding unit circuits of the data input buffer DIB and to the output terminals of the corresponding unit circuits of the data output buffer DOB. The timing signal generating circuit TG applies timing signals $\phi$dic and $\phi$doc respectively to the data input buffer DIB and the data output buffer DOB. Although there is no particular restriction, the timing signal $\phi$dic goes HIGH selectively in accordance with a decision (determination) having been made of the level of the input data applied to the data input-output terminals IO0 to IO7 when the pseudostatic RAM is in the ordinary write mode. The timing signal $\phi$doc goes HIGH selectively in accordance with decision (determination) having been made of the level of read signals of the selected eight memory cells when the pseudostatic RAM is in the ordinary read mode.

The output terminals of the four lower unit circuits of the data input buffer DIB are connected respectively to the input terminals of the corresponding unit circuits of write circuits DILL and DILR. The output terminals of the four upper unit circuits of the data input buffer DIB are connected respectively to the input terminals of the corresponding unit circuits of write circuits DILR and DIRR. Similarly, the input terminals of the four lower unit circuits of the data output buffer DOB are connected respectively to the output terminals of the corresponding unit circuits of the main amplifiers MALL and MARL, and the input terminals of the four upper unit circuits of the data output buffer DOB are connected respectively to the output terminals of the corresponding unit circuits of the main amplifiers MALR and MARR. The timing signal generating circuit TG applies a timing signal $\phi$ma0 to the main amplifiers MALL and MALR, and applies a timing signal $\phi$mal to the main amplifiers MARL and MARR.

When the pseudostatic RAM is in the selected state during the operating cycle of the write system, the data input buffer DIB accepts input data applied to the data input-output terminals IO0 to IO7 in synchronism with the timing signal $\phi$dic and writes the input data through the corresponding unit circuits of the write circuits DILL and DILR or DIRL and DIRR in the eight memory cells which are selected simultaneously. When the pseudostatic RAM is in the selected state during the operating cycle of the read system, the data output buffer DOB accepts eight bits of read signals amplified by the main amplifiers MALL and MALR or MARL and MARR as selected by timing signals $\phi$ma0 or $\phi$mal, respectively, in synchronism with the timing signal $\phi$doc and sends out the same through the corresponding data input-output terminals IO0 to IO7 to an external device. While the timing signal $\phi$doc is LOW, the output of the data output buffer DOB is in the high-impedance state.

1.1.2 Operating Cycles

The operating cycles of the pseudostatic RAM embodying the present invention are tabulated in Table 1.

TABLE 1

| | |
|---|---|
| 1 | Read cycle |
| 2 | Write cycle |
| 3 | Read modify write cycle |
| 4 | Address refresh cycle |
| 5 | Autorefresh cycle |
| 6 | Self-refresh cycle |
| 7 | Test cycle |

Shown in FIGS. 5 to 11 are time charts provided in connection with explaining the operating cycles shown in Table 1. The features of the operating cycles of the pseudostatic RAM will be described hereinafter.

(1) Read Cycle

Figure 5:
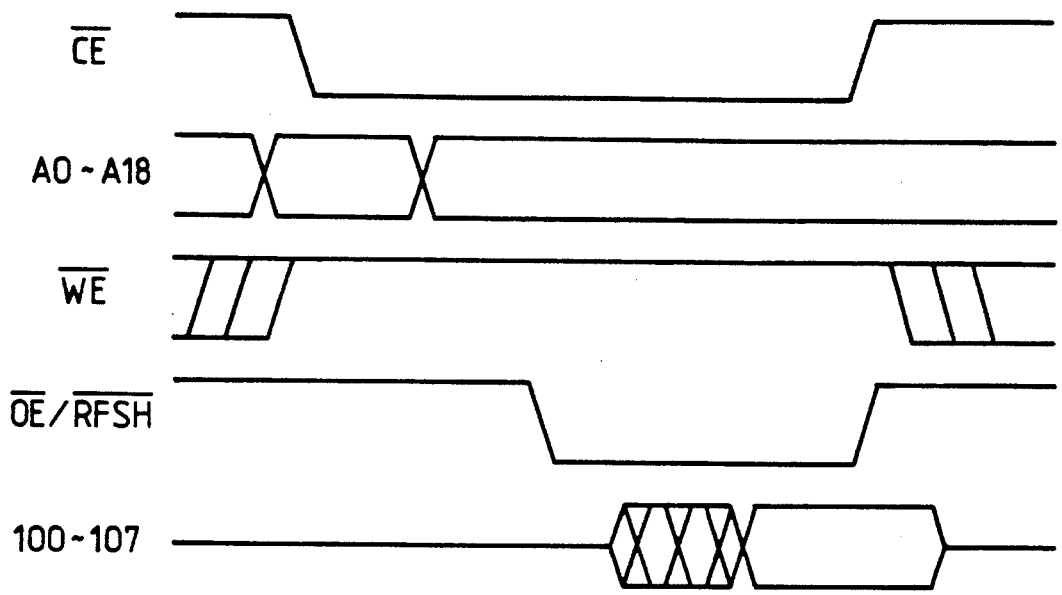
FIGS. 5 to 11($a$ to $c$) are timing charts of assistance in explaining the different operating cycles executed by a pseudostatic RAM embodying the present invention.

Referring to FIG. 5, the pseudostatic RAM executes the read cycle when both the write enable signal $\overline{WE}$ and the output enable signal $\overline{OE}$, i.e., the refresh control signal $\overline{RFSH}$, are HIGH at the trailing edge of the chip enable signal $\overline{CE}$. The output enable signal $\overline{OE}$ goes LOW temporarily at time where the read data output operation may not be delayed. Eleven bits of X-address signals and eight bits of Y-address signals are applied respectively to the address input terminals A0 to A10 and the address input terminals A11 to A18 of the selecting circuit (FIG. 1) at the trailing edge of the chip enable signal $\overline{CE}$. Normally, the data input-output terminals IO0 to IO7 are in the high-impedance state. Eight bits of read data provided by the eight memory cells which are brought simultaneously into the selected state appear at the data input-output terminals IO0 to IO7 after the passage of a predetermined access time.

(2) Write Cycle

Figure 6:
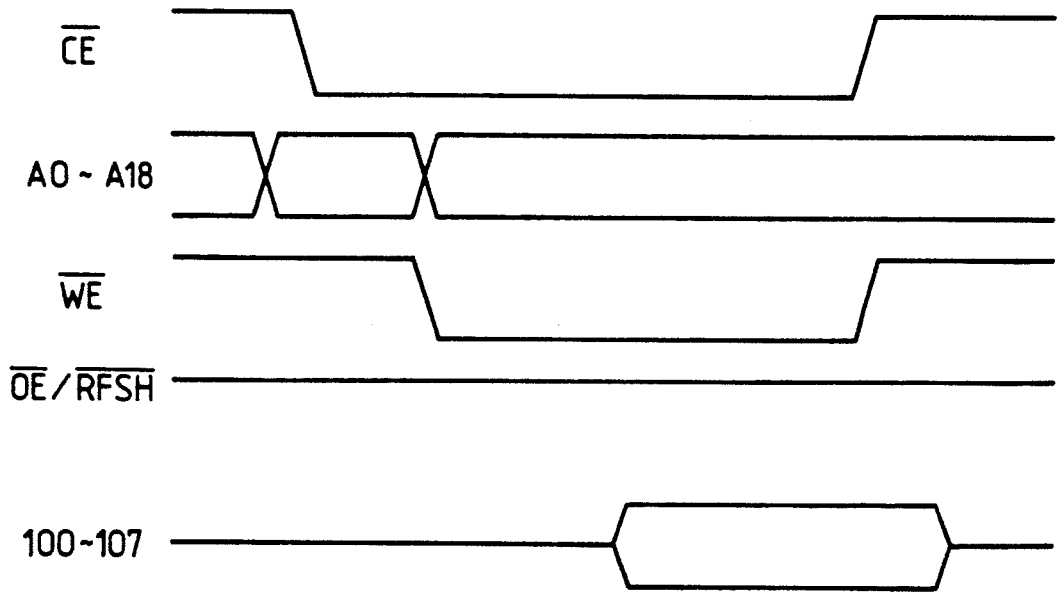

Referring to FIG. 6, the pseudostatic RAM executes the write cycle at the trailing edge of the chip enable signal CE, when the output enable signal is HIGH, and the write enable signal WE is changed from HIGH to LOW prior to the transition of the chip enable signal CE from HIGH to LOW or is changed temporarily from HIGH to LOW at predetermined time with a delay relative to the chip enable signal CE. The X- and Y-address signals are applied respectively to the address input terminals A0 to A10 and the address input terminals A11 to A18 of the selecting circuit, and eight bits of write data are applied to the data input-output terminals IO0 to IO7 at time where the write operation may not be delayed.

(3) Read Modify Write Cycle

Figure 7:
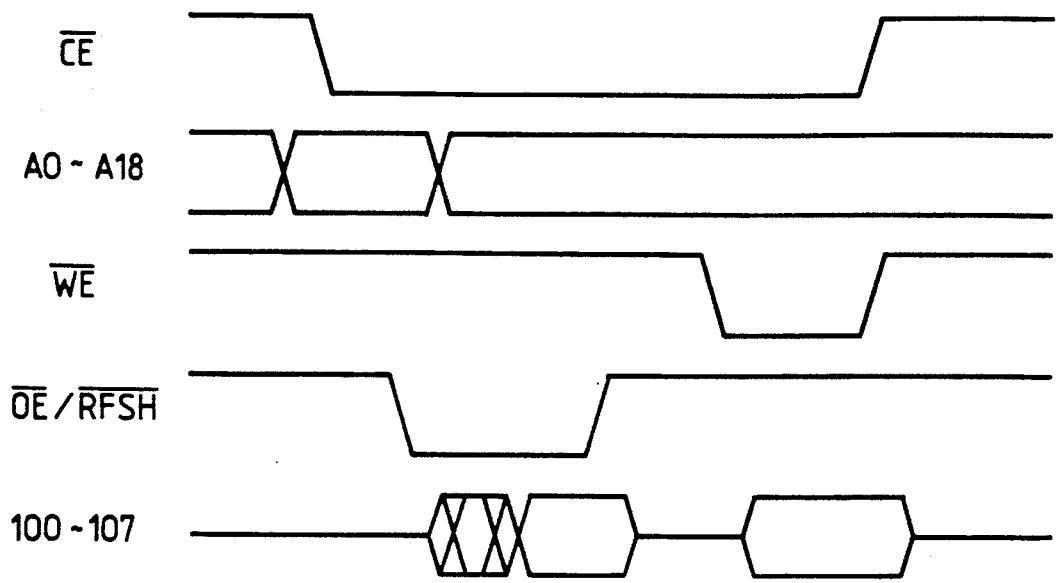

The read modify write cycle is a combination of the read cycle and the write cycle. Referring to FIG. 7, since the output enable signal $\overline{OE}$ and the write enable signal $\overline{WE}$ are HIGH at the trailing edge of the chip enable signal $\overline{CE}$, first the pseudostatic RAM starts the read cycle and subsequently, when the write enable signal $\overline{WE}$ goes LOW temporarily, performs the write cycle. Read data stored in a specified address is sent out through the data input-output terminals IO0 to IO7, and eight bits of write data applied to the data input-output terminals IO0 to IO7 are subsequently written in the addressed locations when the write enable signal $\overline{WE}$ goes LOW temporarily.

(4) Address Refresh Cycle

Figure 8:
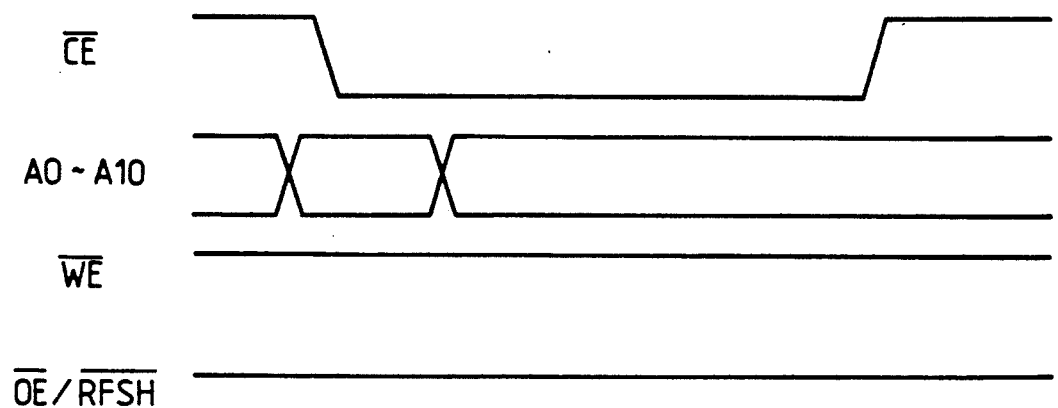

Referring to FIG. 8, the pseudostatic RAM executes the address refresh cycle when the write enable signal $\overline{WE}$ and the output enable signal $\overline{OE}$ are HIGH at the trailing edge of the chip enable signal $\overline{OE}$, and the write enable signal $\overline{WE}$ and the output enable signal $\overline{OE}$ stabilize at HIGH thereafter. Eleven bits of X-address signals specifying the word lines to be refreshed are applied to the address input terminals A0 to A10 of the selecting circuit. In the address refresh cycle, as well as in the read cycle, the two memory arrays of the pseudostatic RAM are brought simultaneously into the selected state and one word line of one of the two memory arrays and one word line of the other memory array, hence two word lines in total, are brought simultaneously into the selected state. Then, the data stored in the 1024 memory cells connected to one of the two word lines and the 1024 memory cells connected to the other word line, hence 2048 memory cells, are placed simultaneously on the corresponding complementary data lines to subject the data to the refreshing action of the corresponding unit amplifiers of the sense amplifiers.

(5) Autorefresh Cycle

Figure 9:
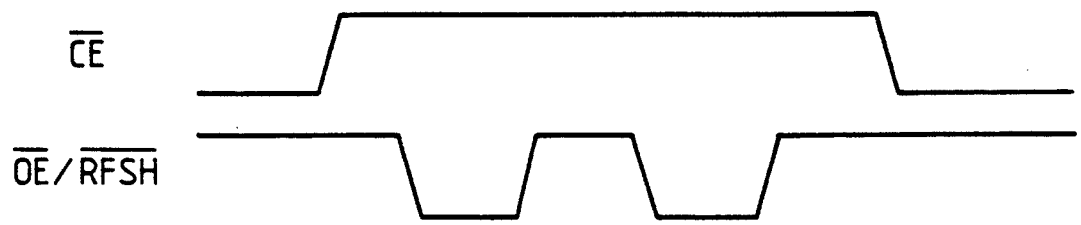

Referring to FIG. 9, the pseudostatic RAM executes the autorefresh cycle when the output enable signal $\overline{OE}$ is changed temporarily from HIGH to LOW for a comparatively short time with the chip enable signal $\overline{CE}$ held HIGH. The internal refresh counter RFC of the pseudostatic RAM provides refresh addresses specifying the word lines to be refreshed for the autorefresh cycle.

The two word lines of the pseudostatic RAM specified by the refresh addresses provided by the refresh counter RFC are brought simultaneously into the selected state, and the corresponding 2048 memory cells in total are refreshed simultaneously. The refresh counter RFC is updated automatically upon the acceptance of the output signals thereof, i.e., refresh addresses, by the X-address buffer.

(6) Self-Refresh Cycle

Figure 10:
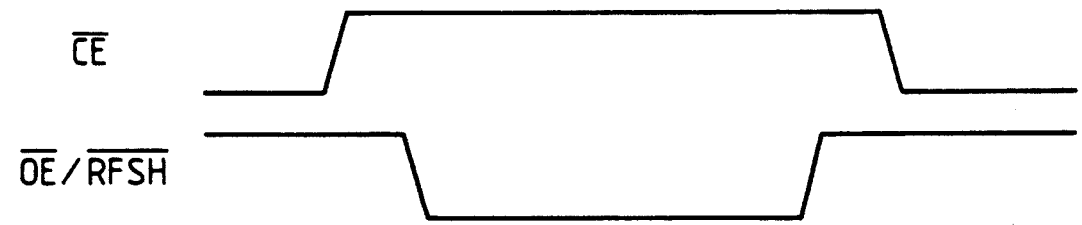

Referring to FIG. 10, the pseudostatic RAM is set in the self-refresh mode by holding the output enable signal OE, i.e., the refresh control signal $\overline{RFSH}$, in LOW for a comparatively long time with the chip enable signal $\overline{CE}$ held HIGH.

The pseudostatic RAM executes the first self-refresh cycle in the self-refresh mode upon the actuation of the, refresh timer counter SRC. Thereafter, the self-refresh cycle is repeated at a period corresponding to the predetermined frequency of the refresh start signal provided by the refresh timer counter SRC. The refresh timer counter RFC specifies refresh addresses sequentially.

Incidentally, in the self-refresh cycle, the eight memory arrays of the pseudostatic RAM are brought simultaneously into the active state to set eight word lines in total in the selected state. Consequently, the 8192 memory cells connected to these word lines are refreshed simultaneously to reduce the mean operating current of the memory arrays.

(7) Test Cycle

Referring to FIG. 11, the pseudostatic RAM executes selectively test cycles of three different test modes when the voltage of the output enable signal $\overline{OE}$, and the write enable signal $\overline{WE}$ or the chip enable signal $\overline{CE}$ are increased to a predetermined high voltage exceeding the supply voltage of the circuit. The pseudostatic RAM identifies the selected test mode from the start control signals $\overline{CE}$, $\overline{WE}$ and $\overline{OE}$ which are of the high voltage, and starts the corresponding test cycle. The contents of the test modes and the operation of the pseudostatic RAM in the test cycles will be described subsequently.

1.1.3 Test Method

Although there is no particular restriction, the pseudostatic RAM has three test modes tabulated in Table 2, in which the pseudostatic RAM is tested through the external terminals after completion.

TABLE 2

| No. | High-Voltage Terminal | Test Mode |
| --- | --- | --- |
| 1 | $\overline{OE}$ | ECRF (extra control refresh) |
| 2 | $\overline{WE}$ | RCC (refresh counter check) |
| 3 | $\overline{CE}$ | STIC (self timer check) |

(1) ECRF Test Mode

Figure 11A:
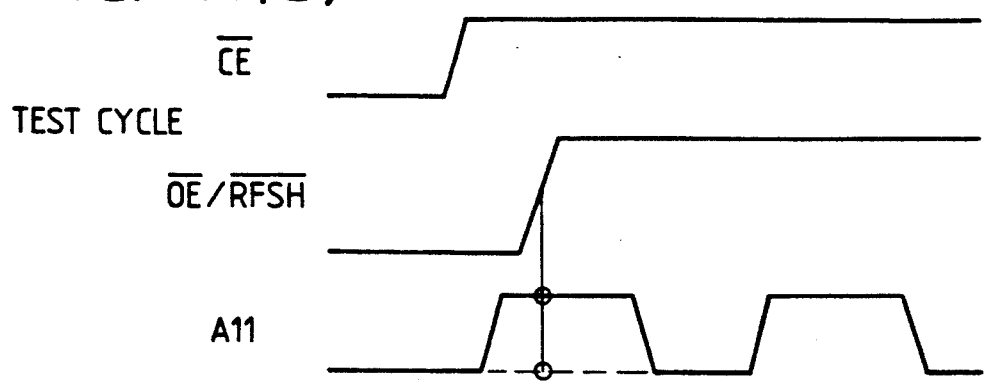

Referring to FIG. 11(a), the pseudostatic RAM executes a test cycle in the ECRF test mode when the voltage of the output enable signal $\overline{OE}$ is raised to the predetermined high voltage with the chip enable signal $\overline{CE}$ held HIGH. In the ECRF test mode, a set test control signal is applied to the address input terminal A11 of the pseudostatic RAM. The pseudostatic RAM is set in the self-refresh mode when the test control signal is HIGH at the leading edge of the output enable signal $\overline{OE}$ or the same is set in the autorefresh mode when the test control signal is LOW at the leading edge of the output enable signal $\overline{OE}$. In the self-refresh mode and the autorefresh mode, refresh addresses are applied to the address input terminals A0 to A10 of the pseudostatic RAM. These refresh cycles are repeated by repeatedly changing the test control signal from LOW to HIGH. The refresh addresses applied to the address input terminals A0 to A10 are accepted every time the test control signal rises.

Thus, the address dependence and the like of the pseudostatic RAM in the refresh operation can be tested and confirmed. The characteristics of the pseudostatic RAM including information holding characteristics can be tested and confirmed by optionally varying the refresh period by the test control signal.

(2) RCC Test Mode

Figure 11B:
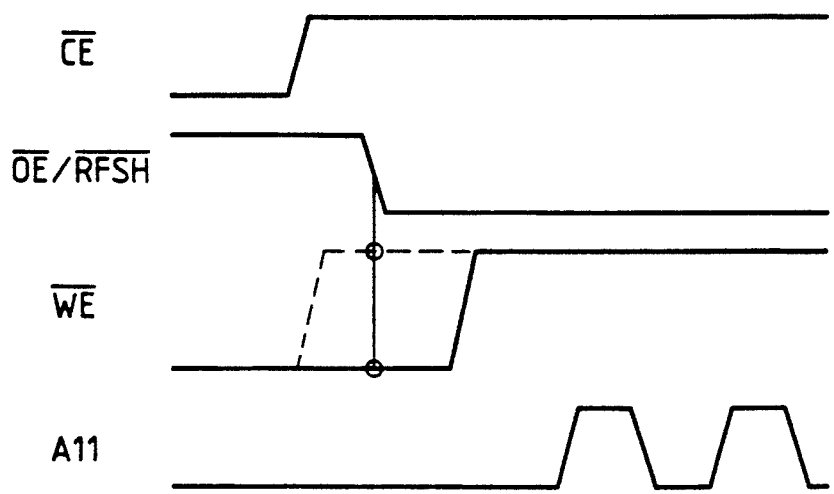

Referring to FIG. 11(b), the pseudostatic RAM executes test cycles selectively in the RCC test mode, when the chip enable signal $\overline{CE}$ is held HIGH, the output enable signal $\overline{OE}$ is changed to LOW, and the write enable signal $\overline{WE}$ is set at the predetermined high voltage exceeding the supply voltage of the circuit before or after the trailing edge of the output enable signal $\overline{OE}$. When the write enable signal $\overline{WE}$ is set at the high voltage after the trailing edge of the write enable signal $\overline{OE}$, the pseudostatic RAM is set in the self-refresh mode. When the write enable signal $\overline{WE}$ is set at the high voltage before the trailing edge of the write enable signal $\overline{OE}$, the pseudostatic RAM is set in the autorefresh mode. In the RCC test mode, refresh address is specified by the refresh counter RFC. The refresh counter RFC is updated at the trailing edge of the test control signal applied to the address input terminal A11. In these refresh cycles, the word lines of the pseudostatic RAM are selected sequentially and writing operation is performed for the memory cells of specified column addresses. Thus, the counting function of the refresh counter of the pseudostatic RAM can be tested and confirmed by sequentially reading out items of data written in the specified addresses of each word line by an ordinary read cycle and collating the same.

(3) STIC Test Mode

Figure 11C:
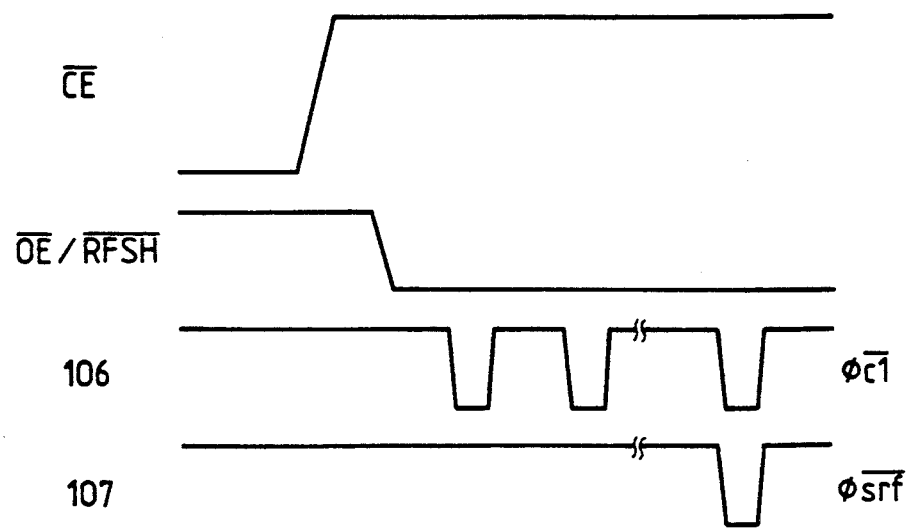

Referring to FIG. 11(c), the pseudostatic RAM executes the test cycle in the STIC test mode when the chip enable signal $\overline{CE}$ is set at the high voltage exceeding the supply voltage of the circuit and the output enable signal $\overline{OE}$ is changed from HIGH to LOW with a slight delay. The pseudostatic RAM operates in the self-refresh mode. The output signal of the refresh timer circuit TMR, i.e., an inverted timing signal $\overline{\phi cl}$ counted by the refresh timer counter circuit SRC, is provided through the data input-output terminal IO6, and an inverted timing signal $\overline{\phi srf}$ for deciding a refresh period for the self-refresh mode is provided through the data input-output terminal IO7.

Thus, the refresh period of the pseudostatic RAM in the self-refresh mode can be tested and confirmed.

Thus, the pseudostatic RAM identifies the test mode by and starts the test cycle in accordance with the voltage levels of the start control signals including the chip enable signal $\overline{CE}$, the write enable signal $\overline{WE}$ and the output enable signal $\overline{OE}$ being selectively set at the high voltage exceeding the supply voltage of the circuit. Accordingly, the setting of the test mode and the start of the test cycle are achieved simultaneously, which simplifies the test operation of the pseudostatic RAM.

Incidentally, the internal refresh timer counter circuit SRC of the pseudostatic RAM is an 8-bit binary counter, and the initial count, namely, the counter module, of the refresh timer counter circuit SRC is set selectively by selectively opening fuse means respectively corresponding to the eight bits. Accordingly, although not employed in testing this pseudostatic RAM, a method as shown in FIG. 50 is applicable to the effective testing of the characteristics of the refresh timer counter circuit SRC.

Figure 50:
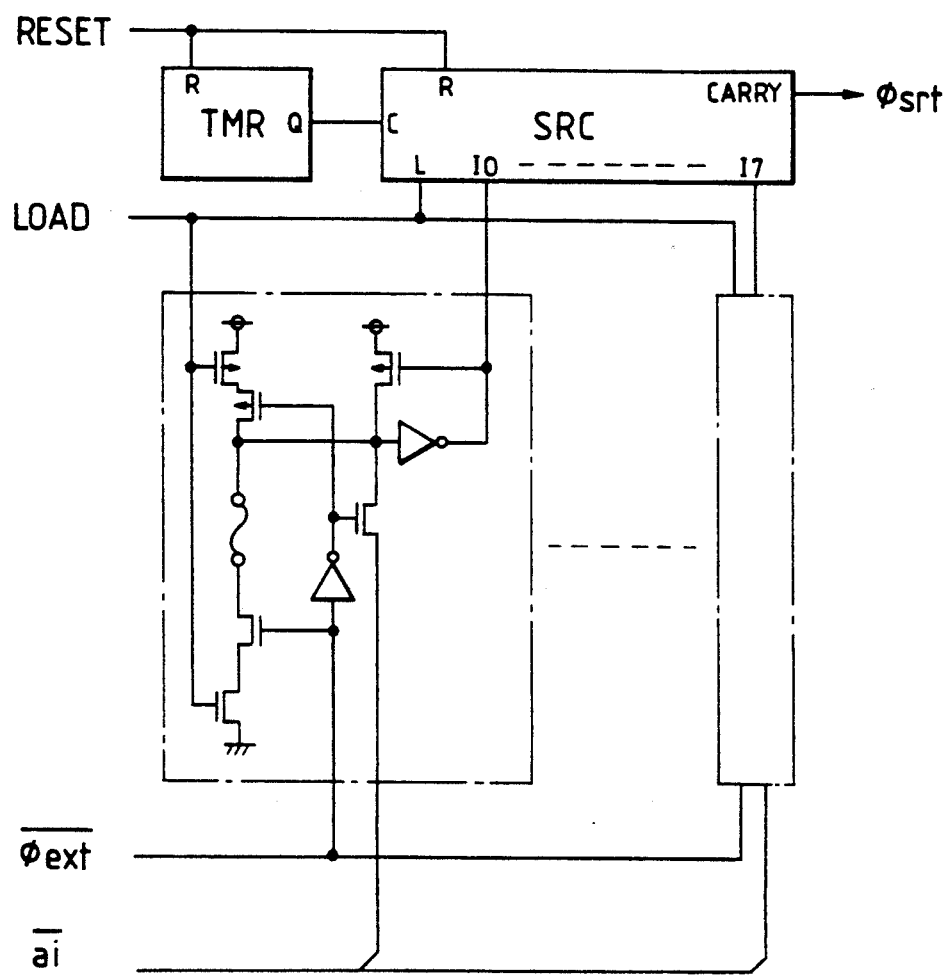

Referring to FIG. 50, the initial counts of the refresh timer counter circuit SRC are applied, for example, to the address input terminals A0 to A7 of the pseudostatic RAM. These initial counts, i.e., inverted internal signals $\overline{ai}$ are accepted by the corresponding bits of the refresh timer counter circuit SRC when the inverted timing signal $\overline{\phi ext}$ becomes changed from HIGH to LOW to set the initial counts of the refresh timer counter circuit SRC. Consequently, the characteristics of the refresh timer circuit TMR and the refresh timer counter circuit SRC corresponding to the initial counts can be tested and confirmed, and the operating characteristics of the pseudostatic RAM can be tested and confirmed by changing the refresh period of the pseudostatic RAM.

1.1.4 Address Construction and Selecting Method

As stated above, the pseudostatic RAM is of a nonaddress multiplex system and has the nineteen address input terminals A0 to A18 and the sixteen memory arrays in eight pairs each of the upper array and the lower array. As will be described later, each memory array has 256 word lines, which are set alternatively in the selected state, divided into 64 groups each of four word lines, and 1024 sets of complementary data lines four sets of which are set simultaneously and selectively in the selected state. Therefore, each memory array has substantially 262,144 address spaces, i.e., 256 KB address spaces, and hence the pseudostatic RAM has a storage capacity of 4 MB.

With the pseudostatic RAM in the selected state in the ordinary operating mode, the substantially two paired memory arrays among the sixteen memory arrays are selected at a time. Four memory cells of each memory array of the two paired memory arrays which are set simultaneously in the active state, i.e., the eight memory cells in total, are selected and connected to corresponding common IO lines. These memory cells are connected also through the corresponding write circuit to the corresponding unit circuits of the data input buffer DIB or through the corresponding main amplifier to the data output buffer DOB.

Although there is no particular restriction, address signals applied to the nineteen address input terminals A0 to A18 of the pseudostatic RAM are classified as shown in Table 3 for specific purposes.

TABLE 3

| Signal | Class | Function | |
|---|---|---|---|
| A0 | x | Array selection | Selection of paired arrays |
| A1 | | | |
| A2 | a | Selection of word lines in each group | Formation of selective word line driving signals X00 to X11 |
| A3 | d | | |
| A4 | d | Selection of word line group | Formation of predecode signals AX450 to AX453 |
| A5 | r | | |
| A6 | e | | Formation of predecode signals AX670 to AX673 |
| A7 | s | | |
| A8 | s | | Formation of predecode signals AX890 to AX893 |
| A9 | | | |
| A10 | | Array selection | Selection of upper or lower array |
| A11 | | Selection of data line | Formation of predecode signals AY120 to AY123 |
| A12 | | | |
| A13 | | Selection of data line | Formation of predecode signals AY340 to AY343 |
| A14 | | | |
| A15 | | Selection of data line | Formation of predecode signals AY560 to AY563 |
| A16 | | | |
| A17 | | Selection of data line | Formation of predecode signals AY780 to AY783 |
| A18 | | | |

Eleven bits of X-address signals are applied to the address input terminals A0 to A10. Address signals A0 and A1, i.e., the lower two bits, and an uppermost address signal A10, i.e., the most significant bit, are transferred to the timing signal generating circuit TG. The timing signal generating circuit TG selects a pair of memory arrays according to the address signals A0 and A1, and the upper array or the lower array according to the address signal A10. Thus, one-eighth of the sixteen memory arrays, and the two selected memory arrays are set simultaneously in the active state. As stated above, the address signals A0 and A1 are insignificant and the eight memory arrays of the upper or lower array are set simultaneously in the active state, when the pseudostatic RAM is in the self-refresh mode.

Six bits of address signals A4 to A9 are applied to the X-predecoder PXD for decoding in combinations each of two bits. Consequently, the corresponding predecode signals AX450 to AX453 or AX890 to AX893 are set HIGH alternatively. These predecode signals are transferred to the X-decoder to select the word line groups of each memory array alternatively. Two bits of address signals A2 and A3 are applied to the selective word line driving signal generating circuit PWD and combined with a word line driving signal $\phi x$ generated by the word line driving signal generating circuit $\phi XG$ to produce selective word line driving signals X00, X01, X10 and X11 alternatively. As stated above, the voltages of the word line driving signal $\phi x$ and the selective word line driving signals X00 to X11 are set to a boosted level exceeding the supply voltage of the circuit. Accordingly, one of the 256 word lines selected by address signals A2 and A3 from the group of word lines selected by address signals A4 to A9 of the two selected memory arrays specified by the address signals A0, A1 and A10 is set alternatively in the selected state.

Similarly, eight bits of address signals A11 to A18 applied to the address input terminals A11 to A18 are used as Y-address signals for data line selection. The address signals A11 to A18 are transferred to the Y-predecoder PYD and, as shown in Table 3, are decoded in pairs each of two bits, namely, in pairs of A11 and A12, A13 and A14, A15 and A16, and A17 and A18. Consequently, the corresponding predecode signals AY120 to AY123, AY340 to AY343, AY560 to AY563, and AY780 to AY783 are set HIGH alternatively. The predecode signals that are combined according to the decoder tree of the Y-decoder to select four sets of complementary data lines, i.e., eight complementary data lines, of the two memory arrays to be set in the active state are selected and connected to the corresponding common I/O lines. Thus, eight memory cells among the 4 MB of memory cells are selected for the input-output of eight bits of data through the input-output terminals IO0 to IO7.

1.1.5 Redundant Structure

The pseudostatic RAM has, as stated above, the sixteen memory arrays divided in pairs into the upper and lower arrays. Although there is no particular restriction, each memory array has four redundant word lines and thirty-two sets of redundant complementary data lines. Although there is no particular restriction, the redundant word lines and the redundant complementary data lines are changed over simultaneously for the common faulty element in the sixteen memory arrays and are selectively set in the selected state one at a time or four sets at a time in place of a faulty word line or a faulty complementary data line. Therefore, although there is no particular restriction, the pseudostatic RAM is provided with four X-system redundant circuits XR0 to XR3 provided in common to the corresponding redundant word lines of all the memory arrays, and eight Y-system redundant circuits YRAC0 to YRAC7 provided in common to the corresponding four sets of redundant complementary data lines.

The X-system redundant circuits XR0 to XR3 compare the eight bits of address signals A2 to A9, i.e., the complementary internal address signals BX2 to BX9, and bad addresses assigned to the corresponding redundant word lines. If all the bits of both the addresses coincide with each other, the output signals, i.e., corresponding inverted redundant word line selection signals $\overline{XR0}$ to $\overline{XR3}$, are changed from HIGH to LOW. As stated above, these inverted redundant word line selection signals are combined with the word line driving signal $\phi x$ and the complementary internal address signal BX10 by the selective word line driving signal generating circuit PWD to produce the selective redundant word line driving signals XR0U to XR3U or XR0D to XR3D for the upper or lower array. These selective redundant word line driving signals are given to the X-decoders for the redundant word line selecting operation. Naturally, the selecting operation for the faulty word lines specified by the address signals A2 to A9 is stopped in selecting the redundant word lines.

Figure 45B:
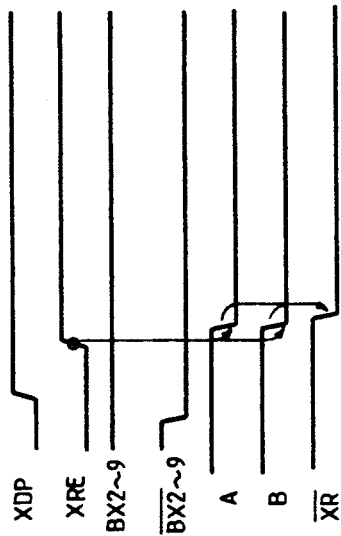
Figure 45A:
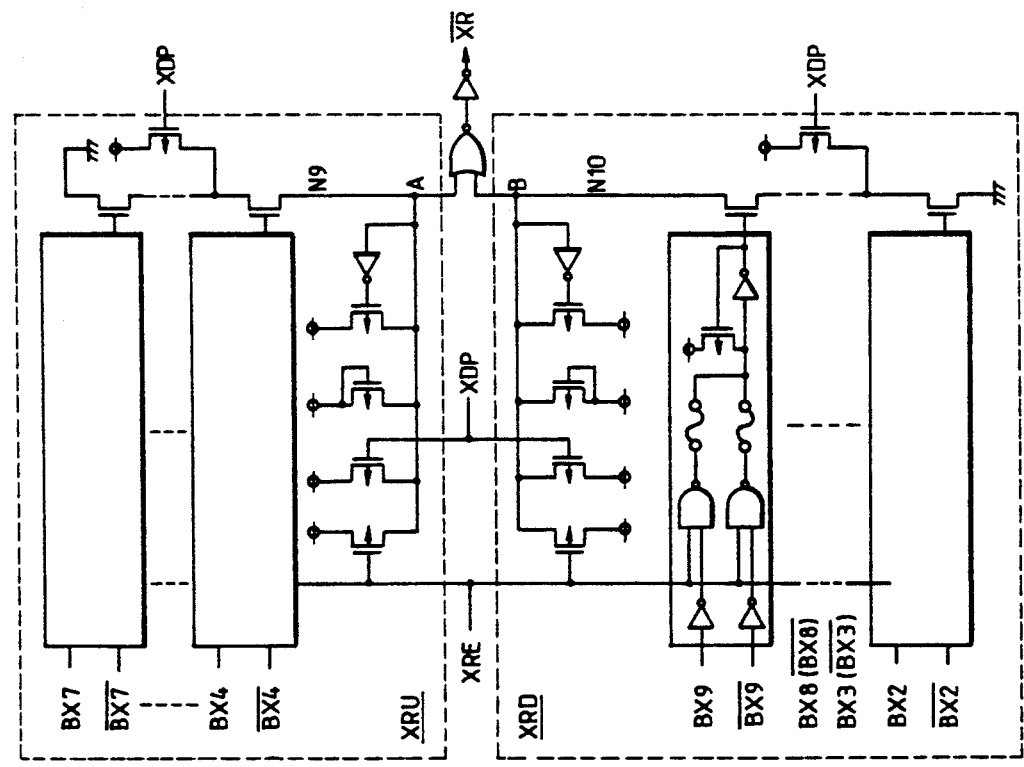

Incidentally, as shown in FIG. 45, the X-system redundant circuits XR0 to XR3 of the pseudostatic RAM are divided into the X-system redundant circuits XR0U to XR3U, which accept the four bits of X-address signals, i.e., the complementary internal address signals $\overline{BX4}$ to $\overline{BX7}$, provided on the upper side of the surface of the semiconductor substrate, and the X-system redundant circuits XR0D to XR3D, which accept other four bits of X-address signals $\overline{BX2}$, $\overline{BX3}$, $\overline{BXS}$ and $\overline{BX9}$, provided on the lower side of the surface of the semiconductor substrate. These X-system redundant circuits comprise, respectively, four redundant address comparing circuits including two fuse means serving as a redundant ROM (read-only memory), for deciding if bad addresses held by the fuse means and the corresponding complementary internal address signals BX2 to BX9 coincide with each other, and a coincidence detecting circuit comprising MOSFETs (metal oxide semiconductor field effect transistors) provided in series between a coincidence detecting node N9 or N10 and the ground potential of the circuit to receive the output signals of corresponding redundant address comparing circuits at the gates thereof. In this specification, "MOSFET" is used as the general designation of insulated gate field effect transistors. The coincidence detecting nodes N9 and N10 are connected respectively to the input terminals of a 2-input NOR gate circuit constituting a substantial negative AND circuit. Accordingly, the output signals of the X-system redundant circuits, i.e., the inverted redundant word line selection signals $\overline{XR0}$ to $\overline{XR3}$, are set selectively LOW when both the coincidence detecting nodes N9 and N10 are LOW and the output signal of a corresponding redundant enable circuit XRE is HIGH.

The operating speed of the redundant circuit can substantially be increased and hence the access time of the pseudostatic RAM can be reduced accordingly by dividing the series-connected MOSFETs forming the coincidence detecting circuit of the redundant circuit divided for a plurality of address input pads or address buffers distributed in the upper or lower side of the surface of the semiconductor substrate and by subjecting the output signals of the MOSFETs to the logical AND operation of a logic circuit.

Figure 44A:
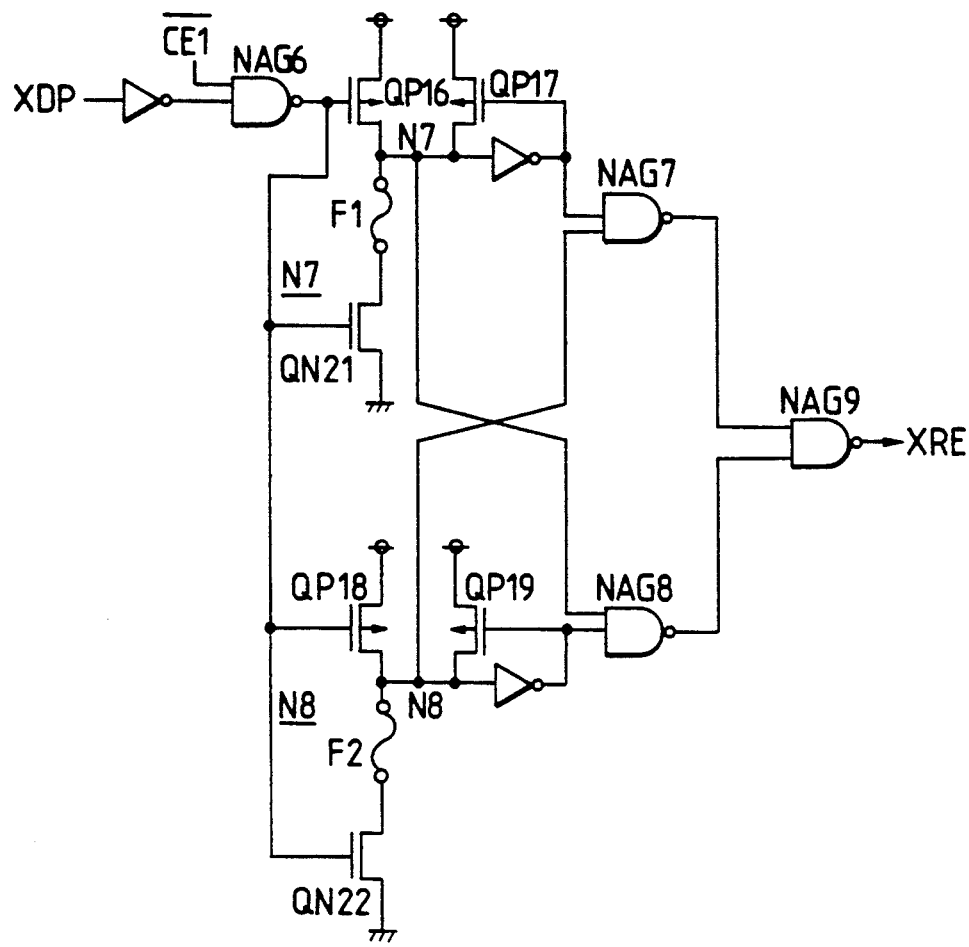
Figure 44B:
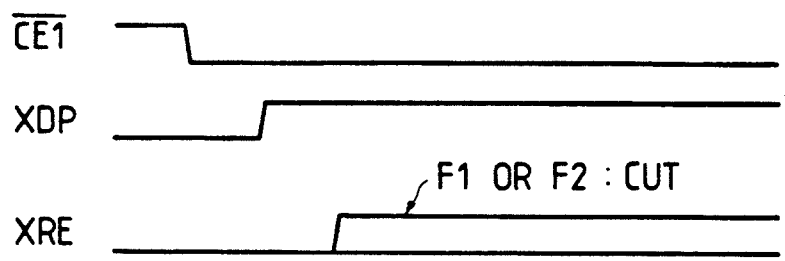

As shown in FIG. 44, the redundant enable circuit XRE comprises first and second fuse logic gate circuits respectively including fuse means F1 and F2. The first fuse logic gate circuit includes a MOSFET QP16 of a p-channel-type (first type of conduction) provided between an internal node N7 and the supply voltage of the circuit (first supply voltage), and a MOSFET QN21 of an n-channel-type (second type of conduction) connected in series to the fuse means F1 provided between the ground potential of the circuit (second supply voltage) and an internal node N7. The second fuse logic gate circuit includes a MOSFET QP18 of a p-channel-type (eighteenth MOSFET) provided between an internal node N8 and the supply voltage of the circuit, and a MOSFET QN22 of an n-channel-type (nineteenth MOSFET) connected in series to the fuse means F2 provided between the ground potential of the circuit and an internal node N8 (fourth internal node).

The MOSFETs QP16 and QN21, and the MOSFETs QP18 and QN22 function each as a single CMOS inverter circuit when the corresponding fuse means are not opened, i.e. the fuses are not broken. In such a case, the internal nodes N7 and N8 go LOW when an inverted timing signal $\overline{CE1}$ is LOW or a timing signal XDP is HIGH. When a fuse means F1 or F2 is opened, for example, by a laser beam, the corresponding internal node N7 or N8 is held HIGH regardless of the inverted timing signal CE1 and the timing signal XDP.

The output signals of the fuse logic gate circuits, i.e., the levels of the internal nodes N7 and N8, are transferred as they are or after being inverted to an exclusive OR circuit comprising NAND gate circuits NAG7 to NAG9. The output signal of the NAND gate circuit NAG9 is the output signal XRE of the redundant enable circuit XRE. Accordingly, the output signal XRE of the redundant enable circuit CRE goes LOW regardless of the condition of the corresponding fuse means, when the inverted timing signal $\overline{CE1}$ is HIGH and the timing signal XDP is Low. When the inverted timing signal $\overline{CE1}$ is LOW or the timing signal XDP is HIGH, the output signal XRE of the redundant enable circuit XRE goes HIGH provided that the corresponding fuse means F1 or F2 is opened. When both the fuse means F1 and F2 are opened or neither the fuse means F1 nor the fuse means F2 is opened, the output signal XRE of the redundant enable circuit XRE remains LOW. The fuse circuit included in the redundant enable circuit XRE or the like can be simplified and the cost of the same can be reduced by constructing the fuse circuit basically in a fuse logic gate circuit provided with fuse means provided between an n-channel or p-channel MOSFET, and an output node. The X-system redundant circuit assigned once to the bad address can equivalently be set in the initial state by subjecting the output signals of the two fuse logic gate circuits provided in the fuse circuit to an exclusive OR operation, which makes the pseudostatic RAM adaptable to redundant assignment and improves the yield of the pseudostatic RAM.

Naturally, the fuse circuit is applicable to the redundant address comparing circuits of the X-system redundant circuit and the Y-system redundant circuit, and fuse circuits including a fuse circuit for presetting a refresh timer counter circuit SRC, which will be described subsequently.

The Y-system redundant circuit YRAC0 to YRAC3 of the pseudostatic RAM compare the eight bits of address signals A11 to A18, i.e., complementary internal address signals $\underline{AY11}$ to $\underline{AY18}$, and bad addresses assigned to the corresponding four sets of redundant complementary data lines. When all the bits of both the addresses coincide with each other, the output signals of the Y-system redundant circuits YRAC0 to YRAC3, i.e., the corresponding redundant data line selection signals YR0 to YR7 are set selectively HIGH. As stated above, these redundant data line selection signals are transferred through the Y-predecoder PYD to the Y-decoders for use in the redundant complementary line selecting operation. Naturally, the selecting operation for selecting faulty complementary data lines specified by the address signals A11 to A18 is stopped in selecting the redundant complementary data lines.

Figure 58:
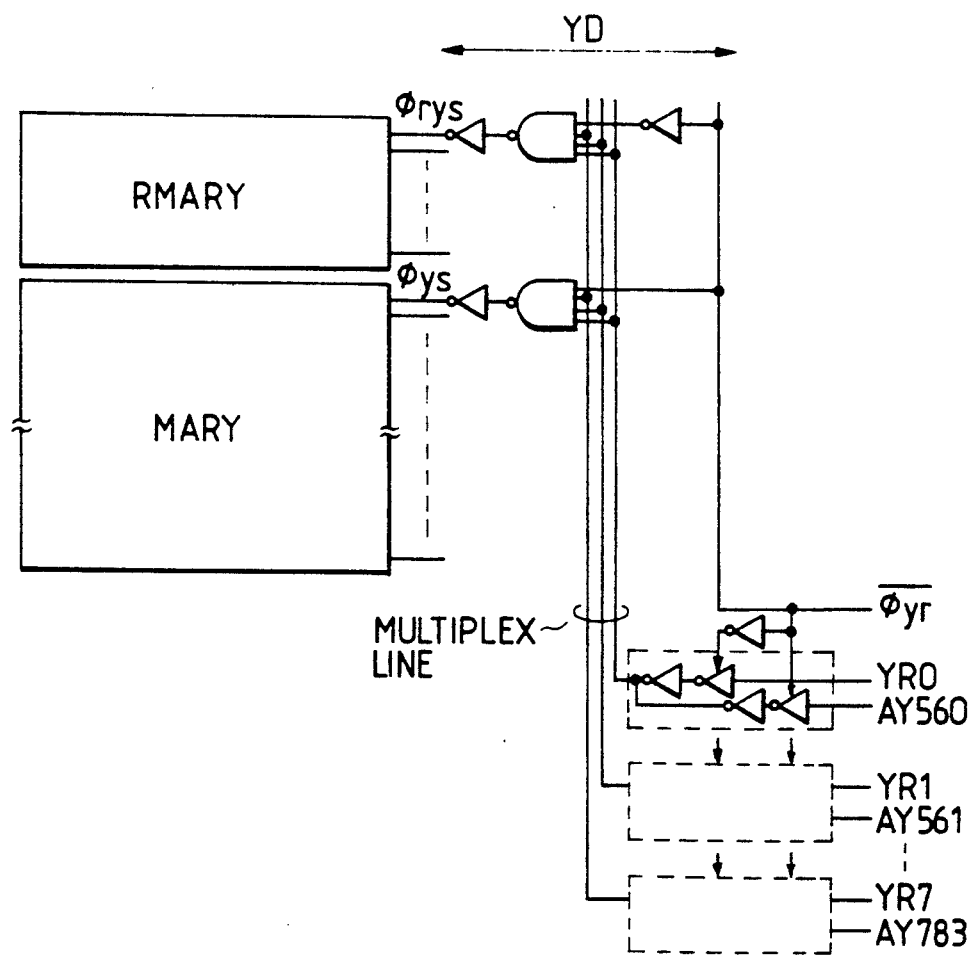

Incidentally, as shown in FIG. 58, the redundant data line selection signals YR0 to YR7 transferred through the Y-predecoder PYD to the Y-decoder are transferred through eight signal lines which also transfer the predecode signals AY560 to AY563 and the predecode signals AY780 to AY783. Accordingly, the Y-predecoder PYD is provided with a multiplexer which transfers the predecode signals AY560 to AY563 and AY780 to AY783, or the redundant data line selection signals YR0 to YR7 selectively according to the inverted timing signal $\overline{\phi yr}$ which goes LOW when any one of the redundant complementary data lines is selected. The Y-decoder YD receives the predecode signals AY560 to AY563 and AY780 to AY783 through the signal lines when the inverted timing signal $\overline{\phi yr}$ is HIGH, or receives the redundant data line selection signals YR0 to YR7 through the signal lines when the inverted timing signal $\overline{\phi yr}$ is LOW. Therefore, the circuits can be efficiently laid out in the vicinity of the memory arrays comparatively crowded with signal lines, and the circuits can be laid out in a reduced area.

Figure 42:
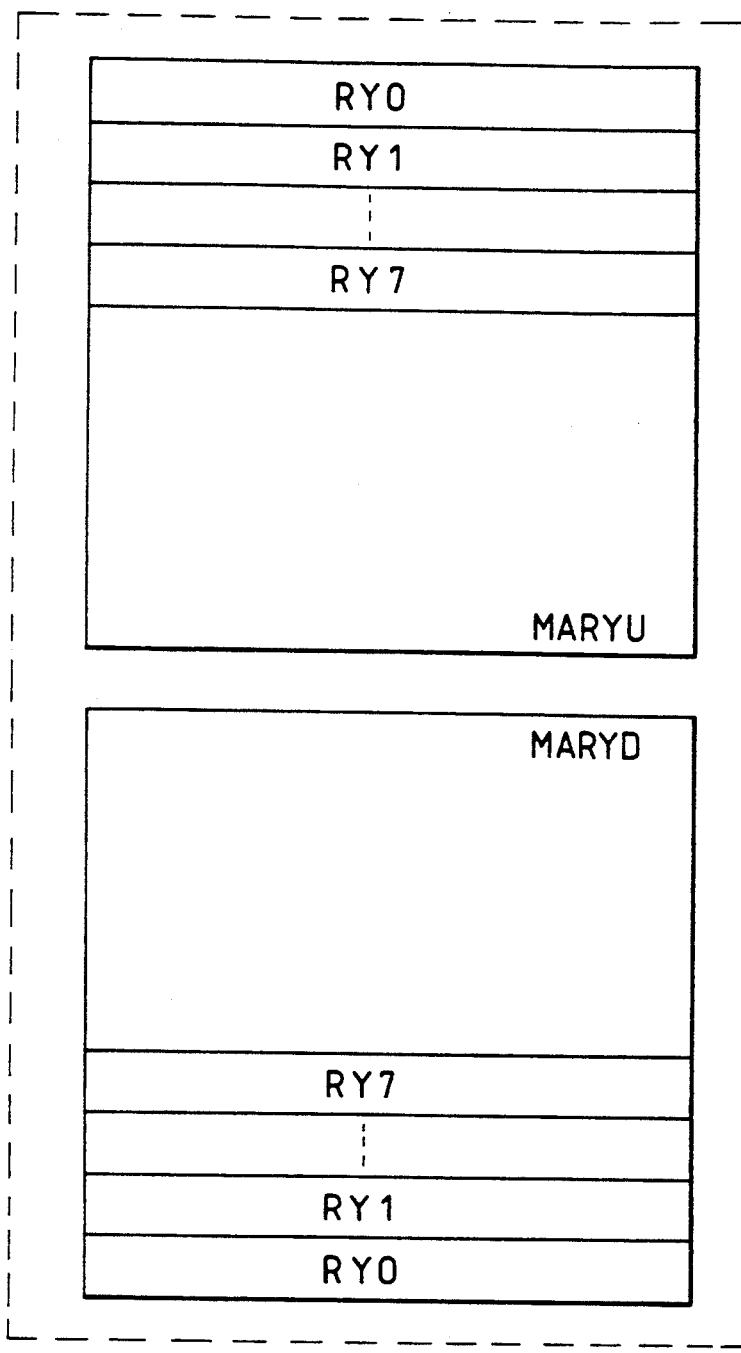
FIGS. 42, 43, 44($a$ and $b$), 45$c$ to 48,49($a$ to $c$), 50 to 52, 53($a$ and $b$), 54($a$ and $b$), 55($a$ and $b$), and 56 to 59 are conceptual drawings, layout diagrams, waveform charts of signals and circuit diagrams of modifications, respectively, in explaining the components of the pseudostatic RAM embodying the present invention.

As stated above, the thirty-two sets of redundant complementary data lines of each memory array are set in the selected state four sets at a time. Thus, the redundant complementary data lines are divided substantially in eight redundant data line groups RY0 to RY7. The pseudostatic RAM has sixteen paired memory arrays divided into the upper and lower arrays, and the redundant complementary data lines of each redundant data line groups are changed over simultaneously for a common faulty element. Accordingly, the redundant complementary data line groups RY0 to RY7 of the pseudostatic RAM are arranged in axial symmetry with respect to the center axis of the surface of the semiconductor substrate as shown in FIG. 42. As is generally known, the rate of occurrence of fault in elements is higher in the peripheral portion than the central portion of the semiconductor substrate. The redundant complementary data line groups RY0 to RY7 are arranged intentionally in axial symmetry as shown in FIG. 42 so that the rate of occurrence of faults on the side of the redundant complementary data line group RY0 is higher than that on the side of the redundant complementary data line group RY7. Consequently, the mean rate of occurrence of faults with respect to all the redundant complementary data lines is decreased, and hence the yield of the pseudostatic RAM is increased.

Naturally, such a layout of the redundant complementary data lines is applicable to laying out the redundant word lines for the same effect.

1.1.6 Refresh Method

As stated above, the pseudostatic RAM has the three refresh modes, namely, the address refresh mode, the autorefresh mode and the self-refresh mode. In the address refresh mode, refresh addresses for specifying the word lines to be refreshed are supplied by an external device, such as a memory control unit. In the autorefresh mode and the self-refresh mode, the same are supplied by the internal refresh counter RFC.

As stated above, the refresh period at which the refresh cycle is repeated is determined taking into consideration the information holding ability of the memory cell and is specified in the specifications for the product. As is obvious from the description of the operating cycles, in the address refresh mode and in the autorefresh mode, the refresh period is controlled by an external memory control unit which accesses the pseudostatic RAM and, in the self-refresh mode, the refresh period is controlled by the refresh timer circuit TMR of the timing signal generating circuit TG, and the refresh timer counter circuit SRC.

Figure 14:
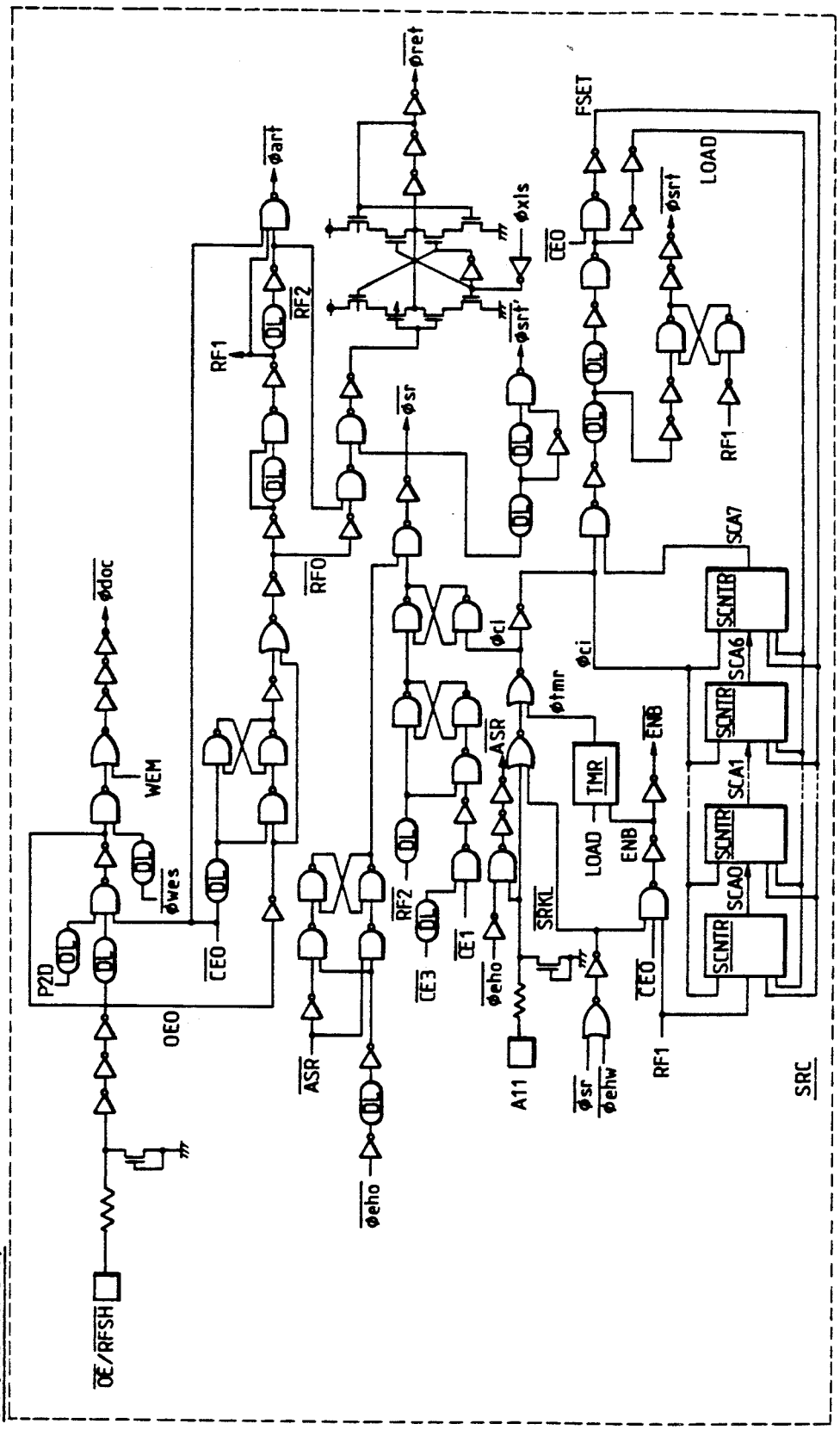
Figure 15:
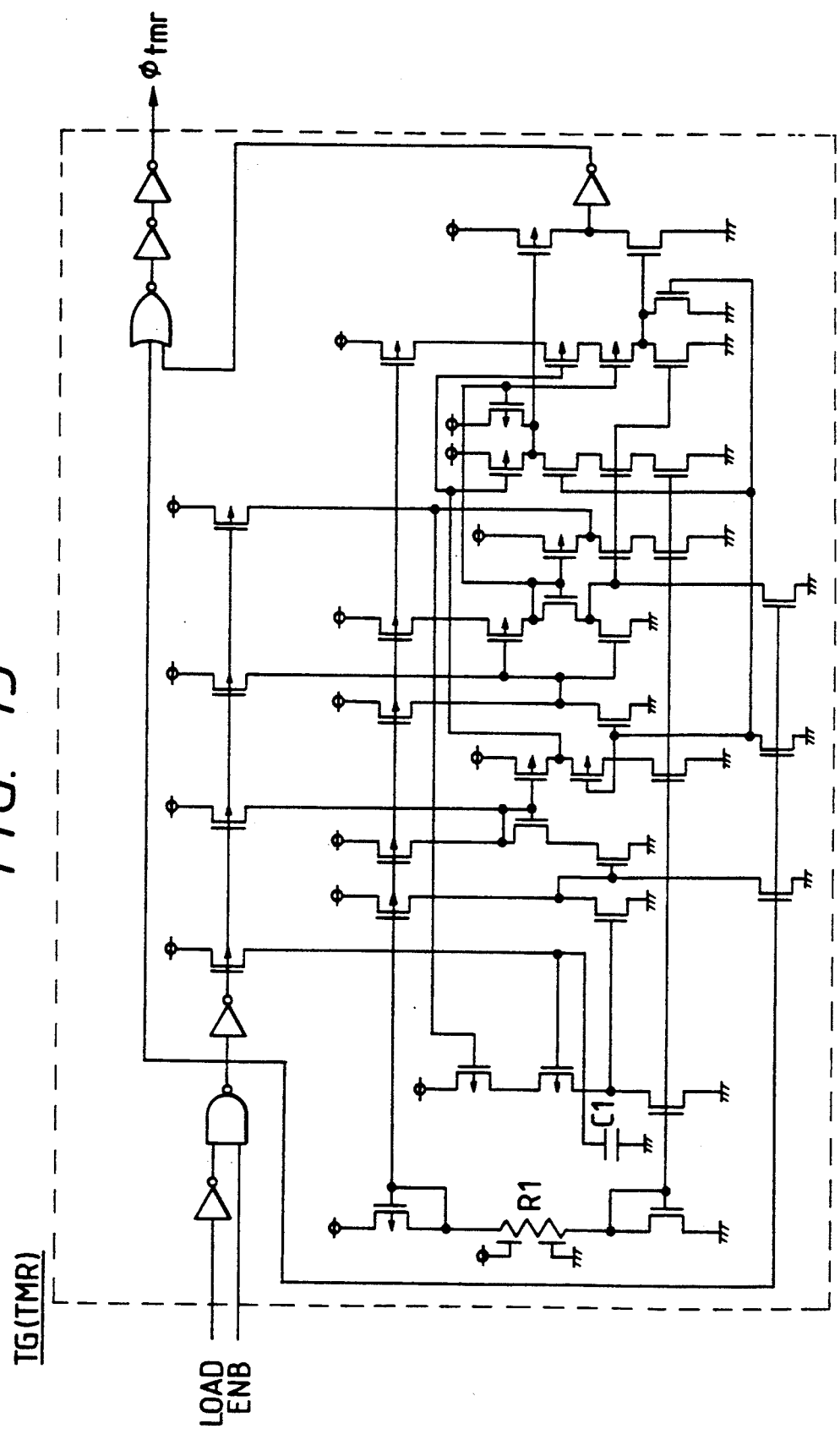

As shown in FIG. 15, the refresh timer circuit TMR includes a ring oscillator comprising seven inverter circuits, the operating current of which is limited, connected in series substantially in a circular arrangement, and generates a timing signal ctmr at a set period. As shown in FIG. 14, the timing signal $\phi$tmr is converted into a timing signal $\phi$cl by a 2-input NOR gate circuit and an inverter circuit. The timing signal $\phi$cl is used as the counting pulse signal of the refresh timer counter circuit SRC.

Figure 16:
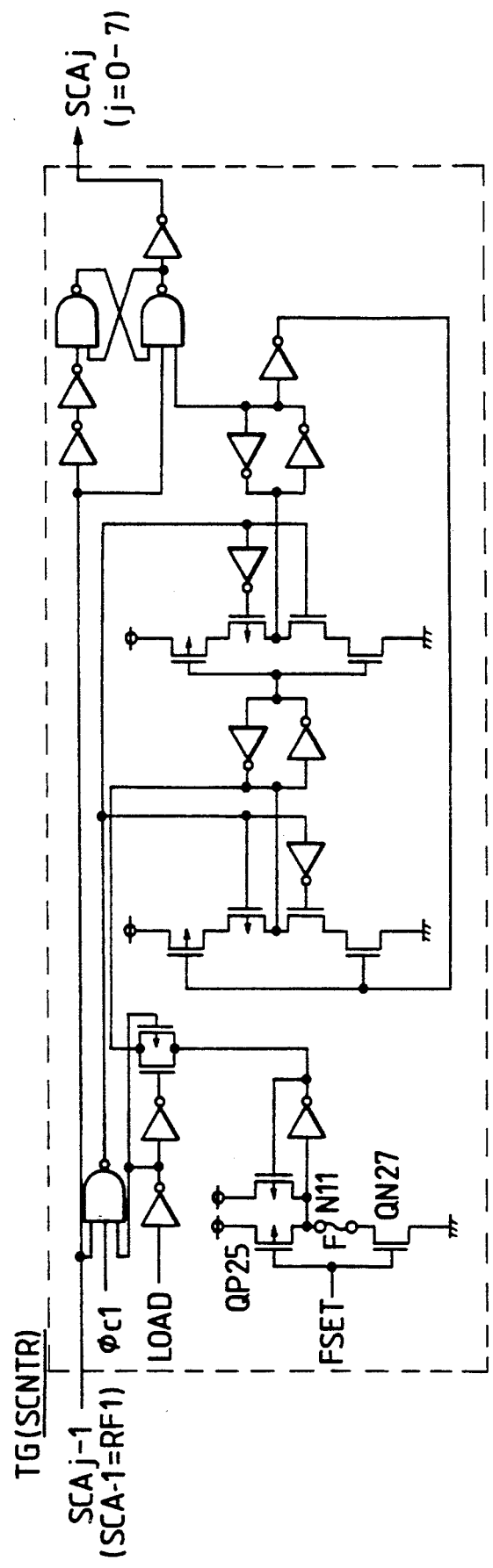
Figure 17:
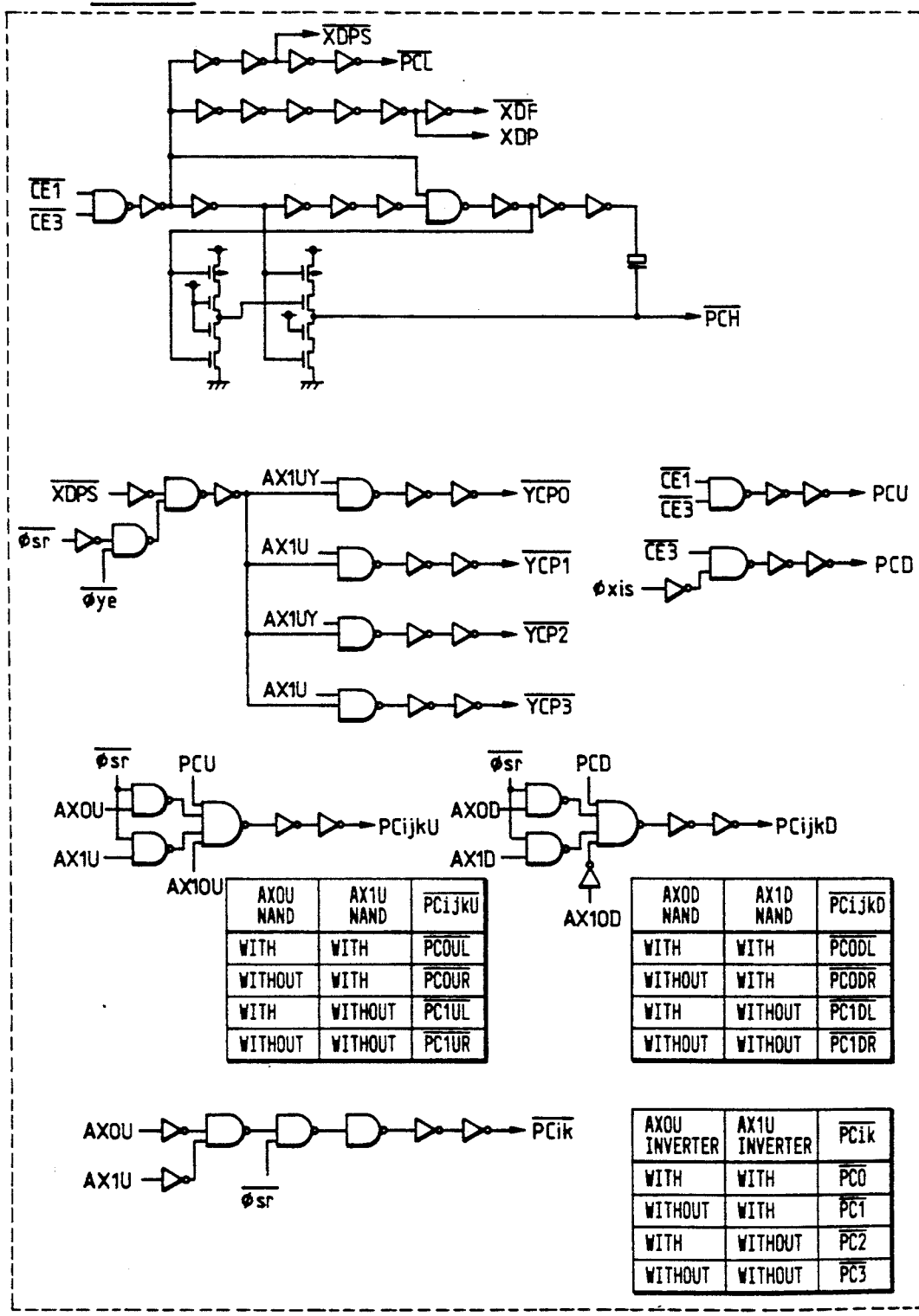

The refresh timer counter circuit SRC is an 8-bit binary counter. As shown in FIG. 16, each of the unit circuits of the refresh timer counter circuit SRC corresponding to each bit comprises a pair of master latches, a pair of slave latches, and a fuse circuit for selectively setting the initial value at logic "0" or logic "1". The initial count of the refresh timer counter circuit SRC is set by selectively opening the fuse means of the unit circuits, and thereby the counting period, i.e., the counter module, is set. The output signal of the refresh timer counter circuit SRC, i.e., an output carry signal SCAT, is used in combination with the timing signal $\phi$cl for producing an inverted timing signal $\overline{\phi\text{srf}}$ for determining the refresh period of the self-refresh mode.

When the pseudostatic RAM is in the STIC test mode, the timing signal $\phi$cl and the inverted timing signal $\overline{\phi\text{srf}}$ is monitored, as mentioned in the description of the test method, through the data input-output terminal IO6 or IO7.

Incidentally, the self-refresh mode of the pseudostatic RAM has, as in this embodiment, a so-called PS (pseudo) refresh mode which is applied when the pseudostatic RAM is in the nonselected state for a comparatively long time, such as in a state in which the pseudostatic RAM is backed up by a battery, and a VS (virtual) refresh mode in which the refresh operation is performed intermittently in the intervals of memory access. As is generally known, the period of refresh operation in the VS refresh mode performed in the intervals of the active state of the pseudostatic RAM is comparatively short as compared with the period of refresh operation in the PS refresh mode which is performed substantially while the pseudostatic RAM is in the nonactive state.

Figure 51:
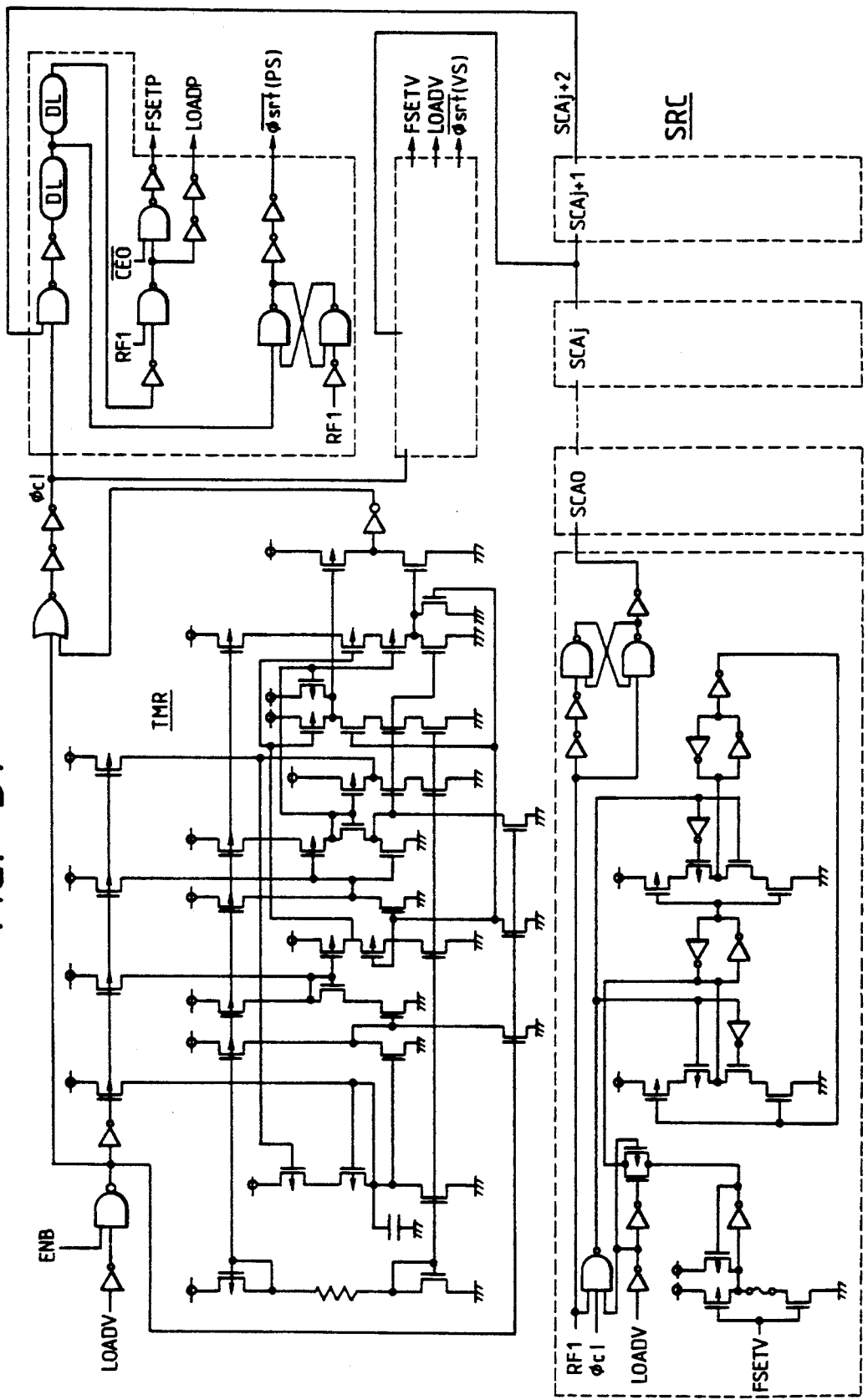
Figure 52:
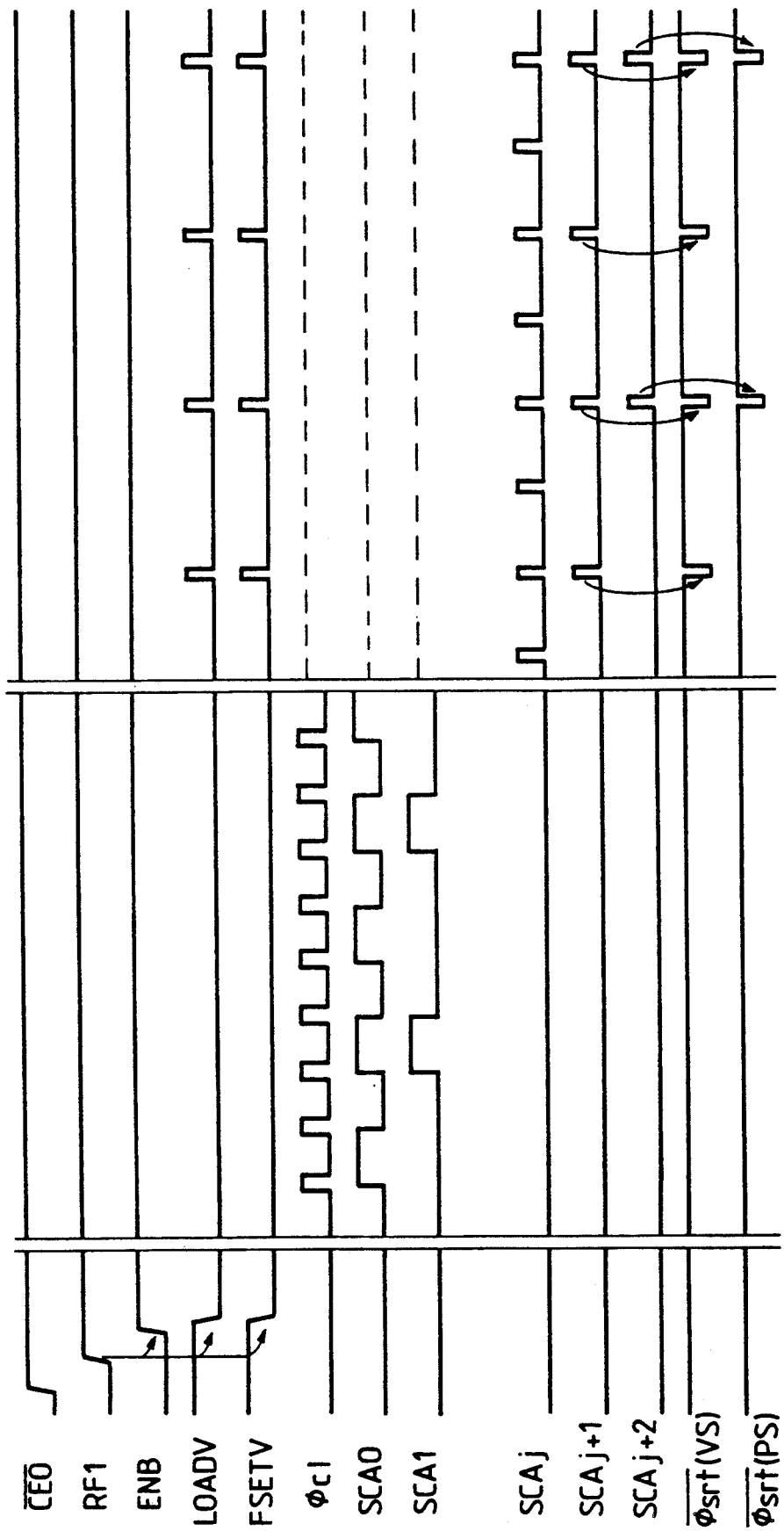

Accordingly, as shown in FIG. 51 and 52, a pseudostatic RAM capable of operating in both the VS and PS refresh modes can be formed on a single common semiconductor substrate (base chip) by setting different refresh periods respectively for the VS and PS refresh modes. That is, as shown in FIG. 51, the inverted timing signal $\overline{\phi\text{srf}}$ for starting the self-refresh cycle in the PS refresh mode is formed by combining the carry signal $SCAj+2$ of the most significant bit provided by the refresh timer counter circuit SRC, and the output signal, i.e., the timing signal $\phi$cl, of the refresh timer circuit TMR. The inverted timing signal $\overline{\phi\text{srf}}$ for starting the self-refresh cycle in the VS refresh mode is formed by combining the carry signal $SCAj+1$ of the next bit of the refresh timer counter circuit SRC, and the timing signal $\phi$cl. Therefore, the period of the inverted timing signal $\overline{\phi\text{srf}}$ in the VS refresh mode is half the period of the inverted timing signal $\overline{\phi\text{srf}}$ in the PS refresh mode.

1.1.7 Basic Layout

Figure 4:
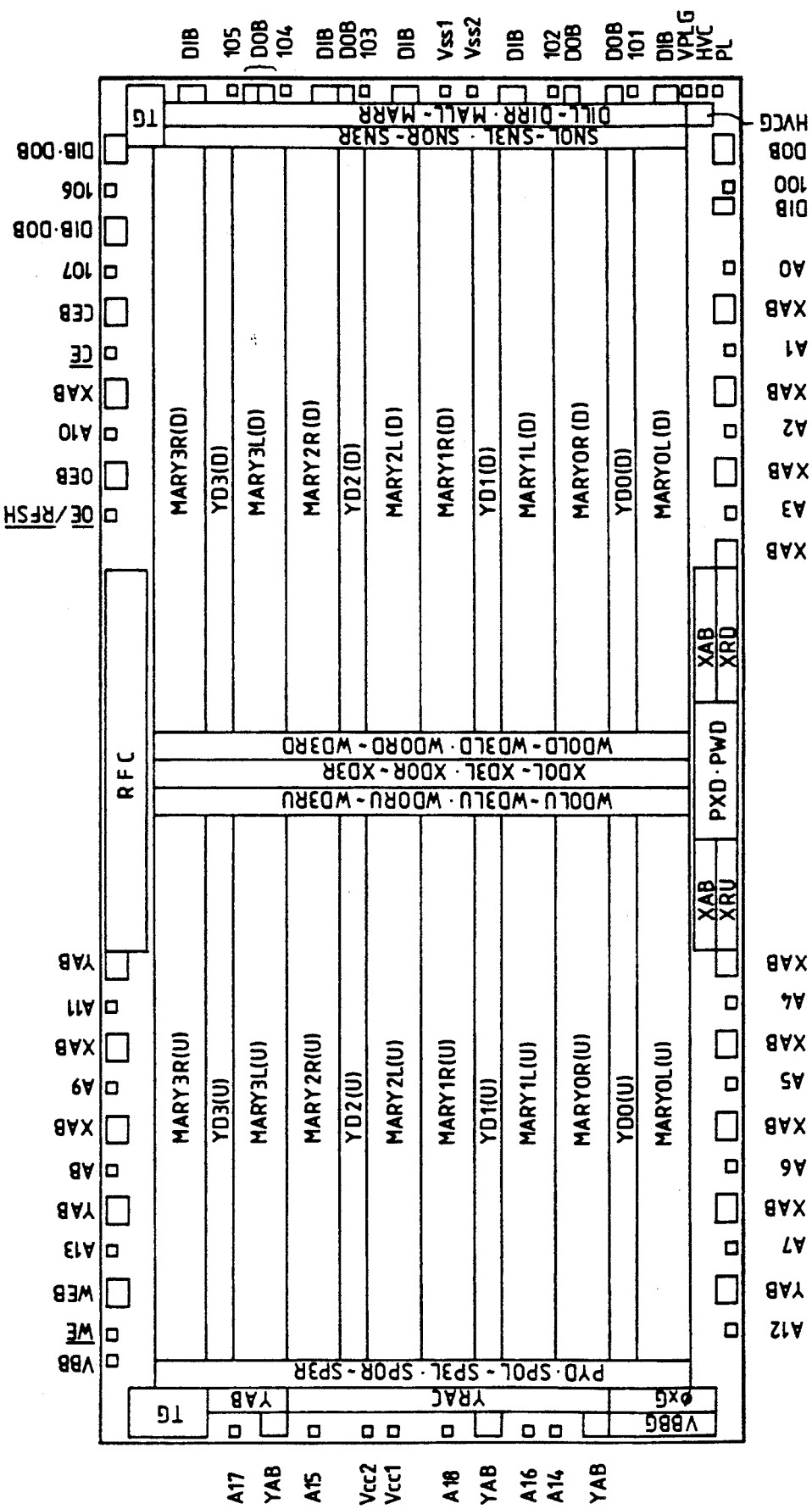
FIG. 4 is a diagram showing a layout of the components of a pseudostatic RAM embodying the present invention.

The basic layout of the components of the pseudostatic RAM of the present invention will be described hereinafter with reference to FIG. 4 illustrating the layout of the components of the pseudostatic RAM over the principal surface of a semiconductor substrate. In FIG. 4, the semiconductor substrate is placed sideways on account of space consideration, and the side of the semiconductor substrate on the left-hand side in the space is designated as the upper side of the semiconductor substrate.

As stated above, the pseudostatic RAM has the eight (substantially sixteen) memory arrays MARY0L to MARY3L, and MARY0R to MARY3R each divided into the memory array of the upper array and that of the lower array, the X-address decoders XD0L to XD3L, and XD0R to XD3R provided respectively for the memory arrays, and the four Y-address decoders YD0 to YD3 each corresponding to the two memory arrays and divided into the upper and lower Y-decoders.

In FIG. 4, the X-address decoders XD0L to XD3L, and XD0R to XD3R are disposed in the middle portion of the semiconductor substrate, the corresponding word line driving circuits WD0LU to WD3LU, and WD0RU to WD3RU are disposed above the X-address decoders, and the corresponding word line driving circuits WD0LD to WD3LD, and WD0RD to WD3RD are disposed below the X-address decoders, respectively. The corresponding memory arrays MARY0L to MARY3L, and MARY0R to MARY3R are disposed in a longitudinal arrangement on the opposite sides of the X-system selection circuits with the corresponding Y-decoders YD0 to YD3 disposed alternately therebetween and the word lines extended vertically. Although not shown in FIG. 4, the corresponding sense amplifiers SA0L to SA3L, and SA0R to SA3R, and the column switches CS0L to CS3L, and CS0R to CS3R are disposed near the Y-address decoders YD0 to YD3.

The circuits including the Y-address predecoders PYD and the Y-address redundant control circuit YRAC are arranged above the memory arrays MARY0L to MARY3L, and MARY0R to MARY3R. The circuits including the main amplifiers MALL to MARR and the write circuits DILL to DIRR are arranged below the memory arrays.

Bonding pads are disposed in the periphery of the semiconductor substrate excluding portions near the corners and the middle portions of the right and left sides. The unit circuits of the X-address buffer XAB, the Y-address buffer YAB, the data input buffer DIB and the data output buffer DOB are arranged respectively near the bonding pads.

1.2 Concrete Structures, Layout, Operation and Features of the Circuits

Figure 38:
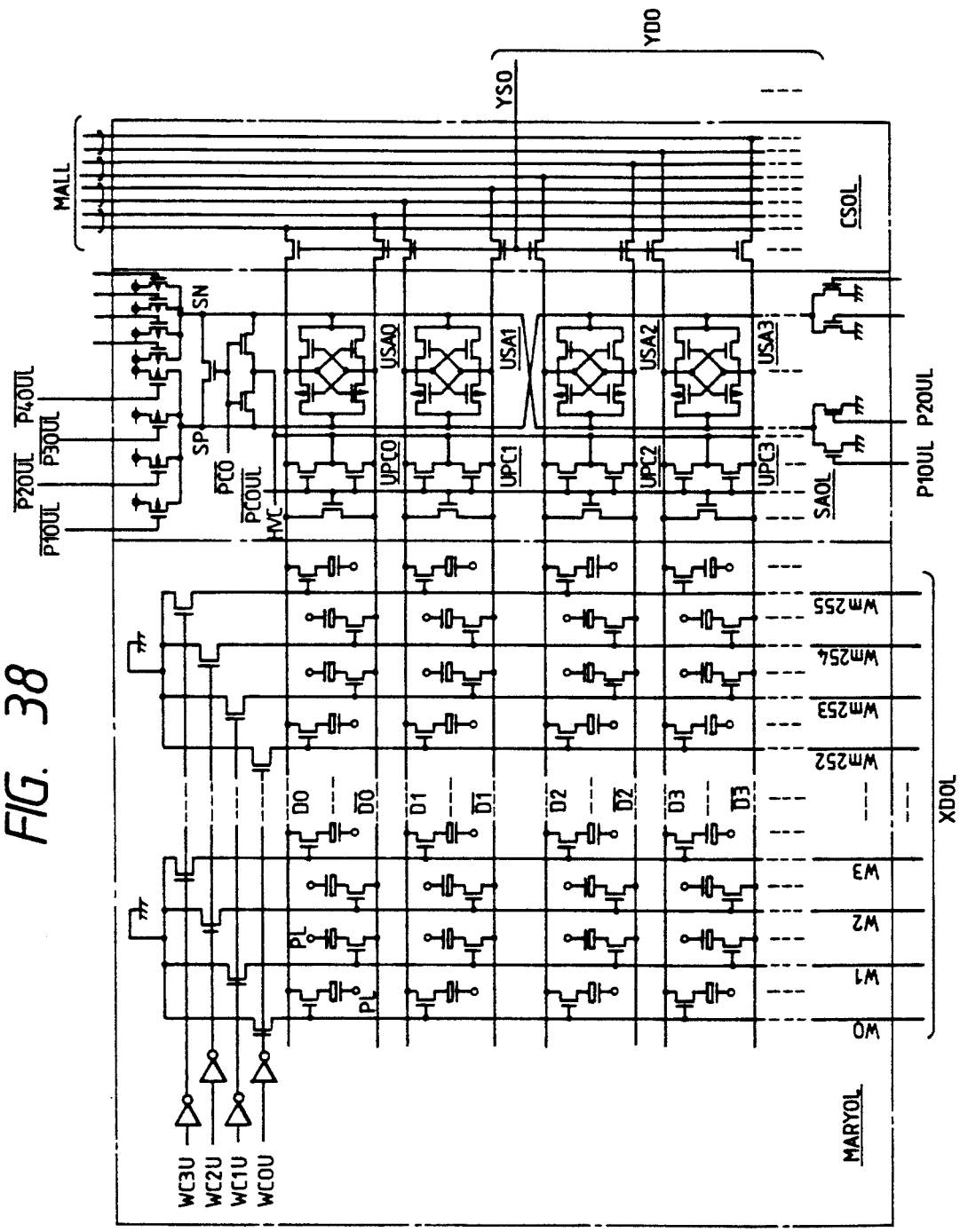
Figure 39:
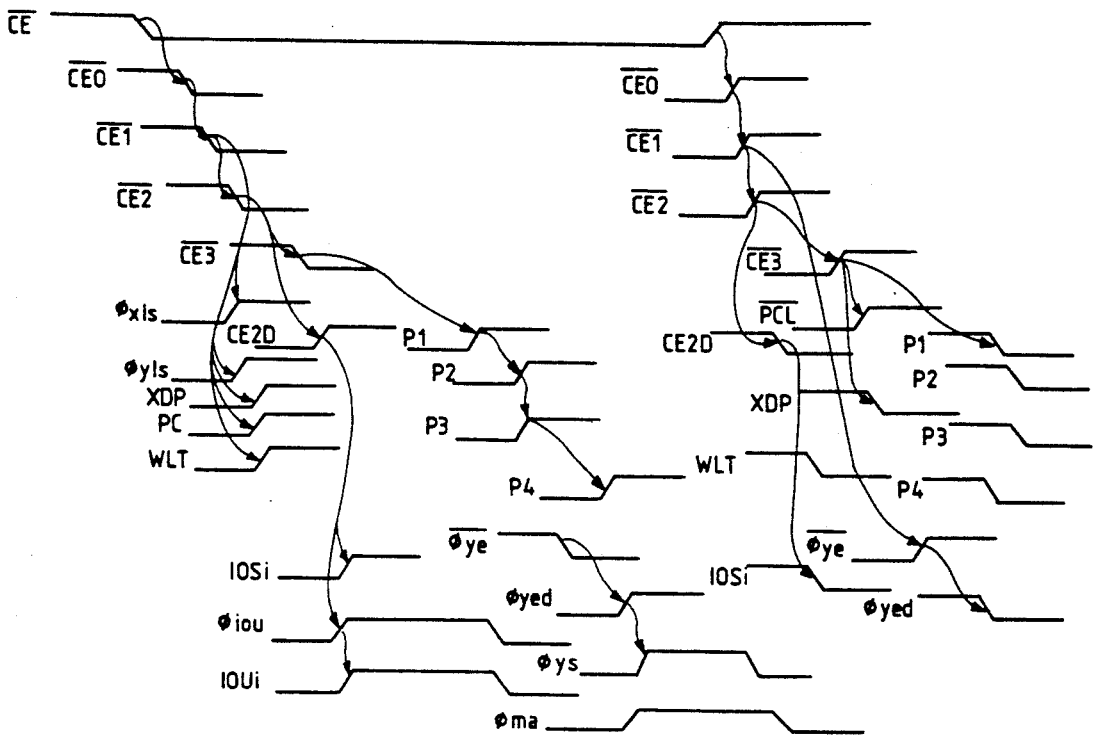
FIGS. 39 to 41 are waveform charts of signals used by the pseudostatic RAM embodying the present invention.
Figure 40:
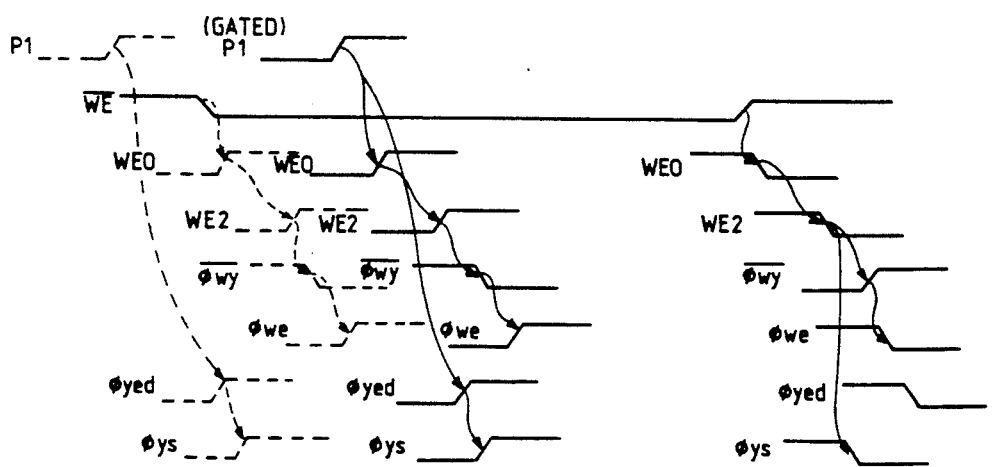
Figure 41:
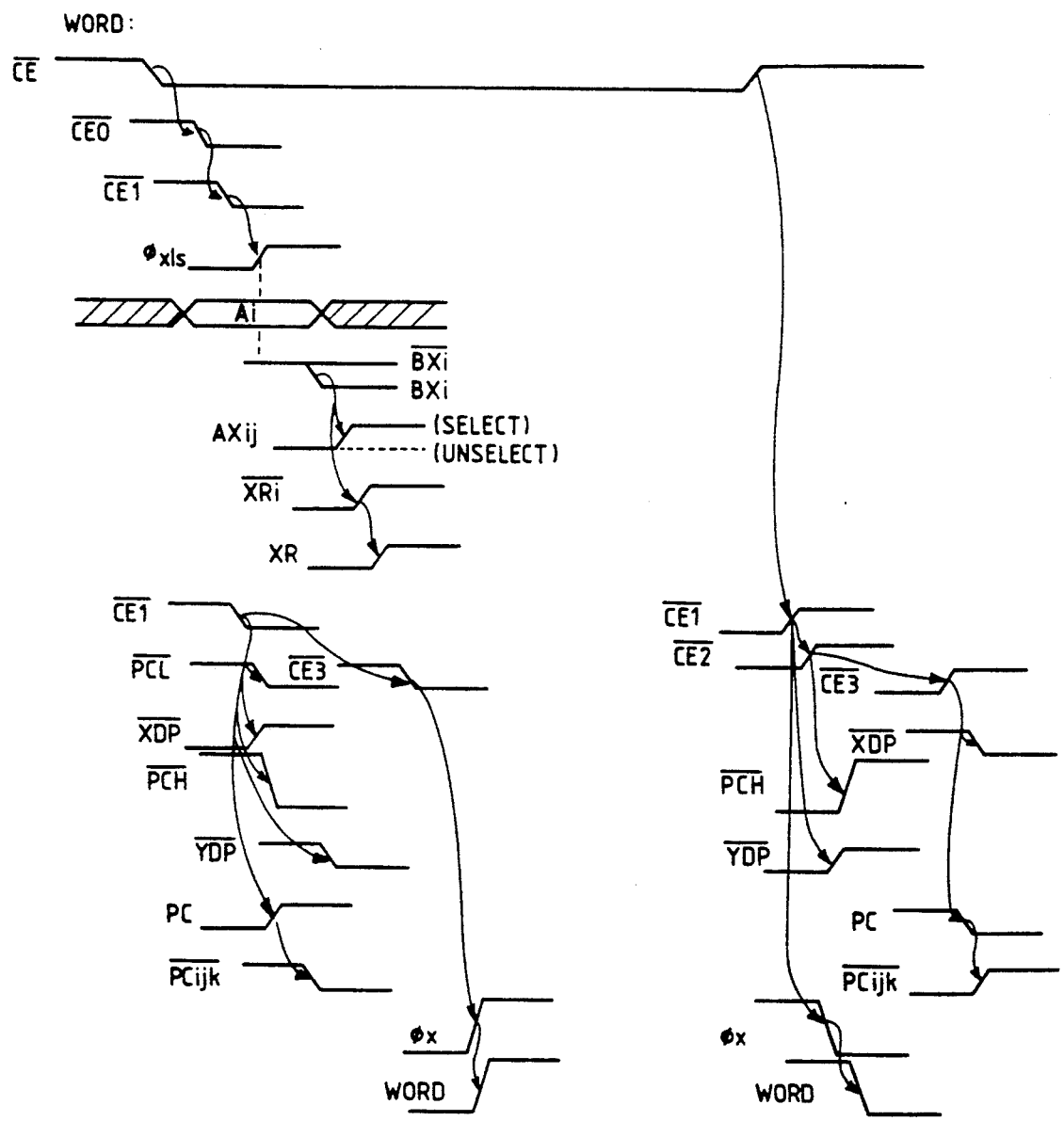

FIGS. 12 to 38 are circuit diagrams of the circuits of the pseudostatic RAM embodying the present invention, and FIGS. 39 to 41 are waveform charts of signals used to convey information in the pseudostatic RAM. The concrete structures, layout, operation and features of the component circuits of the pseudostatic RAM will be described with reference to FIGS. 12 to 38. Reference shall be made with FIGS. 39 to 41 as occasion demands.

1.2.1 Memory Arrays and Direct Peripheral circuits

As stated above, the pseudostatic RAM has the paired sixteen memory arrays MARY0L to MARY3L, and MARY0R to MARY3R. The two paired memory arrays are disposed symmetrically with respect to the X-system selection circuit disposed in the middle portion of the semiconductor substrate, and the four sets of common I/O lines and a pair of common source lines extends through the two paired memory arrays.

(1) Memory Arrays

Figure 32:
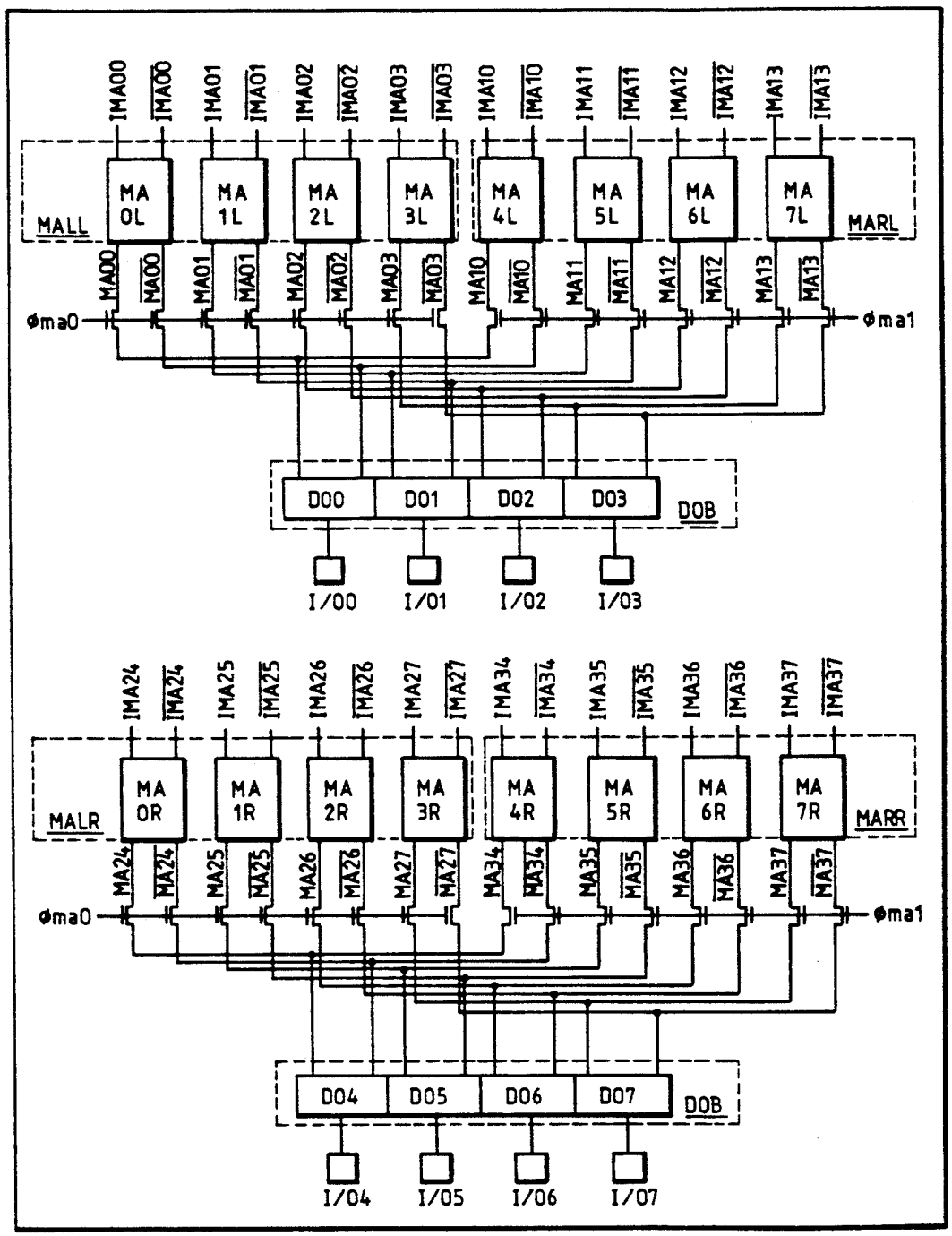

As shown in FIG. 38, the upper and lower arrays of the memory arrays MARY0L to MARY3L, and MARY0R to MARY3R have 256 parallel word lines W0 to W255 extending in the vertical direction, as viewed in FIG. 38, four redundant word lines RW0 to RW3, not shown, 1024 parallel complementary data lines D0 to D1023 extending in the horizontal direction, as viewed in FIG. 38, and 32 sets of redundant complementary data lines $\overline{RD0}$ to $\overline{RD31}$, not shown. Dynamic memory cells each consisting of capacitors for information storage and MOSFETs for address selection are connected regularly to the intersection points of the word lines and the complementary data lines in a predetermined arrangement.

The word lines of each memory array are connected, on the one hand, to the corresponding X-decoders XD0L to XD3L or XD0R to XD3R and are set alternatively in the selected state and, on the other hand, connected through n-channel MOSFETS, which receive inverted signals including the word line clear signals WC0U to WC3U at the gates thereof, to the ground potential of the circuit. Normally, the word line clear signals are LOW. When the pseudostatic RAM is set in the selected state, the word line clear signals go selectively HIGH according to the three bits of complementary internal address signals $\overline{BX2}$, $\overline{BX3}$ and $\overline{BX10}$. Thus, normally, the word lines of each memory array are LOW, namely, in the cleared state, and the cleared state is cancelled selectively when the pseudostatic RAM is set in the selected state, provided that at least the corresponding word line is selected.

Although there is no particular restriction, as shown in FIG. 38, the complementary data lines of each memory array are connected through the unit precharge circuits UPC0 to UPC3 of the corresponding sense amplifiers SA0L to SA3L, or SA0R to SA3R to the corresponding unit amplifying circuits USA0 to USA3. As shown in FIG. 38, the complementary data lines are connected selectively four sets thereof at a time through the corresponding switch MOSFETs of the column switches CS0L to CS3L, or CS0R to CS3R to the four sets of common I/O lines IO00L to IO03L or IO00R to IO03R, or IO34L to IO37L or IO34R to IO37R.

(2) Sense Amplifiers and Data Line Precharge Circuit

Although there is no particular restriction, as represented by the sense amplifier SA0L in FIG. 38, the sense amplifiers SA0L to SA3L or SA0R to SA3R include 1,056 unit precharge circuits UPC0 to UPC3 and the like and the unit amplifying circuits USA0 to USA3 and the like provided respectively for the complementary data lines and redundant complementary data lines of the corresponding memory arrays.

Although there is no particular restriction, the unit precharge circuits UPC0 to UPC3 and the like include each three n-channel MOSFETs provided in series-parallel connection between the inverted and noninverted signal lines of the corresponding complementary data lines. The gates of these MOSFETs are connected to a common terminal to receive inverted timing signals $\overline{PC0UL}$ and the like from the timing signal generating circuit TG. Ordinarily, the inverted timing signals $\overline{PC0UL}$ and the like are HIGH. The inverted timing signals $\overline{PC0UL}$ and the like go LOW selectively according to the complementary internal address signals $\overline{BX0}$, $\overline{BX1}$ and $\overline{BX10}$. Accordingly, the three MOSFETs of each unit precharge circuit are normally in the ON state to reduce the level of the noninverted and inverted signal lines of the corresponding complementary data lines to a half precharge level HVC, which is half the level of the supply voltage of the circuit by short-circuiting. When the pseudostatic RAM is set in the selected-state and the inverted timing signals $\overline{PC0UL}$ and the like go LOW, the three MOSFETs go OFF and, consequently, the short-circuited state of the corresponding complementary data lines is cancelled selectively.

Although there is no particular restriction, basically the unit amplifying circuit of each sense amplifier is a latch comprising two CMOS inverter circuits connected to each other in cross connection as shown in FIG. 38. The sources of the p-channel MOSFETs of the unit amplifying circuits are connected in common to the common source line SP, and further to the supply voltage of the circuit through four p-channel driving MOSFETs connected in parallel connection. Sense amplifier driving circuits SP0L to SP3L or SP0R to SP3R apply inverted timing signals $\overline{P10UL}$ to $\overline{P40UL}$ and the like to the gates of the corresponding driving MOSFETS. Similarly, the sources of the n-channel MOSFETs of the unit amplifying circuits are connected in common to a common source line SN, and further to the ground potential of the circuit through two n-channel driving MOSFETs connected in parallel connection. The sense amplifier driving circuits SN0L to SN3L or SN0R to SN3R apply timing signals P40UL and P20UL to the gates of the corresponding driving MOSFETS.

Although there is no particular restriction, each sense amplifier has three n-channel MOSFETs connected in series-parallel connection between the common source lines SP and SN. An inverted signal PC0 and the like is applied in common to the gates of these MOSFETS. The inverted timing signal $\overline{PC0}$ and the like are allowed to go HIGH or LOW substantially simultaneously with the inverted timing signal $\overline{PC0UL}$ and the like. Accordingly, the common source lines SP and SN are short-circuited to set the common source lines SP and SN on the half precharge level HVC, when the pseudostatic RAM is set in the selected state. While the pseudostatic RAM is in the selected state, the precharge operation of the common source lines SP and SN is stopped selectively.

The unit amplifying circuit of each sense amplifier is set selectively in the active state by setting the inverted timing signals $\overline{P10UL}$ to $\overline{P40UL}$ and the like LOW and setting the corresponding timing signals PL0UL to P20UL and the like HIGH. When the pseudostatic RAM is in the active state, each unit amplifying circuit amplifies an infinitesimal write signal transferred thereto through the corresponding complementary data line from the memory cell of the corresponding memory array connected to the selected word line to provide a HIGH or LOW binary write signal. The binary read signal is transferred through the corresponding common I/O line to the main amplifier when the pseudostatic RAM is in the ordinary read cycle or to the corresponding memory cell for rewrite when the pseudostatic RAM is in the autorefresh cycle or the self-refresh cycle.

Figure 43:
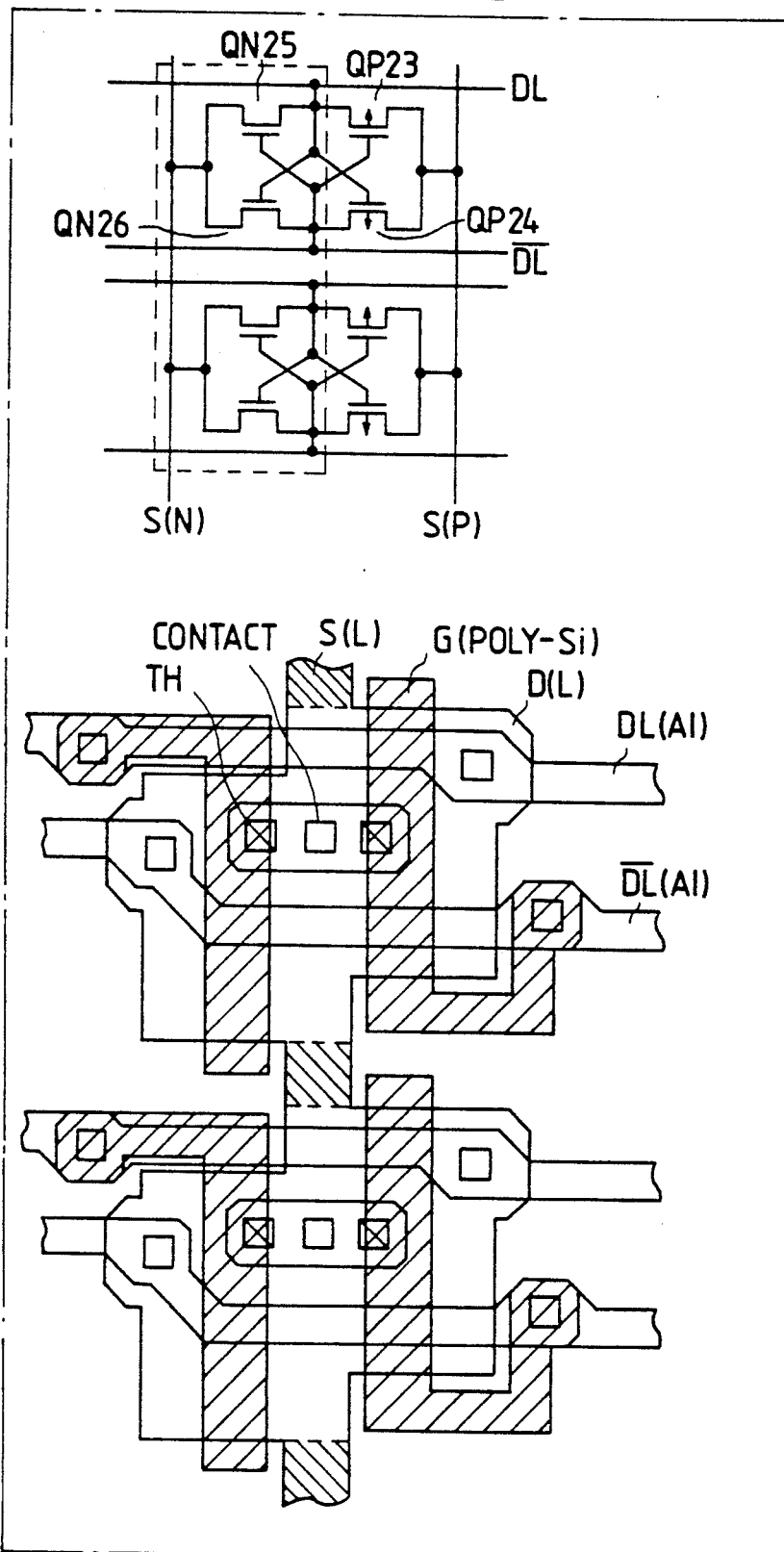

Incidentally, the pseudostatic RAM in this embodiment is featured by the layout of the sense amplifiers. As shown in FIG. 43, the respective sources S of the pair of p-channel MOSFETs QP23 (eighteenth MOSFET) and QP24 (nineteenth MOSFET) or the pair of n-channel MOSFETs QN25 (twentieth MOSFET) and QN26 (twenty-first MOSFET) are formed of a common diffused layer L, and the sources S, drains D and gates G of those MOSFETs are formed so as to extend longitudinally in a direction perpendicular to the corresponding complementary data lines. The sources S of each pair of MOSFETs formed of the common diffused layer L are connected through corresponding contacts to the common source line SP (first common source line) or SN (second common source line) formed of an aluminum or an aluminum alloy film over the diffused layer L and, as shown in FIG. 43, connected in common to the sources S of the adjacent pair of MOSFETs by the extension of the diffused layer L. Consequently, the possibility of occurrence of troubles, such as the deterioration of the characteristics of the unit amplifying circuits attributable to faulty contact, in the pseudostatic RAM, as compared with that in the conventional pseudostatic RAM or the like in which the diffused layer L is not extended, and the yield of the pseudostatic RAM is increased.

Figure 22:
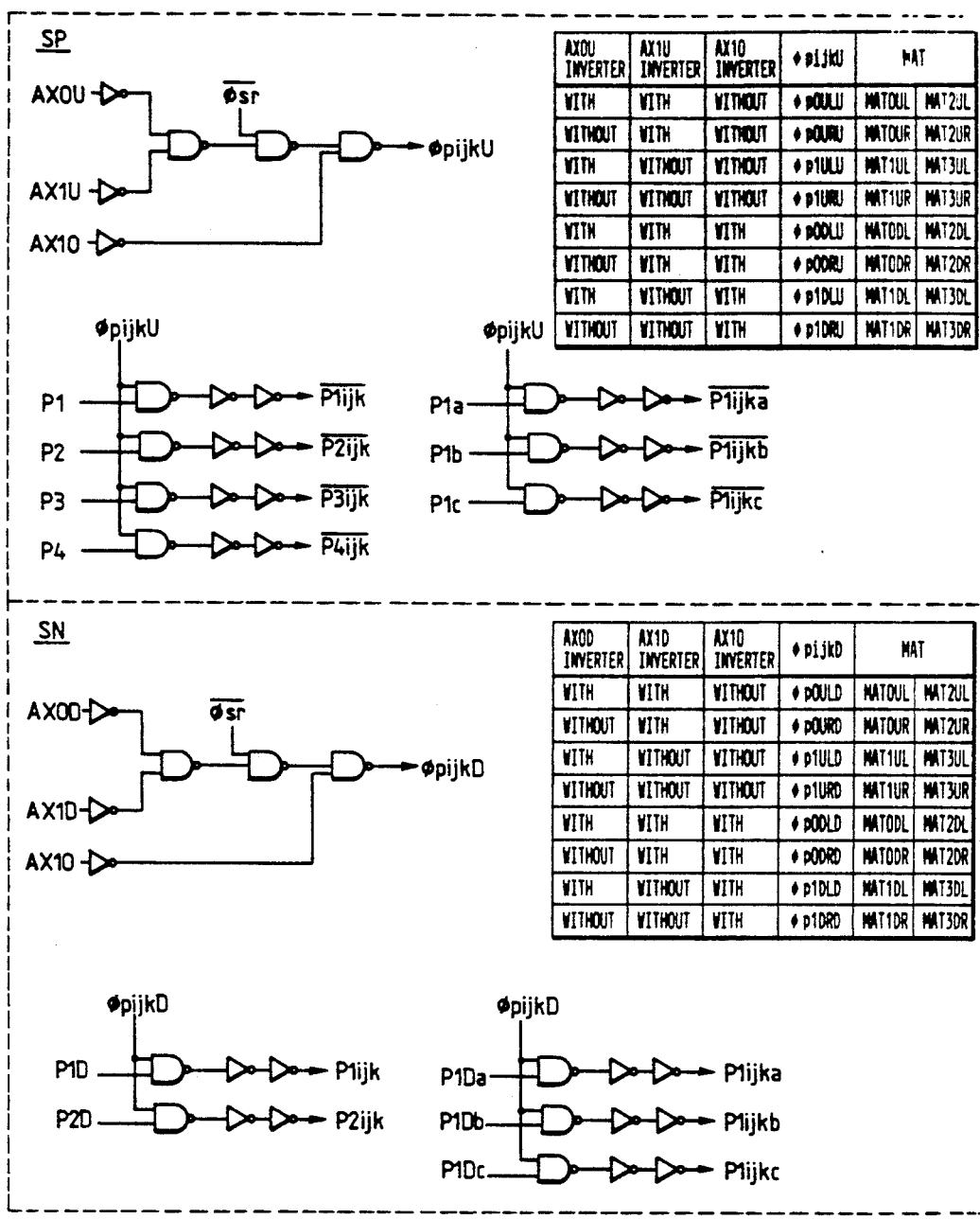

As shown in FIG. 22, the sense amplifier driving circuits SP and SN produce selectively the inverted timing signals $\overline{P10UL}$ to $\overline{P40UL}$ and the like, and the timing signals P107L, P20UL and the like on the basis of the timing signals P1 to P4 and P1a to P1c, or P1D to P2D and P1Da to P1Dc generated by the timing signal generating circuit TG, and the internal address signals AX0U to AXLU, or AX0U, AXLU and AX10.

(3) Column Switches and Common I/O Lines

The column switches CS0L to CS0R to CS3R include 1,056 pairs of switch MOSFETs respectively corresponding to the complementary data lines of the corresponding memory arrays. one of each pair of switch MOSFETs is connected through the unit circuit of the corresponding sense amplifier to the corresponding complementary data line, and the other switch MOSFET is connected sequentially and alternately to the corresponding four sets of common I/O lines IO00L to IO03 and IO00R to $\overline{IO}$03R, or IO34L to IO37L and IO34R to IO37R. Every four gates of the switch MOSFETs are connected sequentially in common. The Y-address decoder YD0 to YD3 give corresponding data line selection signals YS0 and the like to the gates of the corresponding switch MOSFETS.

The four pairs of switch MOSFETs of each of the column switches CS)L to CS3L and CS0R to CS3R are set selectively and simultaneously in the ON state by alternatively setting HIGH the corresponding data line selection signals YS0 and the like. Consequently, the specified four sets of complementary data lines of the corresponding memory array are connected selectively to the four sets of common I/O lines IO00L to IO003L or IO00R to IO03R, or IO034L to IO037L or $\overline{IO}$34R to IO37R.

Figure 59:
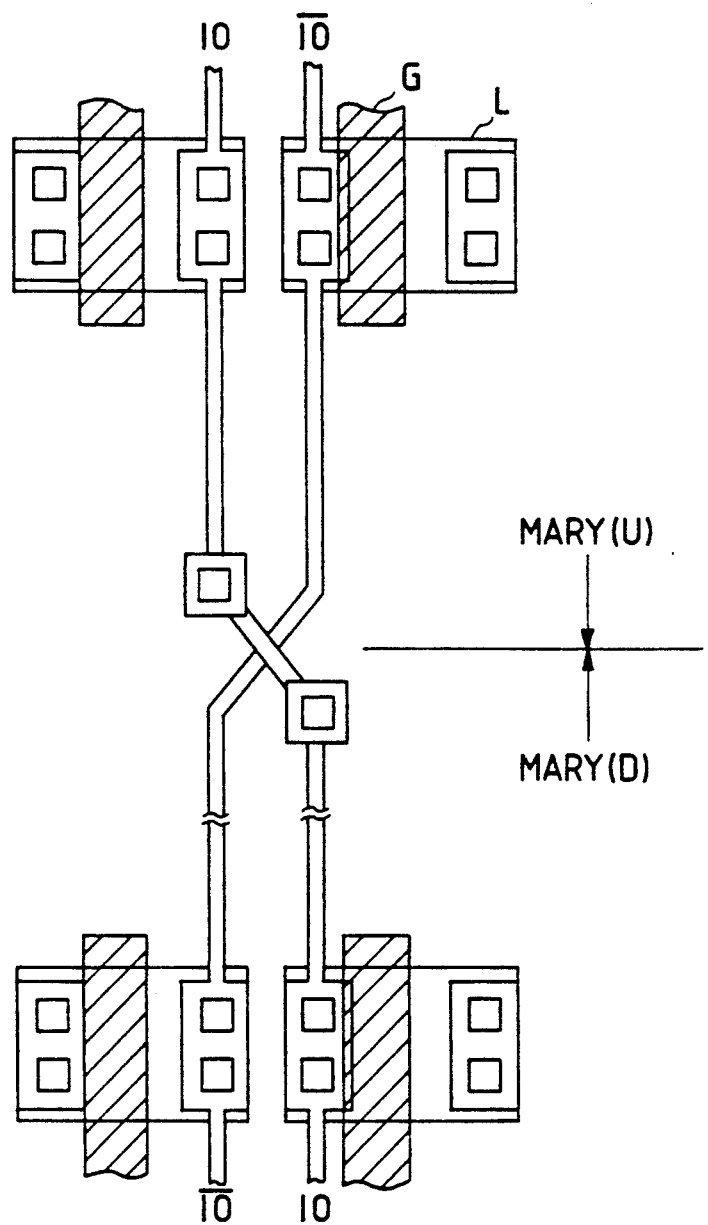

Incidentally, as stated above, the common I/O lines IO00L to IO003L or IO00R to IO03R, or IO34L to IO37L or $\overline{IO}$34R to IO37R of the pseudostatic RAM are disposed so as to extend through each pair of memory arrays disposed respectively in the upper side and in the lower side of the surface of the semiconductor substrate, and the noninverted and inverted signal lines of each common I/O line cross each other between the upper and lower arrays, as shown in FIG. 59. Accordingly, even if a photomask for forming a polycrystalline silicon layer for the gates G of the switch MOSFETs of the corresponding column switches is not aligned correctly with respect to the diffused layer L for the sources and drains in manufacturing the pseudostatic RAM, variations of parasitic capacitance coupled with the noninverted signal lines IO and inverted signal lines IO of the common I/O lines respectively in the upper array and the lower array cancel each other. Accordingly, the difference in level between the common I/O lines is absorbed and the read operation of the pseudostatic RAM is stabilized.

Although not shown in FIG. 38, the common I/O lines IO00L to IO03L and IO00R to IO03R, or IO34L to IO37L and $\overline{IO}$34R to IO37R undergo a so-called equalize process, in which the noninverted signal lines and the inverted signal lines are short-circuited and set on the half precharge level HVC, at three positions, namely, a position between the upper and lower arrays, and two positions respectively outside the upper and lower arrays, when the pseudostatic RAM is set in the nonselected state. The equalize process is stopped selectively by setting the pseudostatic RAM in the selected state and the corresponding memory arrays are set in the selected state. Consequently, the common I/O line equalizing process is carried out surely and rapidly to reduce time delay in transferring signals through the I/O lines, and hence the operating speed of the pseudostatic RAM is increased accordingly.

1.2.2 X-System Selection Circuit (1) X-Address Buffer

Figure 18:
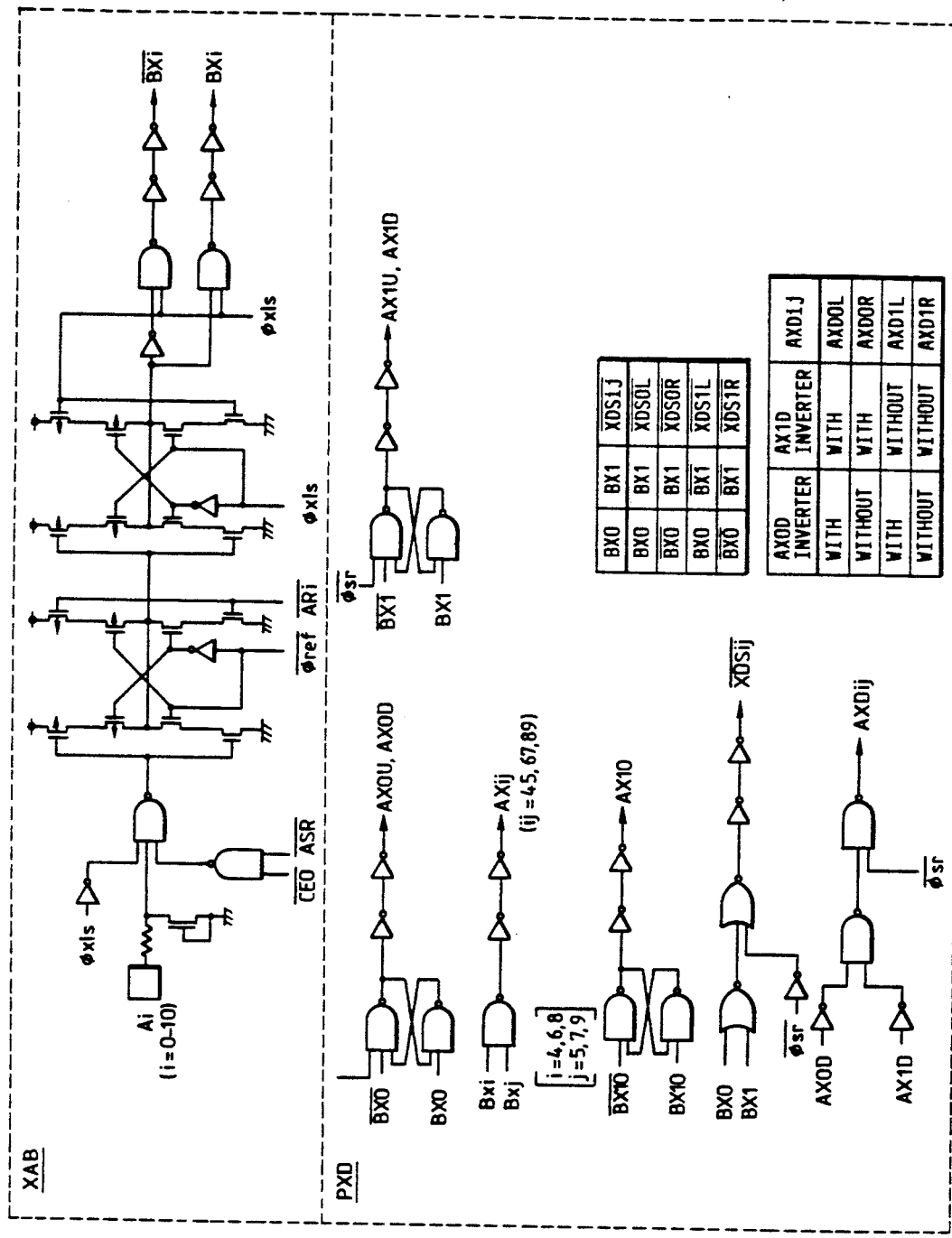

As shown in FIG. 18, the X-address buffer XAB has eleven unit circuits respectively corresponding to the address input terminals A0 to A10. The unit circuits comprise, respectively, multiplexers for selectively transferring the X-address signals X0 to X10 or the corresponding refresh address signals $\overline{AR0}$ to $\overline{AR10}$ applied to the corresponding address input terminals according to the inverted timing signal $\overline{\phi ref}$ given thereto by the timing signal generating circuit TG, and latch circuits which accept address signals transferred through the multiplexers according to a timing signal $\phi xls$ and holds the accepted address signals. The output signals of the latch circuits are controlled by gates according to the timing signal $\phi xls$ to provide the corresponding complementary internal address signals BX0 to BX10.

(2) Refresh Counter

Figure 19:
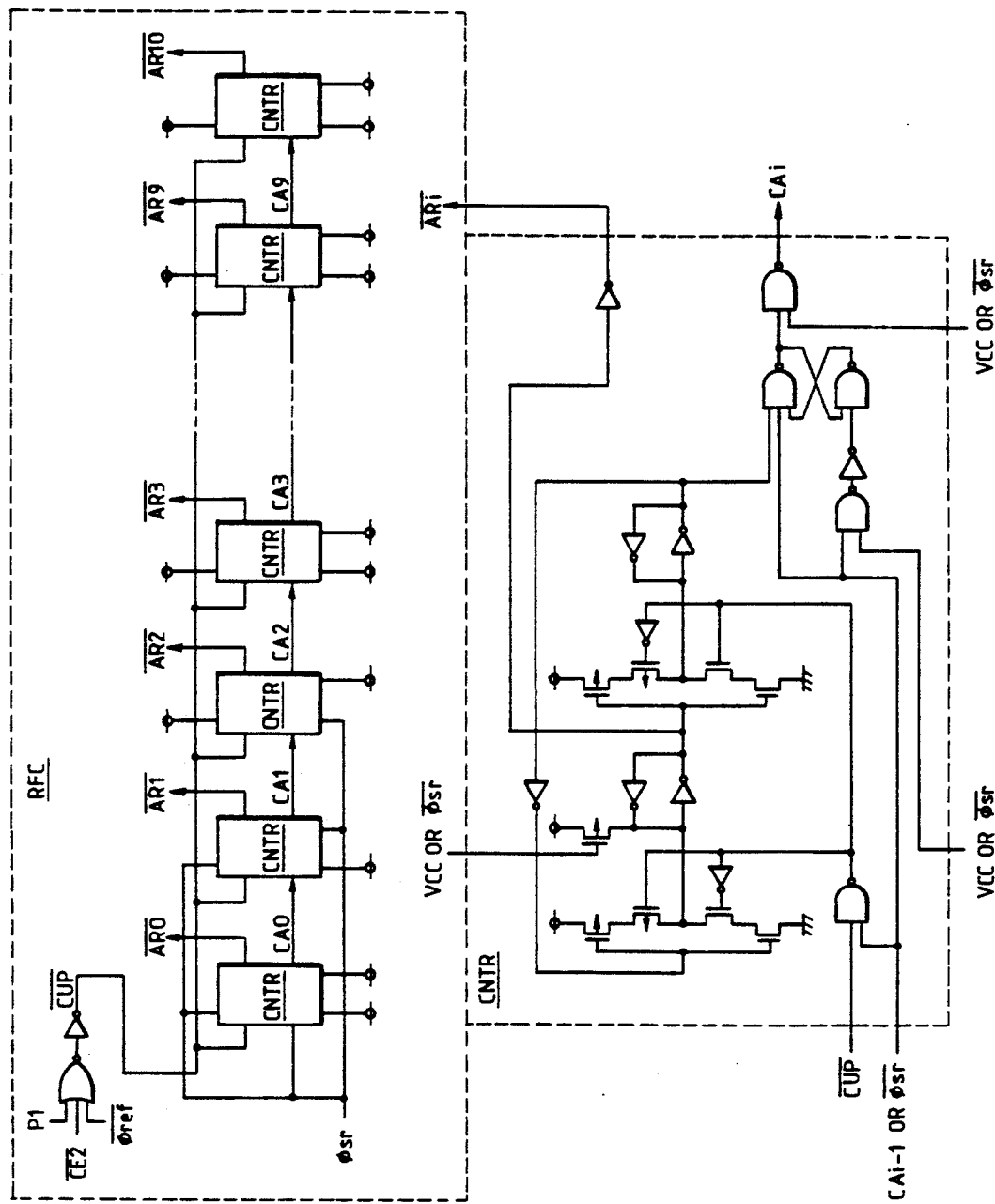

Referring to FIG. 19, the refresh counter RFC has eleven unit counter circuits CNTR respectively corresponding to the refresh address signals $\overline{AR0}$ to $\overline{AR10}$. Each unit counter circuit CNTR consists of a master latch and a slave latch, which are series-connected in a ring. The unit counter circuits CNTR are connected substantially in series by sequentially connecting the carry input terminals and the carry output terminals to constitute a single binary counter. The binary counter performs a stepping action according to an inverted count pulse signal $\overline{CUP}$.

The inverted count pulse signal $\overline{CUP}$ temporarily goes LOW for a period from a moment when the inverted timing signal $\overline{\phi ref}$ is allowed to go LOW by setting the pseudostatic RAM for the autorefresh cycle or the self-refresh cycle, and an inverted timing signal $\overline{CE2}$ is allowed to go LOW by setting the pseudostatic RAM in the selected state to a moment when a timing signal P1 goes HIGH. Thus, the refresh address signals $\overline{AR0}$ to $\overline{AR10}$ are reset for the next stepping state after the refresh address signals A0 to A10 have been accepted by the corresponding unit circuits of the X-address buffer XAB upon setting the pseudostatic RAM in the selected state.

(3) X-Predecoder

Referring to FIG. 18, the X-predecoder PXD has twelve unit decoder circuits which receive 2-bit complementary internal address signals BX4 and $\overline{BX5}$, BX6 and $\overline{BX7}$, and BX8 and $\overline{BX9}$ in predetermined combinations. The output signals AX450 to AX453, AX670 to AX673, and AX890 to AX893 of the unit decoder circuits are supplied to the X-decoders.

Although there is no particular restriction, the X-predecoder PXD shown in FIG. 18 includes several unit decoder circuits for producing array selection signals on the basis of the array selection complementary internal address signals BX0, BX1 and BX10. Among those array selection signals, inverted array selection signals $\overline{XDS0L}$ and $\overline{XDS0R}$, or $\overline{SCS3L}$ and $\overline{SCS3R}$ are used for selectively setting the X-decoders XD0L and XD0R, or XD3L and XD3R in the active state. The array selection circuit uses the array selection signals AXD0L, AXD1L, AXD0R and AXD1R, for example, for common I/O line changeover processing.

(4) Array Selection Circuit

Figure 28:
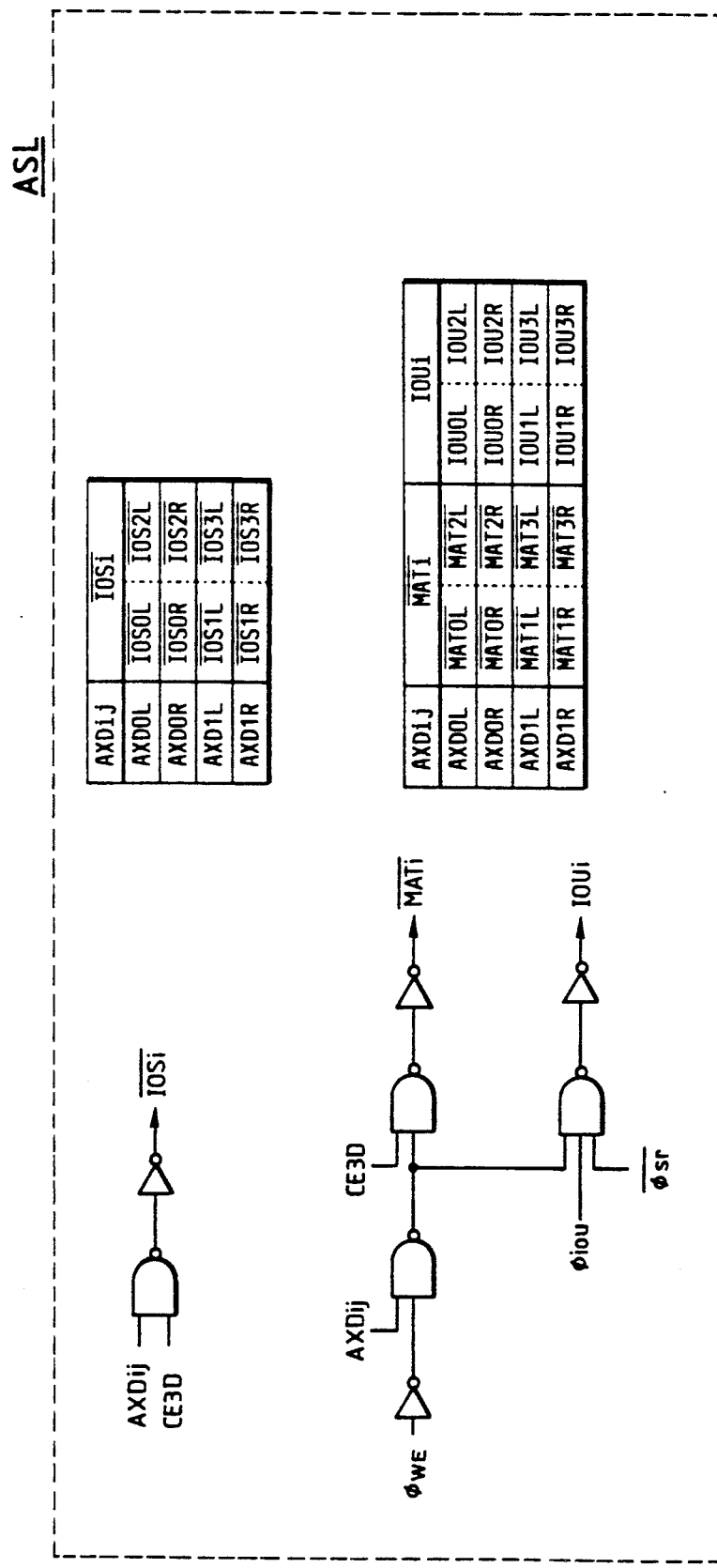

Referring to FIG. 28, the array selection circuit ASL produces selectively common I/O line equalizing inverted selection timing signals IOS0L and IOS2L, or IOS0R and IOS2R, or inverted selection timing signals $\overline{IOS1L}$ and $\overline{IOS3L}$, or $\overline{IOS1R}$ and $\overline{IOS3R}$ on the basis of the array selection signals $\overline{AXD0L}$, $\overline{AXD1L}$, $\overline{AXD0R}$ and $\overline{AXD1R}$, applied thereto by the X-predecoder PXD, and the timing signal CE3D. The array selection circuit ASL further produces selectively inverted array selection signals $\overline{MAT0L}$ and $\overline{MAT2L}$, or $\overline{MAT0R}$ and $\overline{MAT2R}$, or inverted array selection signals $\overline{MAT1L}$ and $\overline{MAT3L}$, or $\overline{MATLR}$ and $\overline{MAT3R}$ for selectively connecting the common I/O lines to the main amplifier on the basis of the array selection signals, the timing signal CE3D, and a timing signal cwe which goes HIGH selectively in the operating cycle of the write system. The array selection circuit ASL further produces selectively timing signals IOUL and IOU2L, or IOU0R and IOU2R, or timing signals IOU1L and IOU3L, or IOU1R and IOU3R by adding the logic condition of a timing signal $\phi iou$ which goes HIGH temporarily immediately before the main amplifier is set in the active state.

(5) X-System Redundant Circuit

Figure 20:
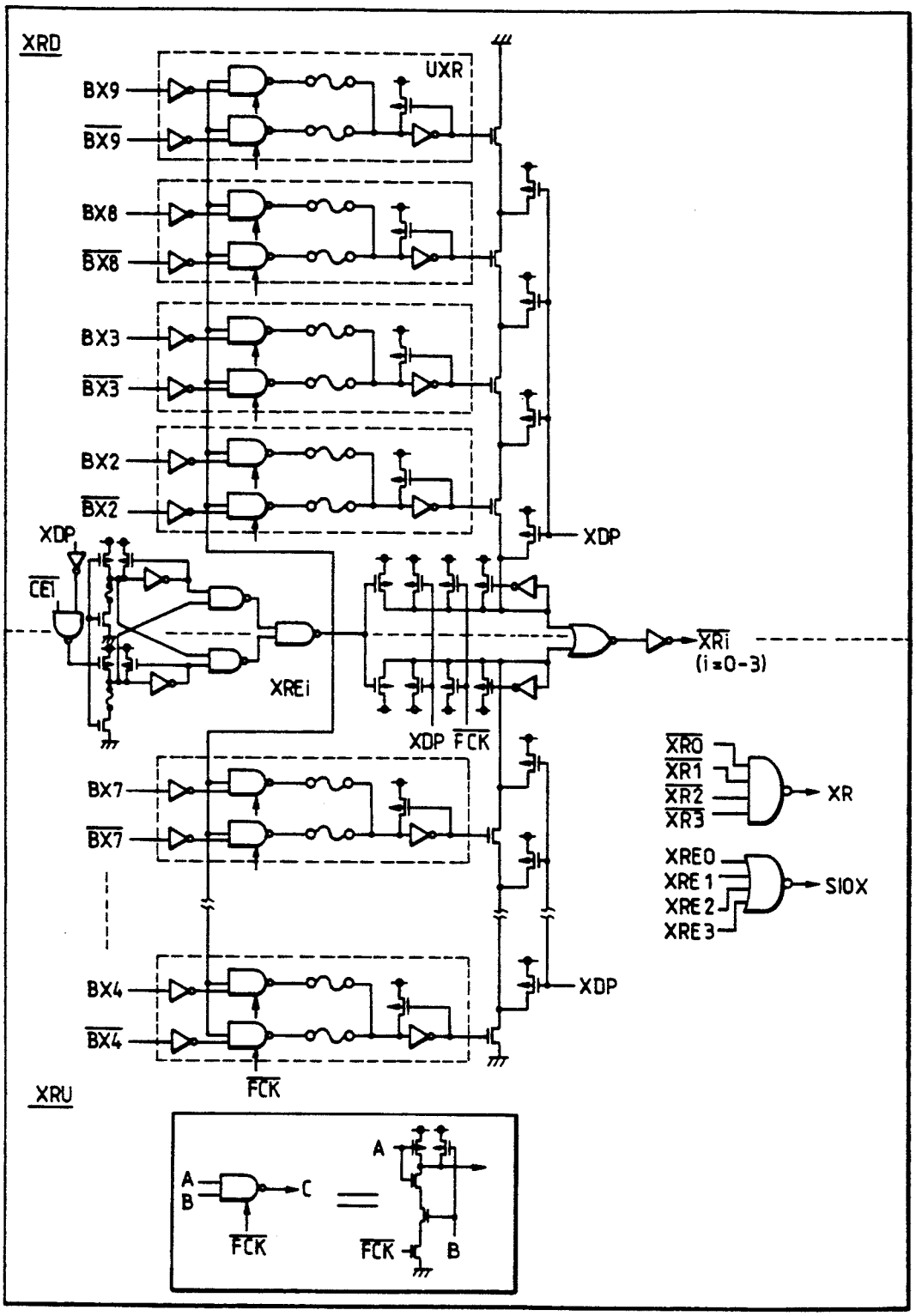

As stated above, the pseudostatic RAM has the four X-system redundant circuits XR0 to XR3 corresponding respectively to the word lines RWL0 to RWL3 of the memory arrays. As shown in FIG. 20, these X-system redundant circuits include an X-system redundant circuit XRU provided in the upper side of the surface of the semiconductor substrate, an X-system redundant circuit XRD provided in the lower side of the surface of the semiconductor substrate, and redundant enable circuits XRE.

The redundant enable circuits XRE include, as stated above, two fuse logic circuits which provide output signals which are subjected to an exclusive OR operation. The output signals XRE0 to XRE3 of the redundant enable circuits are allowed to go HIGH selectively on condition that the fuse means of one or the other fuse logic gate circuit is opened either when the inverted timing signal $\overline{CE1}$ is set LOW or when the timing signal XDP is set HIGH. Thus, the output signals XRE0 to XRE3 indicate a condition where bad addresses are written in the corresponding X-system redundant circuits, and the corresponding word lines are in the operative state.

On the other hand, the X-system redundant circuits XRU and XRD have four redundant address comparing circuits each including a pair of fuse means which are opened selectively when bits corresponding to bad addresses assigned to the corresponding redundant word lines are set at logic "0" or logic "1". These address comparing circuits are set selectively in the active state when the output signals XRE0 to XRE3 of the corresponding redundant enable circuits XRE goes HIGH. In such a case, the redundant enable circuits transfer selectively the corresponding complementary internal address signals BX2, BX3, and BX8 and BX9, or complementary internal address signals BX4 to BX7 on condition that the corresponding fuse means are not opened to function substantially as address comparing circuits. The output signals of the redundant address comparing circuits are applied, as stated above, to the gates of respective MOSFETs provided in series connection between the corresponding coincidence detection nodes and the ground potential of the circuit.

A pair of coincidence detection nodes included in the X-system redundant circuit are connected also to the input terminals of a corresponding NOR gate. The output signal of the NOR gate is inverted to produce the inverted redundant word line selection signals $\overline{XR0}$ to $\overline{XR3}$.

As stated above, the inverted redundant word line selection signals $\overline{XR0}$ to $\overline{XR3}$ are applied to the selective redundant word line driving signal generating circuit PRWD. The inverted redundant word line selection signals $\overline{XR0}$ to $\overline{XR3}$ are applied also to the corresponding input terminals of a 4-input NAND gate circuit to produce an internal control signal XR. The internal control signal XR goes HIGH selectively when any one of the redundant word line selection signals $\overline{XR0}$ to $\overline{XR3}$ goes LOW, namely, when any one of the redundant word line is selected, for example to stop selectively the operation of the selective word line driving signal generating circuit PWD for producing the selective word line driving signals X11 to X11.

Figure 35:
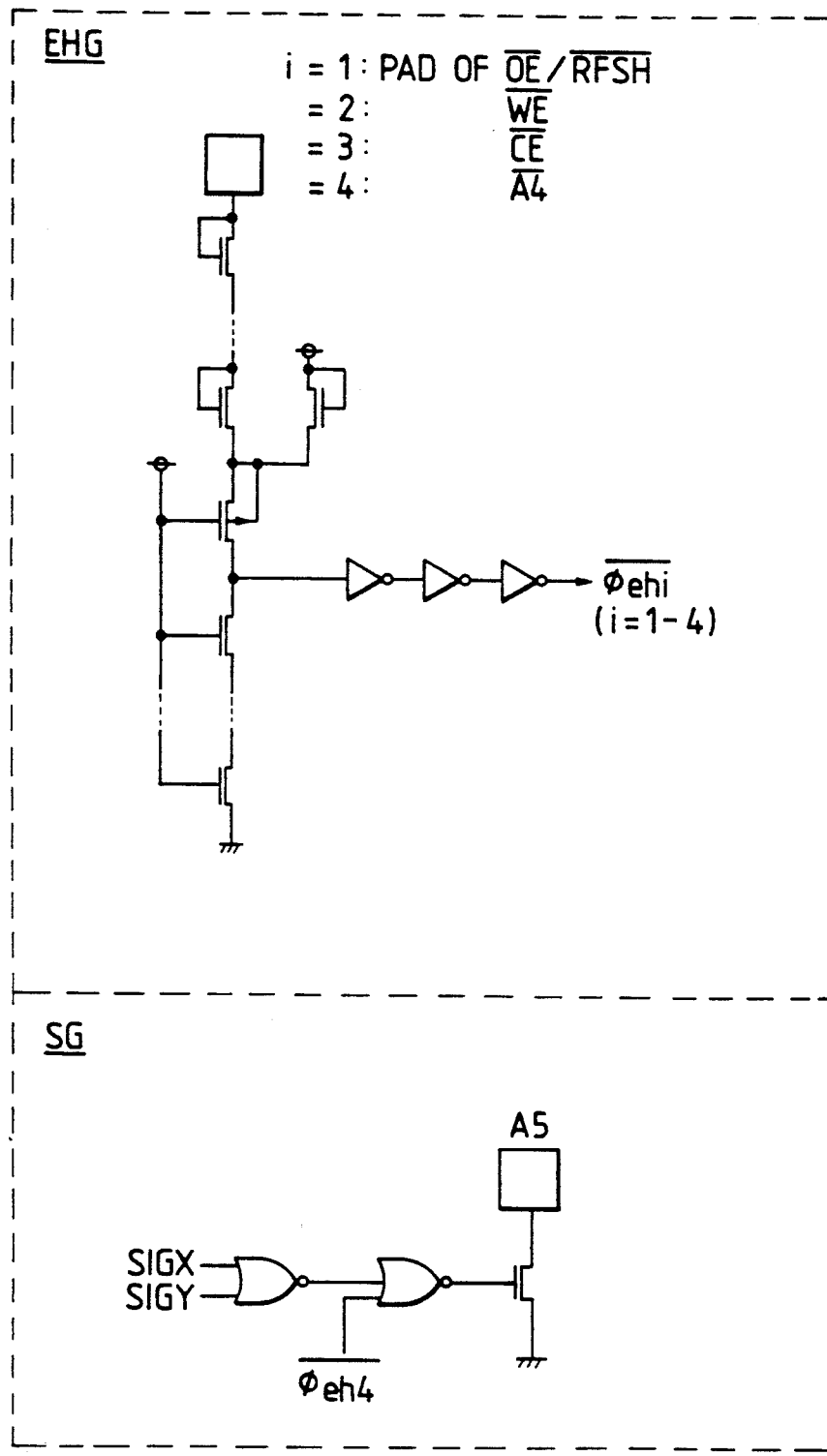

On the other hand, the output signals XRE0 to XRE3 of the redundant enable circuits XRE of the X-system redundant circuits, although there is no particular restriction, are applied to the corresponding input terminals of a 4-input NOR gate circuit to produce an internal control signal SIGX. As shown in FIG. 35, the internal control signal SIGX appears at an address input terminal A5 as a signature signal indicating that any one of the redundant word lines is in use on condition that an inverted internal control signal $\overline{\phi eh4}$ is LOW, namely, a predetermined high voltage is applied to the address input terminal A4.

The X-system redundant circuits XR0 to XR3 have further a fuse checking function for testing the conditions including a partial disconnection state of the fuse means of the redundant address comparing circuits when the inverted internal control signal FCK is LOW (FIG. 20).

(6) Word Line Driving Signal Generating Circuit

Figure 21:
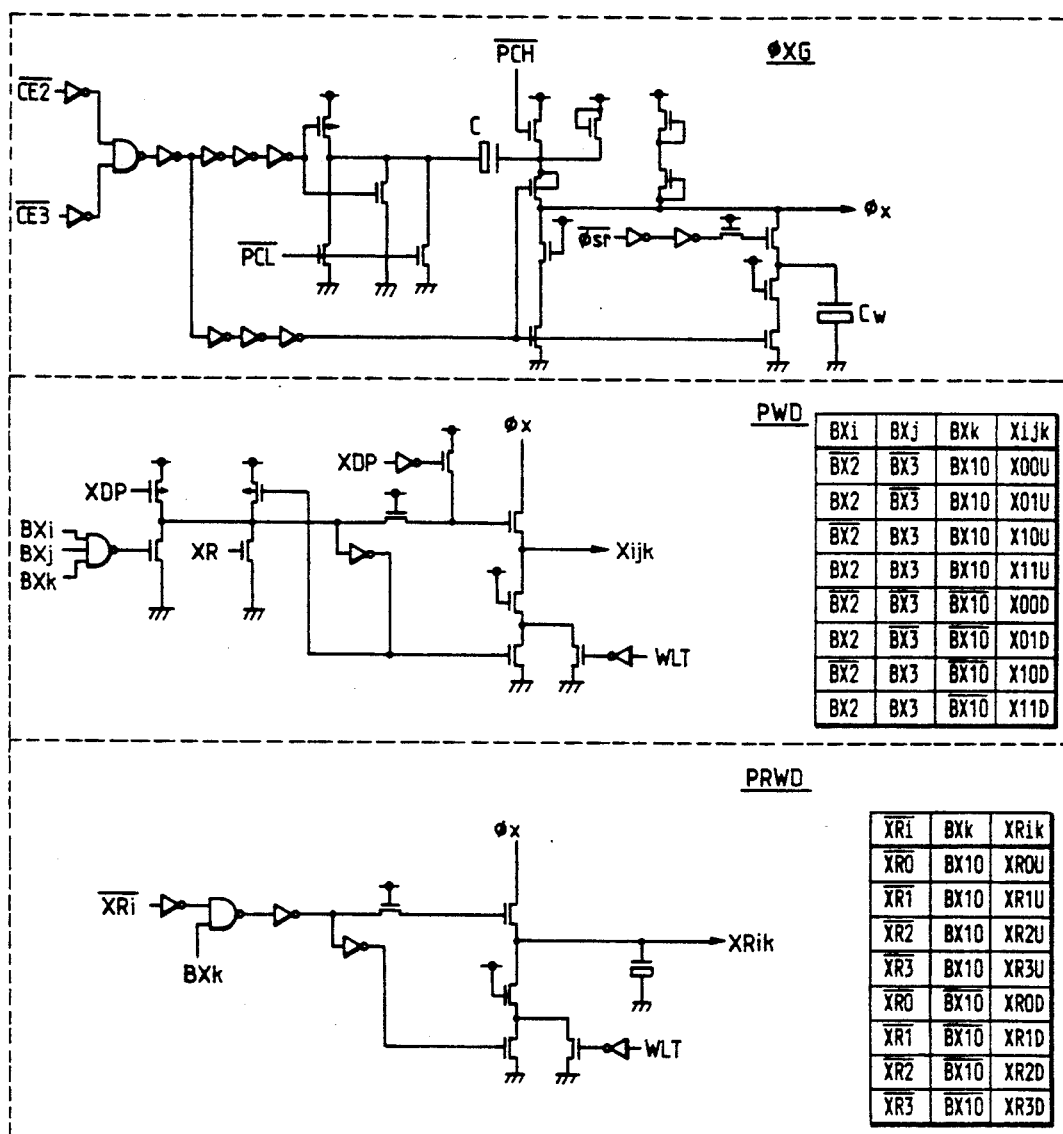

Referring to FIG. 21, the word line driving signal generating circuit $\phi$XG has a boost capacitor CB for producing a driving signal of a boost level. The boost capacitor CB is precharged when the pseudostatic RAM is in the nonselected state so that the right electrode is on a high potential level, such as the supply voltage of the circuit, and the left electrode is on a low potential level, such as the ground potential of the circuit. The left electrode is set on the high level at a moment when both the inverted timing signals $\overline{CE2}$ and $\overline{CE3}$ go LOW in setting the pseudostatic RAM in the selected state. Consequently, the potential of the right electrode is boosted up to a boost level higher than the supply voltage of the circuit to produce the word line driving signal $\phi$x selectively.

The word line driving signal $\phi$x is applied to the selective word line driving signal generating circuit PWD and the selective redundant word line driving signal generating circuit PRWD, and is transferred selectively as the selective word line driving signals X00 to X11 or the selective redundant word line driving signals XR0 to XR3.

Incidentally, the number of the memory arrays which are set in the active state simultaneously among those of the pseudostatic RAM is, as stated above, two in the ordinary operating mode, and is eight in the self-refresh mode. Accordingly, the number of the word lines to be selected simultaneously and the load capacity for the word line driving signal $\phi$x change when the operating mode changes and, consequently, the boost level varies. Accordingly, the pseudostatic RAM is provided with a level correcting capacitor Cw which is connected selectively between the output terminal of the word line driving signal generating circuit $\phi$XG and the ground potential of the circuit, when the pseudostatic RAM is in the selected state in the self-refresh mode and the inverted timing signal $\overline{\phi sr}$ is HIGH. The capacitor $C_w$ has a capacitance equivalent to the difference between the number of simultaneously selected word lines in the ordinary operating mode and that in the self-refresh mode, namely, a load capacity for the six word lines.

(7) Selective word Line Driving Signal Generating Circuit and Selective Redundant Word Line Driving Signal Generating Circuit Referring to FIG. 21, the selective word line driving signal generating circuit PWD transfers the word line driving signal cx selectively according to the timing signal XDP, and the 3-bit complementary internal address signals $\underline{BX2}$, $\underline{BX3}$ and $\underline{B10}$ for selecting the word lines of the upper or lower array to alternatively produce a selective word line driving signal X00U, X01U, X10U or X11U of the boost level, or a selective word line driving signal X00D, X01D, X10D or X11D of the boost level. The selective word line driving signal generating circuit PWD receives, as stated above, the internal control signal XR, which goes HIGH upon the coincidence of an address for memory access and a bad address assigned to any one of the redundant word line, from the X-system redundant circuit. When the internal control signal XR goes HIGH, the operation of the selective word line driving signal generating circuit PWD is stopped substantially and hence no selective word line driving signal is generated.

On the other hand, the selective redundant word line driving signal generating circuit PRWD transfers the word line driving signal $\phi$x selectively according to the timing signal BXK and the corresponding inverted word line selection signals $\overline{XR0}$ to $\overline{XR3}$ to produce the selective redundant word line driving signals XR0 to XR3 of the boost level selectively. As stated above, when one of the inverted redundant word line selection signals $\overline{XR0}$ to $\overline{XR3}$ goes LOW upon the coincidence of the address supplied for memory access and the bad address assigned to any one of the redundant word line, namely, when the selective redundant word line driving signal generating circuit PRWD is substantially in the active state, the operation of the selective word line driving signal generating circuit PWD is stopped substantially.

(8) X-Decoders

Figure 36:
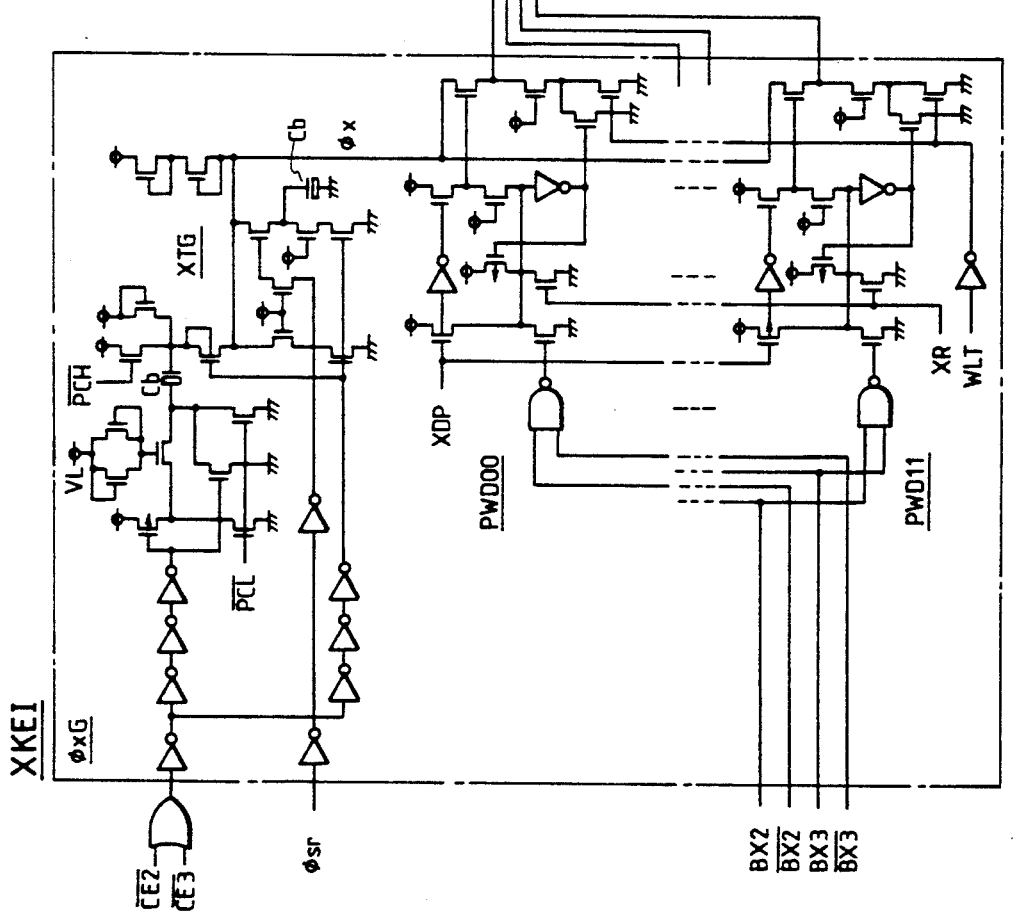

Each of the X-decoders XD0L and XD0R to the X-decoders XD3L and XD3R has sixty-four unit circuits corresponding to the word line groups of the corresponding memory array, and another unit circuit corresponding to the four redundant word lines. As shown in FIG. 36, each of these unit circuits includes four word line driving MOSFETs MDR0-MDR3 corresponding to the four word lines of each word group. The sources of the word line driving MOSFETs are connected respectively to the corresponding word lines. The selective word line driving signals X00 to X11 or the selective redundant word line driving signals XR0 to XR3 are applied respectively to the drains of the word line driving MOSFETS. The gates of the word line driving MOSFETs are connected through corresponding coupling MOSFETs in common to an internal node N12, i.e., the output terminal of an inverter circuit N9.

The input terminal of the inverter circuit N9 is connected to the output of inverter circuit N11 which has an input coupled through three series-connected MOSFETs constituting a so-called decoder tree to the output terminal of an inverter circuit N10. The predecode signals AX450 to AX453, AX670 to AX673, and AX890 to AX893 are applied in a predetermined combination to the respective gates of the three series-connected MOSFETS. The X-predecoder PXD applies the inverted array selection signals $\overline{XDS0L}$ and $\overline{XDS0R}$ to $\overline{XDS3L}$ and $\overline{XDS3R}$ respectively to the input terminals of the inverter circuits N10. Each internal node N12 is allowed selectively to go HIGH when the corresponding inverted array selection signal, for example, the inverted array selection signal $\overline{XDS0L}$, goes LOW and the predecode signals of a corresponding combination are changed simultaneously from LOW to HIGH. Consequently, the selective word line driving signals X00 to X11, which are set selectively at the boost level, are transferred to one specified word line among the corresponding word lines to set the specified word line alternatively in the selected state.

Although not shown in FIG. 36, when a bad address assigned to one of the redundant word lines is specified, the boost level of the selective redundant word line driving signals XR0 to XR3 is transferred to the corresponding redundant word lines WR0 to WR3 regardless of the predecode signal.

1.2.3 Y-System Selection Circuit (1) Y-Address Buffer

Figure 23:
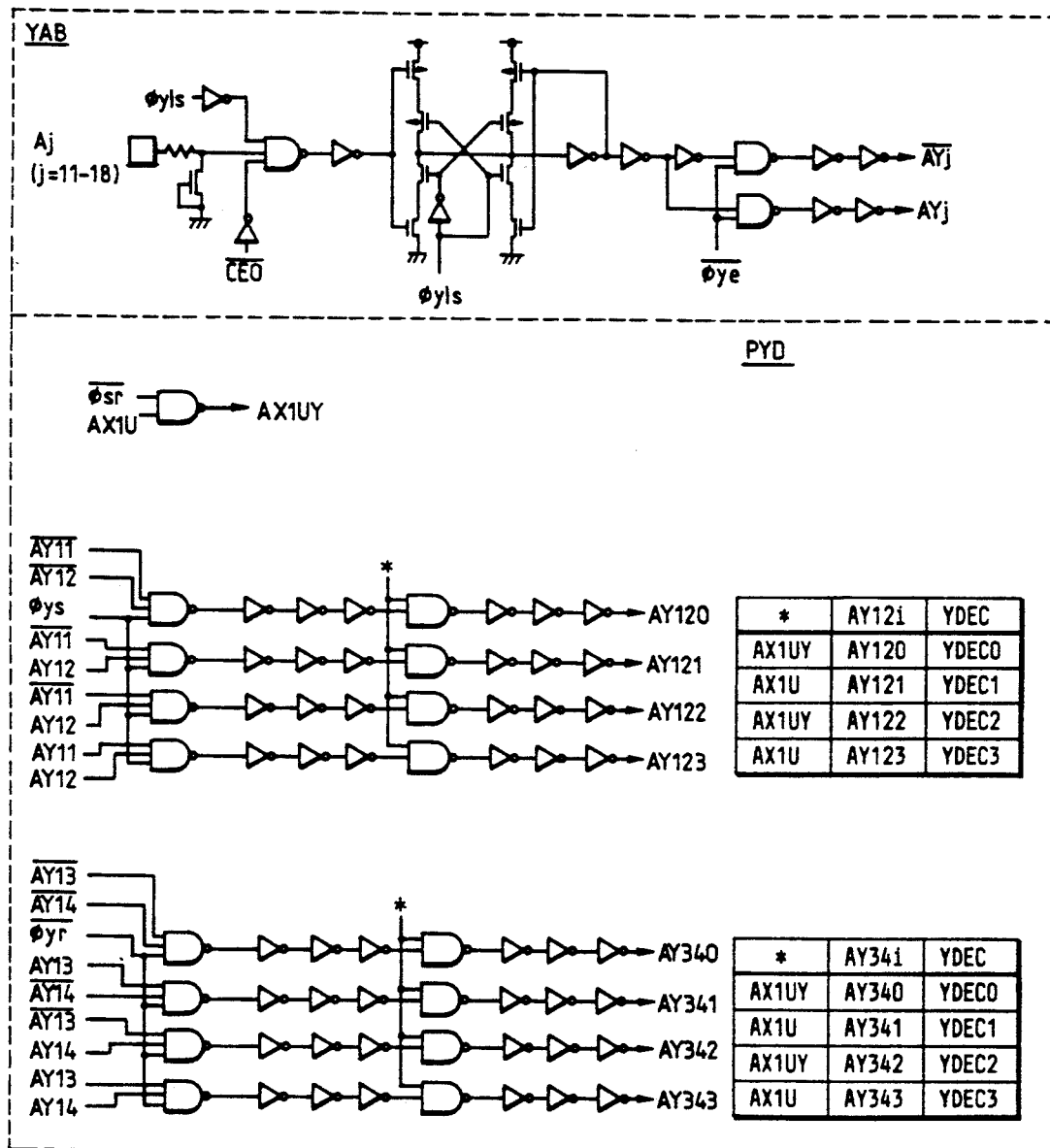

Referring to FIG. 23, the Y-address buffer XAB has eight unit circuits respectively corresponding to address input terminals A11 to A18. The unit circuits include latch circuits, respectively, to accept Y-address signals Y11 to Y18 applied respectively to the input terminals according to inverted timing signals $\overline{CE0}$ and $\overline{\phi yls}$ and to hold the accepted Y-address signals Y11 to Y18. The respective output signals of the latch circuits are subjected to gate control according to an inverted timing signal $\overline{\phi ye}$, and are transferred to the Y-predecoder PYD as complementary internal address signals $\underline{AY11}$ to $\overline{AY18}$.

(2) Y-Predecoder

Figure 24:
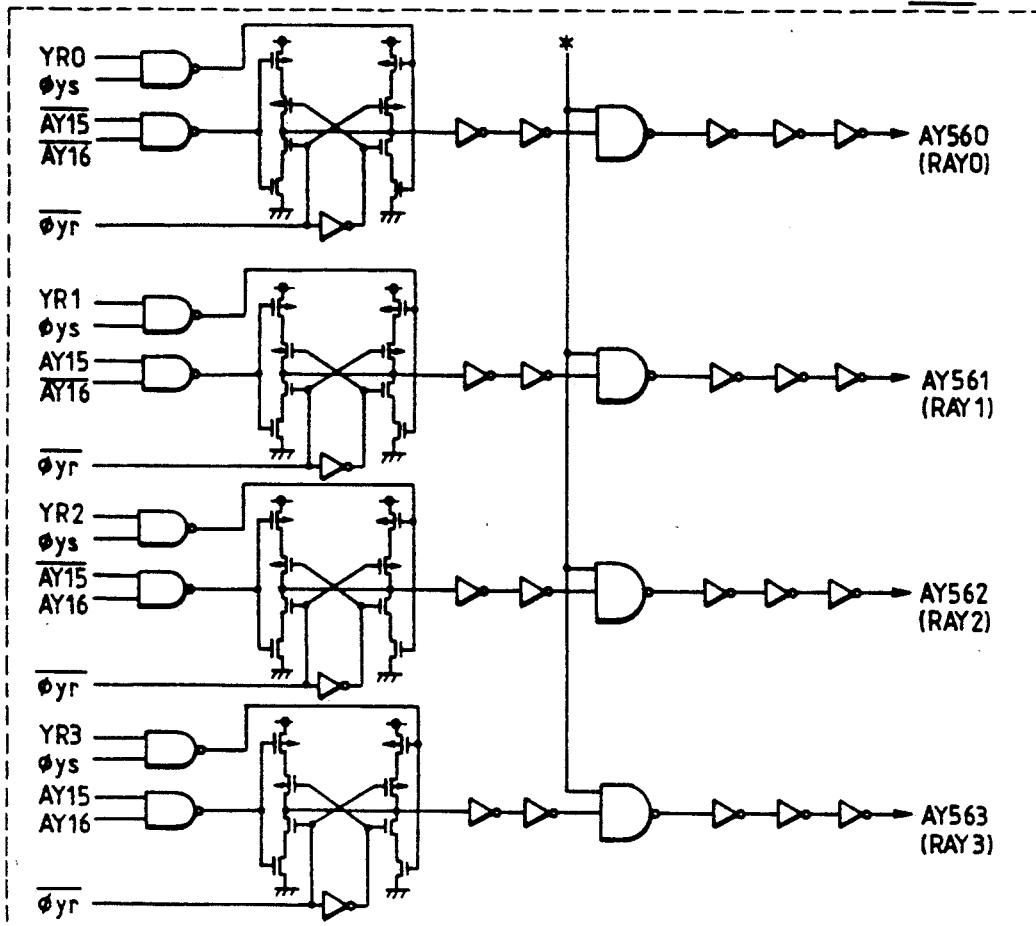
Figure 25:
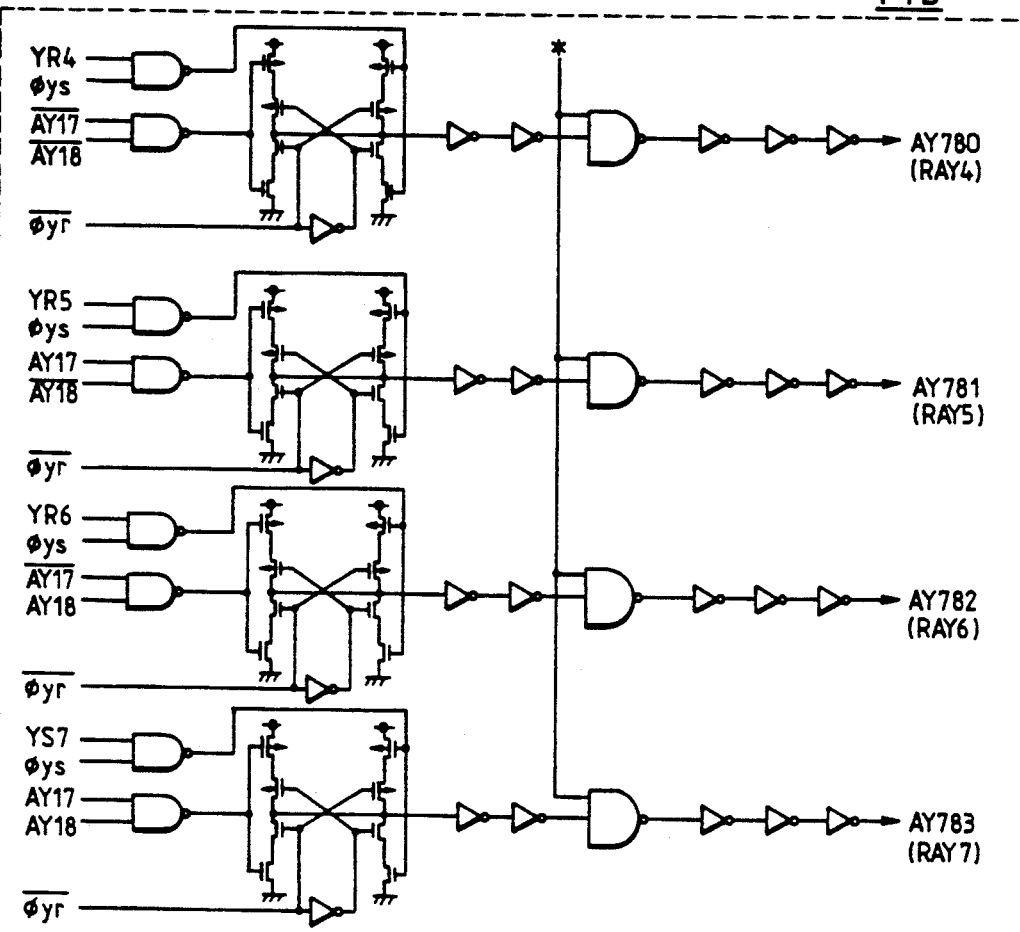
Figure 25:
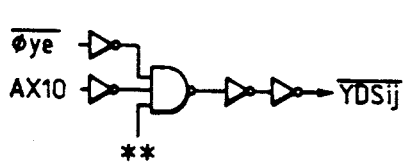

Referring to FIGS. 23 to 25, the Y-predecoder PYD has a total of sixteen unit decoder circuits which receive the noninverted and inverted signals of two bits of complementary internal address signals $\underline{AY11}$ and $\underline{AY12}$, $\underline{AY13}$ and $\underline{AY14}$, $\underline{AY15}$ and $\underline{AY16}$, or $\underline{AY17}$ and $\overline{AY18}$ in a predetermined combination. The output predecode signals AY120 to AY123, AY340 to AY343, AY560 to AY563 or AY780 to AY783 are applied to each Y-decoder.

Incidentally, comparatively long sixteen signal lines for transferring the predecode signals AY120 to AY123, AY340 to AY343, AY560 to AY563 and AY780 to AY783 are extended through comparatively narrow areas extending along the Y-decoders YD0 to YD3 disposed between the pairs of memory arrays. Although eight signal lines for transferring the redundant word line selection signals YR0 to YR7 from the Y-system redundant circuit YRAC to the Y-decoders must be laid out in those areas, actually, these areas are not wide enough to lay out the eight signal lines therein.

Figure 46:
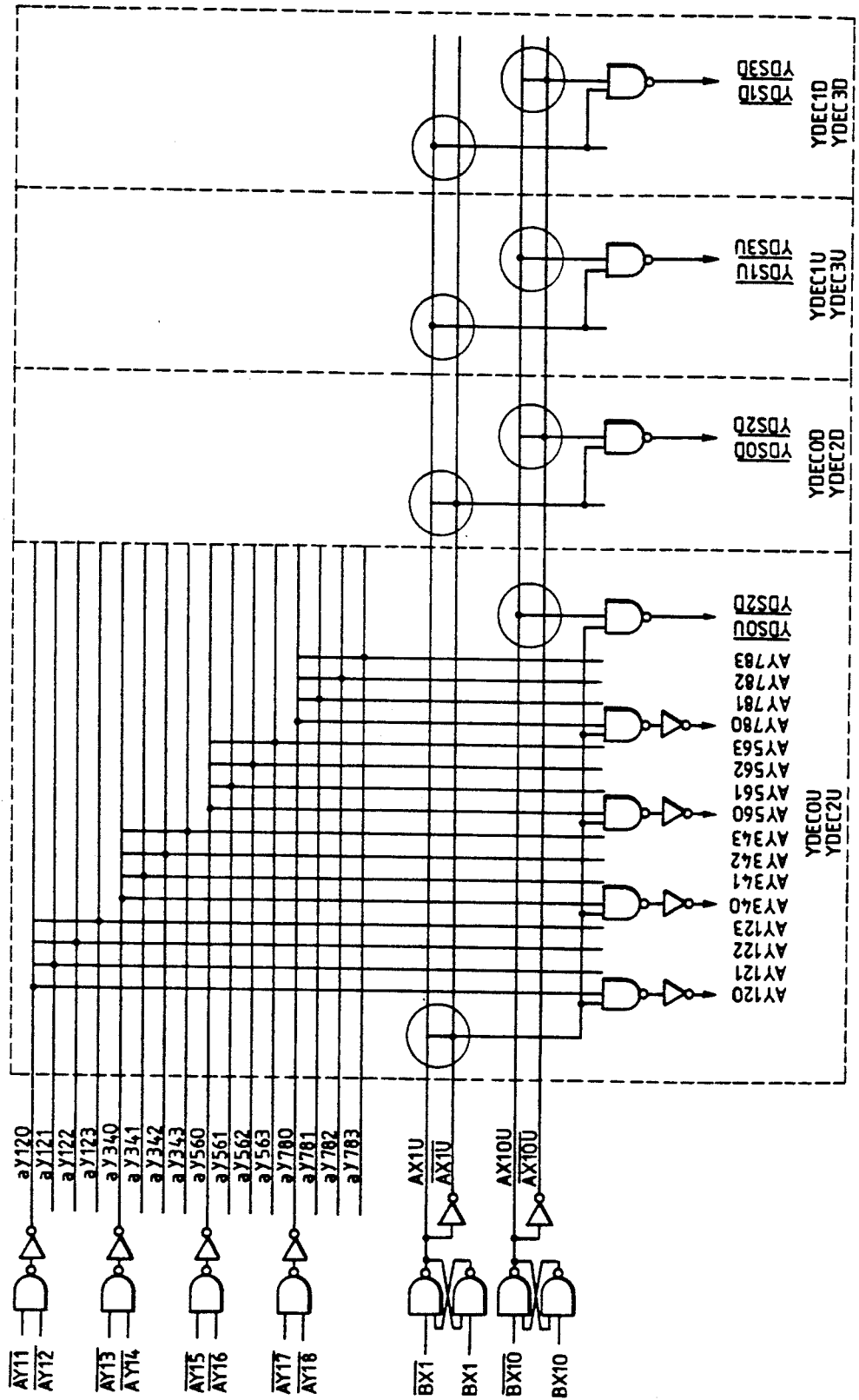

Accordingly, as shown in FIGS. 24 and 25, the pseudostatic RAM in this embodiment uses the eight signal lines for transferring the predecode signals AY560 to AY563, and AY780 to AY783 also for transferring the redundant data line selection signals. That is, the eight unit decoder circuits corresponding to the predecode signals are provided with multiplexers which receive the inverted timing signal $\overline{\phi yr}$ as gate control signal. The inverted timing signal $\overline{\phi yr}$ goes Low selectively upon the coincidence of the Y-address signals Y11 to Y18 provided for memory access, and the bad addresses assigned to any one of the eight sets of redundant data lines. When the $\overline{\phi yr}$ goes LOW, the multiplexers of the unit decoder circuits select the redundant data line selection signals YR0 to YR7 and transfer the same to the Y-decoders. On the other hand, when the inverted timing signal $\overline{\phi yr}$ is HIGH, the multiplexers of the unit decoder circuits select the corresponding predecode signals AY560 to AY563, and AY780 to AY783 and transfer the same to the Y-decoders. Thus, the additional single signal line for transferring the gate control timing signal cyr to the Y-decoders is equivalent to eight signal lines, and hence the pseudostatic RAM can be formed in a reduced chip area.

on the other hand, the predecode signals AY120 to AY123, AY340 to AY343, AY560 to AY563, and AY780 to AY783 are gate-controlled by a selection signals AX1U or AX1UY indicated by a symbol "*" in FIGS. 23 to 25, and then transferred through three-stage inverter circuits serving as drivers to the corresponding Y-decoders. In this embodiment, NAND gates for gate-control and the three-stage inverter circuits are disposed near the corresponding Y-decoders as shown in FIG. 46 to reduce the delay time in transferring the predecode signals through the signal transfer circuits.

(3) Y-System Redundant Circuits

Figure 26:
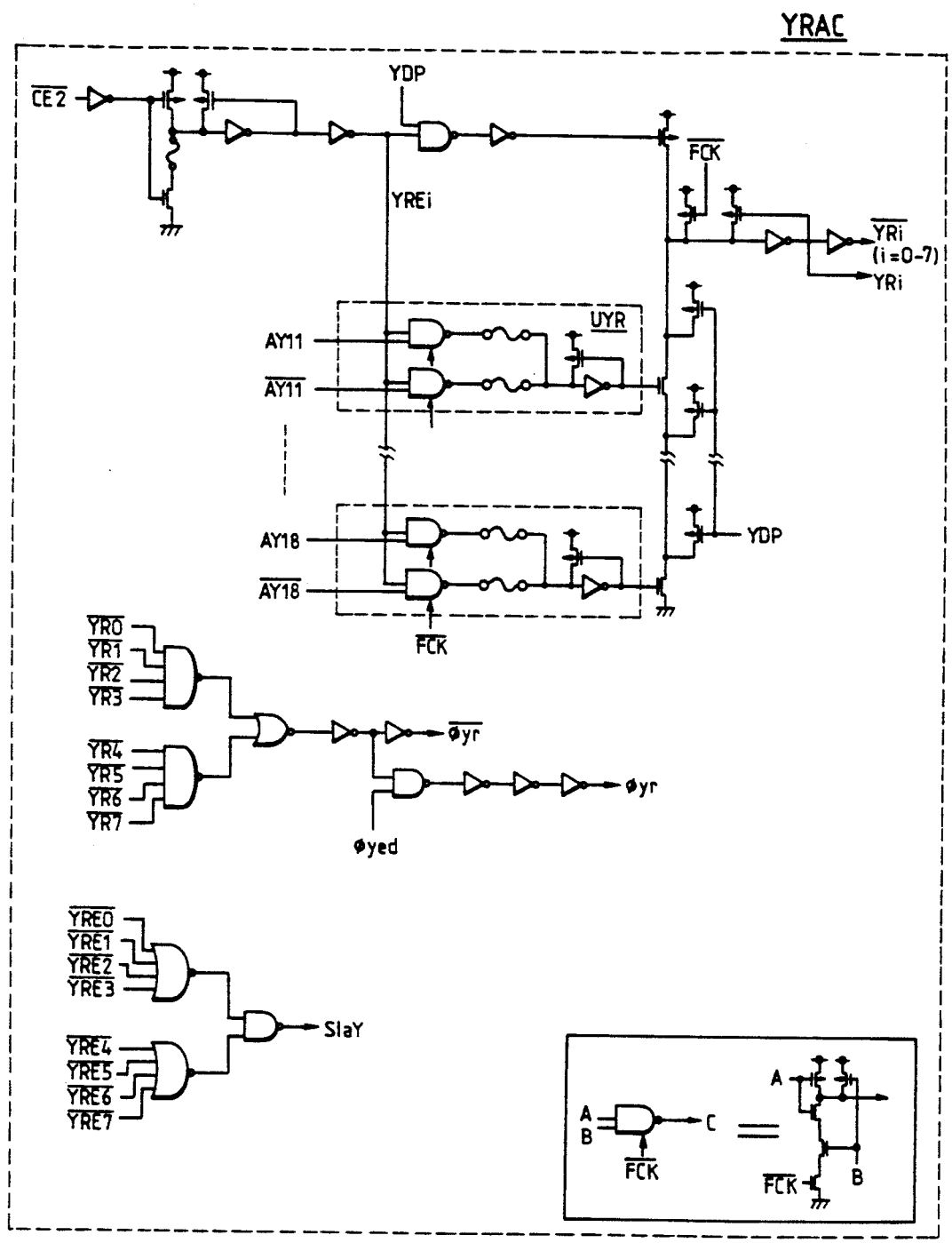

As stated above, the pseudostatic RAM has the thirty-two sets of redundant complementary data lines RD0 to RD31 for each memory array, and the eight Y-system redundant circuits YRC0 to YRC7 for every four sets of redundant complementary data lines, i.e., each redundant data line group. As shown in FIG. 26, each X-system redundant circuit includes a single redundant enable circuit YRE, and eight redundant address comparing circuits corresponding to the bits of the complementary internal address signals $\underline{AY11}$ to $\underline{AY18}$. These redundant enable circuits and the redundant address comparing circuits function similarly to the X-system redundant circuits, and the output signals thereof, i.e., the redundant data line selection signals YR0 to YR7, are set HIGH selectively.

The redundant enable circuit YRE of each Y-system redundant circuit includes fuse means which is opened selectively when the corresponding Y-system redundant circuit is effective, namely, when bad addresses are assigned to the corresponding redundant data line group. When the fuse means are opened, the output signals YRE0 to YRE7 go HIGH. On the other hand, each of the eight redundant address comparing circuits of each Y-system redundant circuit includes two fuse means which are opened selectively when the corresponding bits of the bad addresses assigned to the corresponding redundant data line group is set to logic "0" or "1". When the fuse means are opened, the redundant address comparing circuit stores the corresponding bits of the bad address. The redundant address comparing circuits are set selectively in the active state to compare the bad addresses and the Y-address signals Y11 to Y18 provided for memory access, i.e., the corresponding bits of the complementary internal address signals $\underline{AY11}$ to $\underline{AY18}$, when the output signals YRE0 to $\overline{YRE7}$ of the corresponding redundant enable circuits are HIGH. When the bits coincide with each other, the output signals of the redundant address comparing circuits go HIGH selectively.

The output signals of the redundant address comparing circuits are applied to the gates of eight MOSFETs provided in series respectively between predetermined detection nodes and the ground potential of the circuit. When all the output signals of the eight redundant address comparing circuits are HIGH, namely, when all the bad addresses held by the Y-system redundant circuits and all the bits of the Y-address signals Y11 to Y18 provided for memory access coincide with each other, the detection nodes go LOW selectively. The levels of the detection nodes are converted by inverter circuits into the redundant data line selection signals YR0 to YR7 and the inverted redundant data line selection signals $\overline{YR0}$ to $\overline{YR7}$.

That is, the Y-system redundant circuits YRAC0 to YRAC7 function as redundant address comparing circuits for the bit-by-bit comparison of the bad addresses and the Y-address signals Y11 to Y18, i.e., the complementary internal address signals $\underline{AY11}$ to $\underline{AY18}$, in addition to functioning as bad address ROMs for holding the bad addresses assigned to the corresponding redundant data line groups. When all the bits of the corresponding bad addresses and the complementary internal address signals $\underline{AY11}$ to $\underline{AY18}$ coincide with each other, the output signals of the Y-system redundant circuit YRAC0 to YRAC7, i.e., the redundant data line selection signals YR0 to YR7 go HIGH selectively and the inverted redundant data line selection signals $\overline{YR0}$ to $\overline{YR7}$ go LOW selectively.

As stated above, the redundant data line selection signals YR0 to YR7 are transferred through the Y-predecoders PYD to the Y-decoders. The inverted redundant data line selection signals $\overline{YR0}$ to $\overline{YR7}$ are applied to the corresponding input terminals of a substantial 8-input negative OR circuit to produce the inverted timing signal $\overline{\phi}yr$. Naturally, the inverted timing signal $\overline{\phi}yr$ goes LOW selectively when any one of the redundant data line selection signals $\overline{YR0}$ to $\overline{YR7}$ goes LOW, namely, when any one of the redundant data line groups is set in the selected state. The inverted timing signal $\overline{\phi}yr$ is gate-controlled in combination with the timing signal eyed to produce the timing signal $\phi yr$. As stated above, the noninverted and inverted timing signal $\phi yr$ are used for controlling the multiplexers of the Y-predecoders PYD and for controlling the operation of the Y-decoders YD for selecting the complementary data lines or the redundant complementary data lines.

Although there is no particular restriction, the output signals $\overline{YRE0}$ to $\overline{YRE7}$ of the redundant enable circuits YRE of the Y-system redundant circuits are applied to the corresponding input terminals of a substantial 8-input OR circuit to produce an internal control signal SIGY. Naturally, the internal control signal SIGY goes HIGH selectively when any one of the output signals $\overline{YRE0}$ to $\overline{YRE7}$ of the redundant enable circuits YRE goes HIGH, namely, when a bad address is assigned to any one of the redundant data line groups. The internal control signal SIGY, similarly to the internal control signal SIGX, appears as a signature signal at an input terminal A5 when the predetermined high voltage is applied to an address input terminal A4.

The Y-system redundant circuits YRAC0 to YRAC7 has a fuse checking function to test the partial disconnection of the fuse means of the redundant address comparing circuits when the inverted internal control signal $\overline{FCK}$ goes LOW.

(4) Y-Decoders

Each of the Y-decoders YD0 to YD3 has 256 unit circuits corresponding to the four sets of complementary data lines of the corresponding pair of memory arrays, and eight unit circuits corresponding to the four sets of redundant complementary data lines, i.e., the redundant data line groups. As shown by way of example in FIG. 37, each of the unit circuits corresponding to the four sets of complementary data lines includes a plurality of p-channel and n-channel MOSFETs provided in series or in parallel between a detection node and the supply voltage of the circuit or between the detection node and corresponding inverted Y-decoder control signals $\overline{YDS1U}$ or $\overline{YDS1D}$, i.e., $\overline{YDS0U}$ to $\overline{YDS3U}$ or $\overline{YDS0D}$ to $\overline{YDS3D}$. These MOSFETs construct a single NAND gate circuit which receives the corresponding combinations of the predecode signals AY120 to AY123, AY340 to AY343, AY560 to AY563 and AY780 to AY783 at the gate. Accordingly, the detection node of each unit circuit goes LOW selectively when the control signal of the corresponding inverted Y-decoder control signal goes LOW and all the corresponding predecode signals are HIGH. Consequently, the corresponding data line selection signals YS0 to YS255 are set HIGH alternatively and the corresponding four sets of complementary data line are set in the selected state. When the redundant data line selection signals YR0 to YR7 are transferred through the predecode signal lines AY560 to AY563 and AY780 to AY783, all the predecode signal lines AY340 to AY343 go LOW. Accordingly, all the ordinary data line selection signals for selecting the complementary data lines go LOW.

Figure 37:
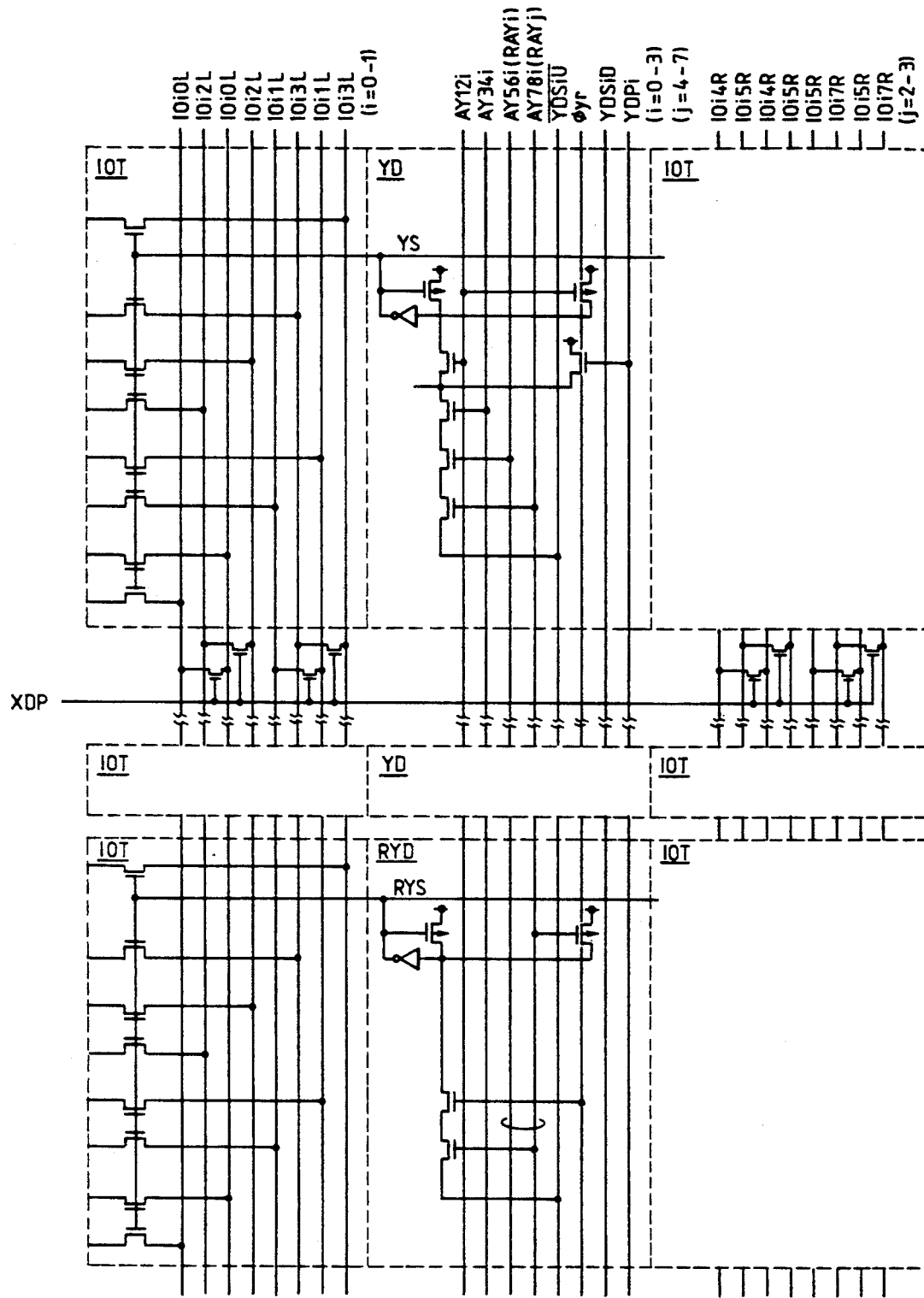

Although there is no particular restriction, the four unit circuits corresponding to the redundant data line groups include, as shown in FIG. 37, 2-input NAND gate circuits which receive the timing signal $\phi yr$ and the corresponding predecode signals AY560 to AY563 or AY780 to AY783, i.e., the redundant data line selection signals YR0 to YR7, respectively. The output signals of the NAND circuits go LOW selectively when the corresponding inverted Y-decoder control signals go LOW and the timing signal $\phi yr$ and the corresponding redundant data line selection signals YR0 to YR7 go HIGH. Consequently, the corresponding redundant data line selection signals RYS0 to RYS7 go HIGH alternatively and the corresponding four sets of redundant complementary data lines are set in the selected state.

1.2.1 Data Input-Output Circuit (1) Data Input Buffer

The data input buffer DIB is provided with eight unit circuits corresponding to data input-output terminals IO0 to IO7. As shown in FIG. 3, the input terminals of these unit circuits are connected to the corresponding data input-output terminals IO0 to IO7. On the other hand, the output terminals of the first to fourth unit circuits corresponding to the data input-output terminals IO0 to IO3 of the data input buffer DIB are connected in common to the corresponding unit circuits of the adjacent write circuits DILL and DIRL. The output terminals of the fifth to eighth unit circuits corresponding to the data input-output terminals IO4 to IO7 are connected in common to the input terminals of the corresponding unit circuits of the DILR and DIRR.

Figure 29:
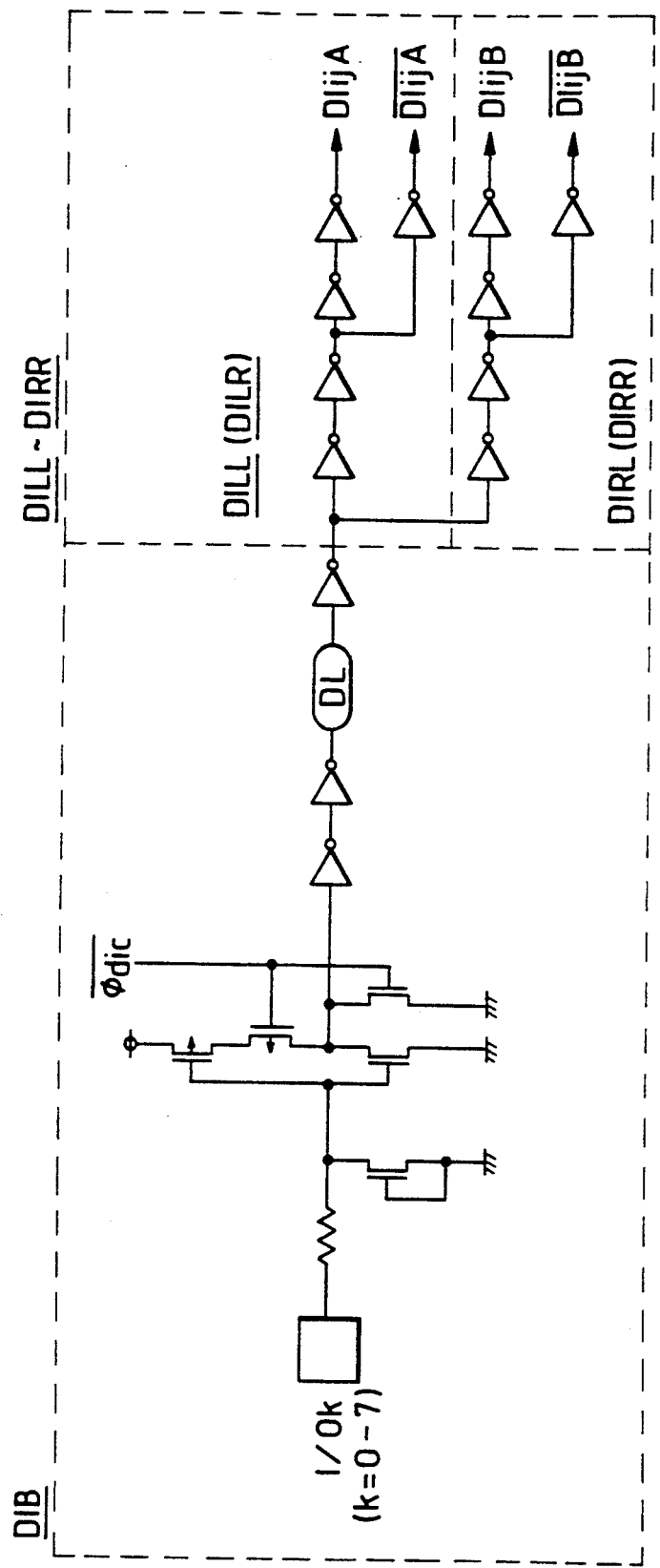

As shown in FIG. 29, the unit circuits of the data input-output buffer DIB accept write data applied to the data input-output terminals IO0 to IO7, respectively, according to an inverted timing signal $\overline{\phi}dic$ which goes LOW when the write system of the pseudostatic RAM is in the operating cycle, and transfer the write data to the corresponding unit circuits of the corresponding write circuits DILL and DIRL, or DILR or DIRR.

(2) Write Circuits and Write Selection Circuit

Figure 30:
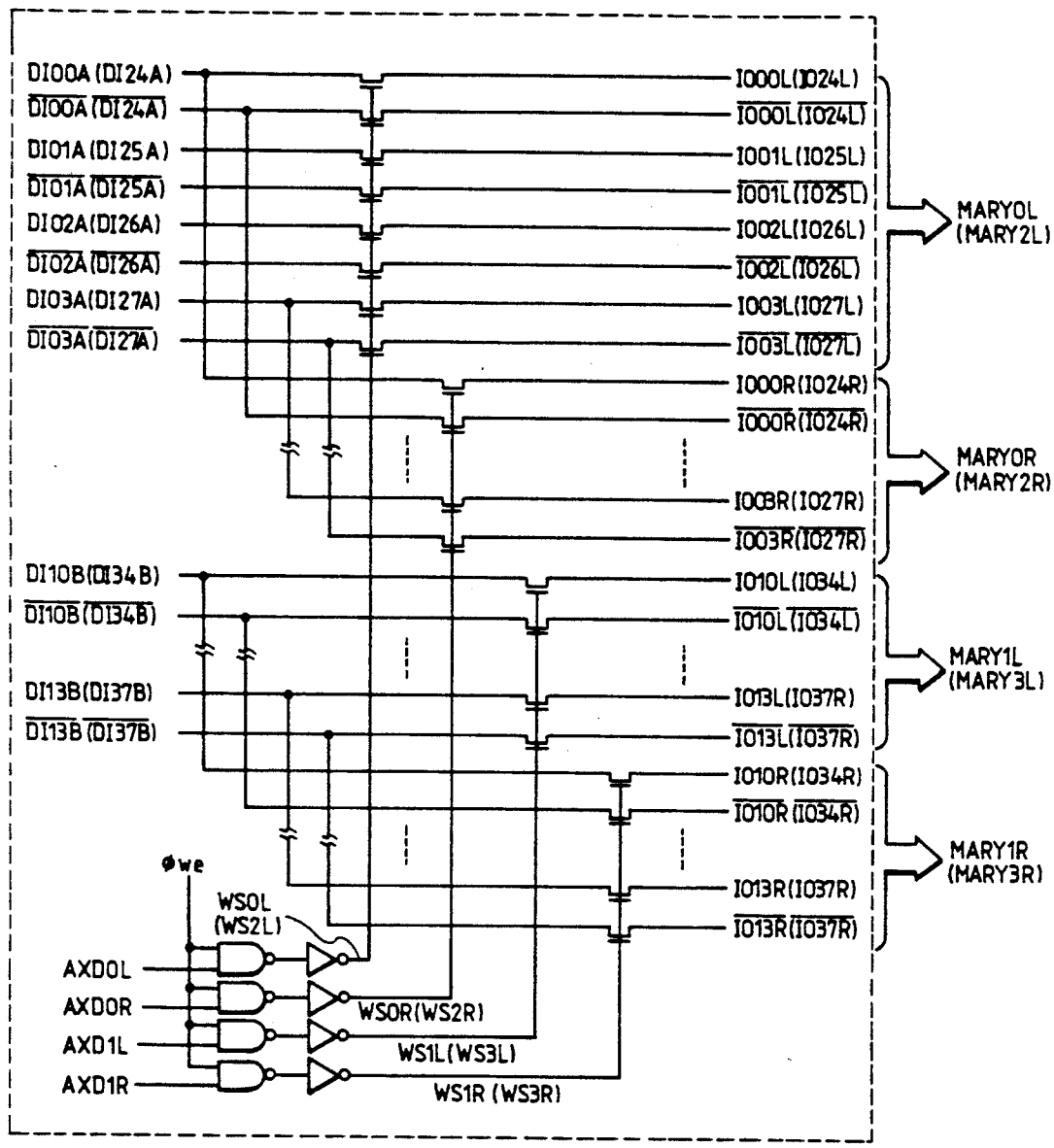

Referring to FIG. 29, the write circuit DILL has four common unit circuits corresponding to the common I/O lines of the two memory arrays MARY0L and MARY0R, respectively. These unit circuits produce complementary write signals DIijA, i.e., DI00A to DI03A, on the basis of the write signals transferred thereto from the first to fourth unit circuits of the data input buffer DIB. As shown in FIG. 30, these complementary write signals are selected by write selection circuit WS when the corresponding write selection signal WS0L or WS0R goes HIGH, and the selected complementary write signals are transferred to the four sets of common I/O lines of the memory array MARY0L or MARY0R.

Similarly, the write circuit DIRL has four common unit circuits corresponding to the common I/O lines of the memory arrays MARY1L and MARY1R. These unit circuits produce complementary write signals DI10B to DI13B, respectively, on the basis of the first to fourth unit circuits of the data input buffer DIB. These complementary write signals are transferred selectively to the four sets of common I/O lines of the memory array MARY0L or MARY0R when the corresponding write selection signal WS1L or WS1R goes HIGH.

The write circuit DILR has four common unit circuits corresponding to the common I/O lines of the memory array MARY2L and MARY2R. These unit circuits produce complementary write signals $\overline{DI24A}$ to $\overline{DI27A}$, respectively, on the basis of write signals transferred thereto from the fifth to eighth unit circuits of the data input buffer DIB. These complementary write signals are transferred selectively to the four sets of common I/O lines of the memory array MARY2L or MARY2R when the corresponding write selection signal WS2L or WS2R goes HIGH.

Similarly, the write circuit DIRR has four common unit circuits corresponding to the common I/O lines of the memory array MARY3L and MARY3R. These unit circuits produce complementary write signals $\overline{DI34B}$ to $\overline{DI37B}$, respectively, on the basis of write signals transferred thereto from the fifth to eighth unit circuits of the data input buffer DIB. These complementary write signals are transferred selectively to the four sets of common I/O lines of the memory array MARY3L or MARY3R when the corresponding write selection signal WS3L or WS3R goes HIGH.

(3) Main Amplifiers

Figure 27:
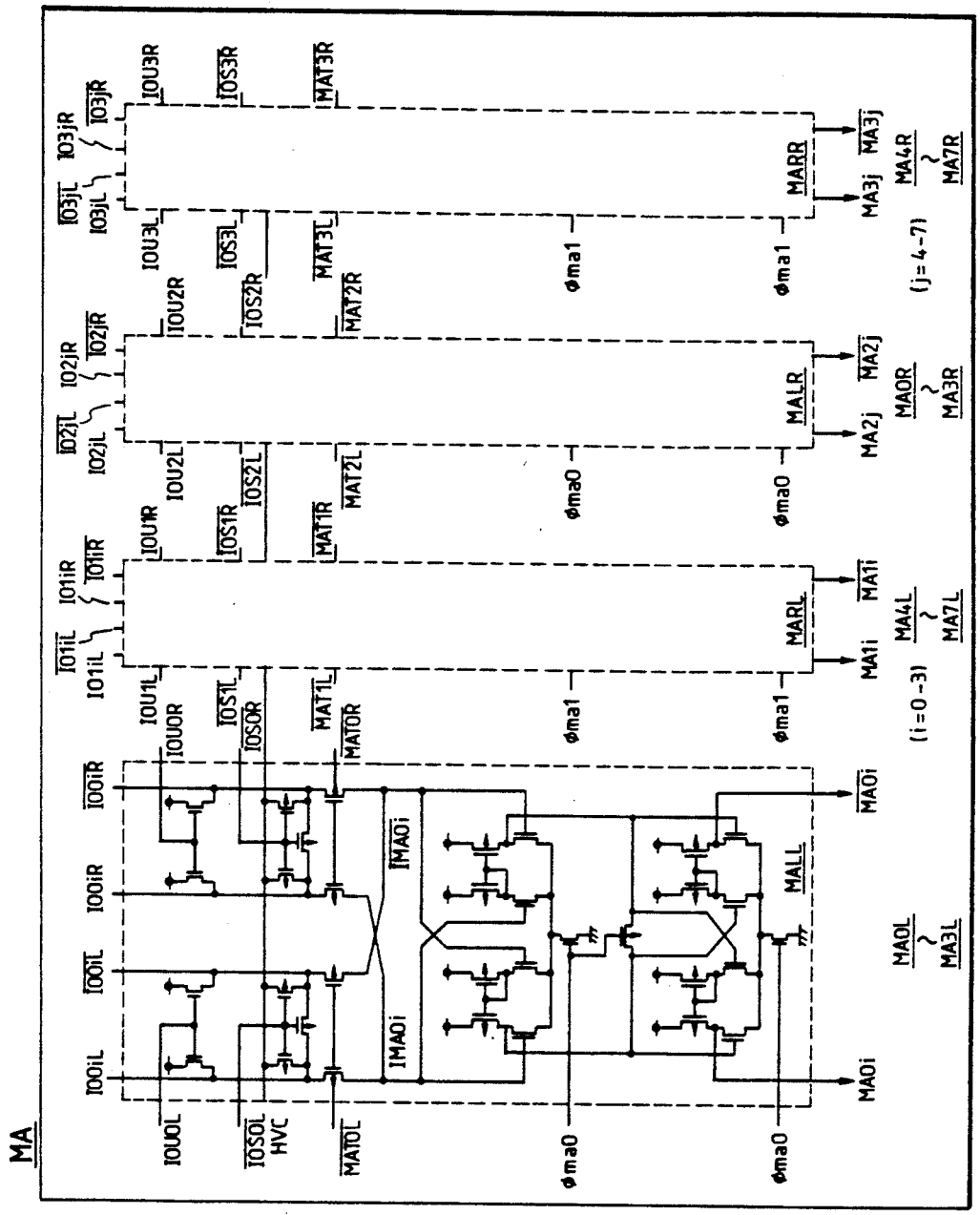

As shown by way of example in FIG. 27, the main amplifier MALL has four unit circuits respectively corresponding to the common I/O lines of the memory arrays MARY0L and MARY0R. Each of these unit circuits has two sets of input terminals and one set of output terminals. The input terminals each being one of the paired input terminals of each unit circuit are connected to the corresponding common I/O lines IO01L, i.e., IO00L to IO03L, of the memory array MARY0L, and the rest of the input terminals of each unit circuit are connected to the common I/O lines IO0iR, i.e., IO00R to IO03R, of the memory array MARY0R. These input terminals are connected selectively to the complementary internal nodes IMA0I, i.e., IMA00 to IMA03, of the corresponding unit circuit when the corresponding inverted array selection signal MAT0L or MAT0R goes LOW. The output terminals of the unit circuits of the main amplifier MALL are connected to the input terminals of the first to fourth unit circuits of the data buffer DOB through an output selection circuit OSL. The main amplifier MALL includes two pairs of static amplifying circuits provided substantially in series between the complementary internal nodes IMA0i and the output terminals thereof. The main amplifier MALL is set in the active state selectively according to a corresponding timing signal $\phi$ma0. Similarly, the main amplifier MARL has four unit circuits corresponding to the common I/O lines of the memory arrays MARY1L and MARY1R. The four pairs of input terminals of these unit circuits are connected to the corresponding I/O lines 10liL or IOliR of the memory array MARY1L or MARY1R, and the output terminals thereof are connected in common to the input terminals of the first to fourth unit circuits of the data buffer DOB through the output selection circuit OSL. The main amplifier MARL is set in the active state selectively according to a corresponding timing signal $\phi$ma1.

On the other hand, the main amplifier MALR has four unit circuits corresponding to the common I/O lines of the memory arrays MARY2L and MARY2R. The four pairs of input terminals of these unit circuits are connected to the corresponding common I/O lines IO2jL, i.e., IO24L to IO27L, or IO2jR, i.e., IO24R to IO27R, of the memory array MARY2L or MARY2R, and the output terminals thereof are connected respectively to the input terminals of the fifth to eighth unit circuits of the data buffer DOB through the output selection circuit OSL. The main amplifier MARL is set in the active state according to the corresponding timing signal $\phi$mao.

Similarly, the main amplifier MARR has four unit circuits respectively corresponding to the common I/O lines of the memory arrays MARY3L and MARY3R. The four pairs of input terminals of these unit circuits are connected respectively to the corresponding common I/O lines IO3jL or IO3jR of the memory array MARY 3L or MARY3R, and the output terminals thereof are connected in common to the input terminals of the fifth to eighth unit circuits of the output buffer DOB, respectively, through the output selection circuit OSL. The main amplifier MARL is set in the active state according to the corresponding timing signal $\phi$mao.

The configuration and features of the main amplifiers of the pseudostatic RAM will be described hereinafter particularly with reference to the main amplifier MALL.

The unit circuits of the main amplifier have each three equalizing MOSFETs provided between the noninverted and inverted signal lines of the corresponding two sets of common I/O lines IO01L and IO01R. These equalizing MOSFETS, illustrated as being P-channel conductivity type, for example, are set selectively in the ON state when the corresponding internal control signal IOS0L or IOS0R goes Low to set the noninverted and inverted signal lines of the corresponding common I/O lines on the half precharge level HVC.

Figure 47:
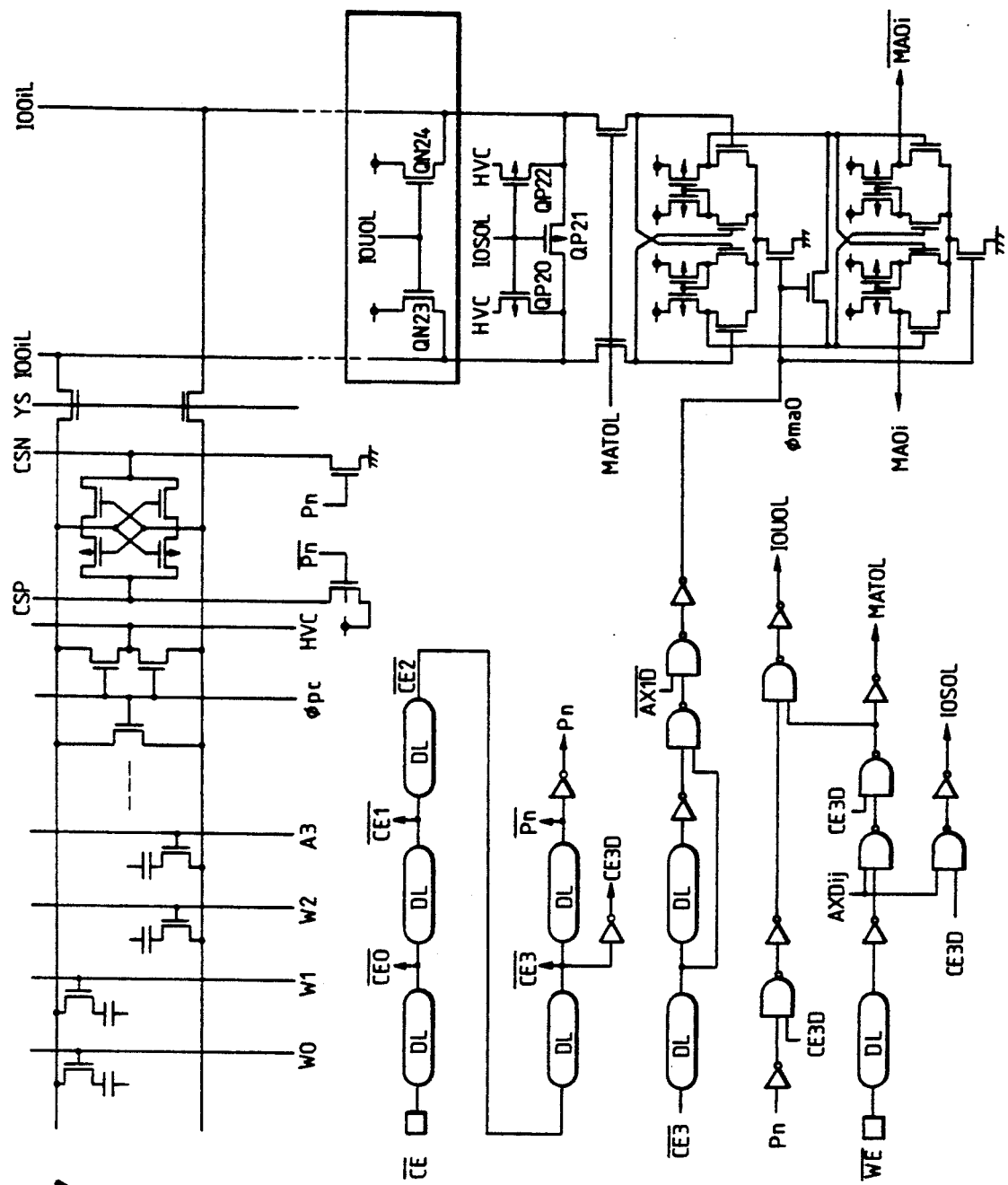

The unit circuits of the main amplifier each have a pair of preset MOSFETs QN23 and QN24 provided between the supply voltage of the circuit and the noninverted signal lines I00i and inverted signal lines $\overline{IO0iL}$ of the common I/O lines I00i as shown in FIG. 47. These preset MOSFETs are set in the On state selectively when the corresponding internal control signal IOU0L and the like go HIGH to preset the noninverted and inverted signal lines of the corresponding common I/O lines at a voltage level lower than the supply voltage by the threshold voltage thereof. Consequently, the dc level of the noninverted and inverted signal lines of the common I/O lines are set at a predetermined bias voltage which increases the sensitivity of the static amplifying circuit to the maximum.

Figure 48:
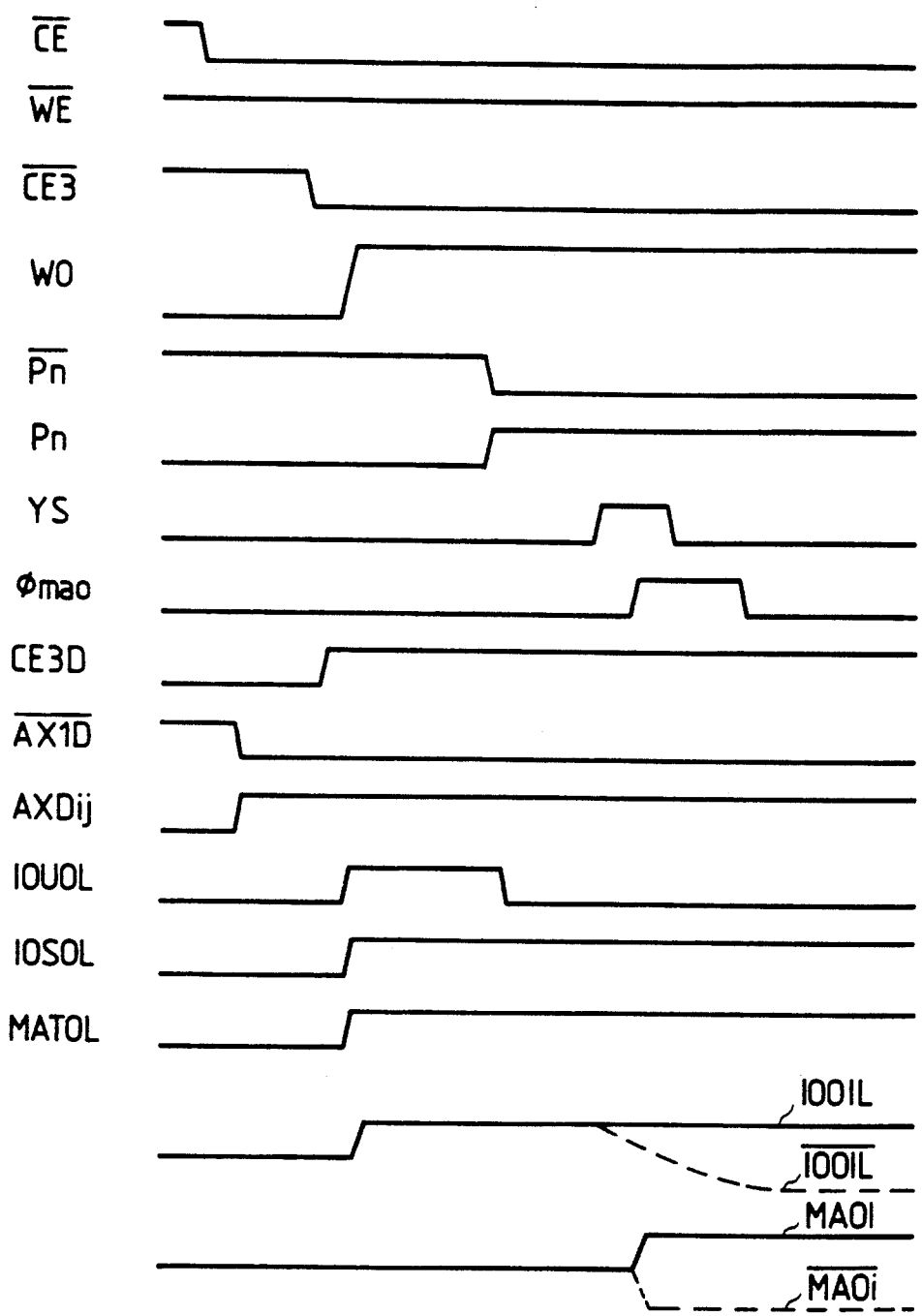

Incidentally, in this pseudostatic RAM, the internal control signals IOU0L and the like go HIGH temporarily immediately before the main amplifier is set in the active state, namely, immediately before the timing signals $\phi$mao and the like are changed from LOW to HIGH to set the preset MOSFETs QN23 and QN24 temporarily in the ON state as shown in FIG. 48. Accordingly, the power consumption of the main amplifier of this pseudostatic RAM is smaller than that of the main amplifier of the conventional dynamic RAM in which the preset MOSFETs are kept continuously in the ON state while the main amplifier is in the active state.

(4) Output Selection Circuit

Referring to FIG. 32, the output selection circuit OSL selects 4-bit read data provided by the main amplifiers MALL, MARL, MALR and MARR according to the timing signals $\phi$ma0 and $\phi$ma1, and then transfers the read data selectively to the corresponding unit circuits of the data output buffer DOB.

When the timing signal $\phi$ma0 goes HIGH, the output selection circuit OSL transfers the read data provided by the unit circuits of the main amplifier MALL respectively to the first to fourth unit circuits DO0 to DO3 of the data output buffer DOB, and transfers the read data provided by the unit circuits of the main amplifier MALR respectively to the fifth to eighth unit circuits DO4 to DO7 of the data output buffer DOB. When the timing signal $\phi$mal goes HIGH, the output selection circuit OSL transfers the read data provided by the unit circuits of the main amplifier MARL respectively to the first to fourth unit circuits DO0 to DO3 of the of the data output buffer DOB, and transfers the read data provided by the unit circuits of the main amplifier MARR respectively to the fifth to eighth unit circuits DO4 to DO7 of the data output buffer DOB.

(5) Data Output Buffer

Figure 31:
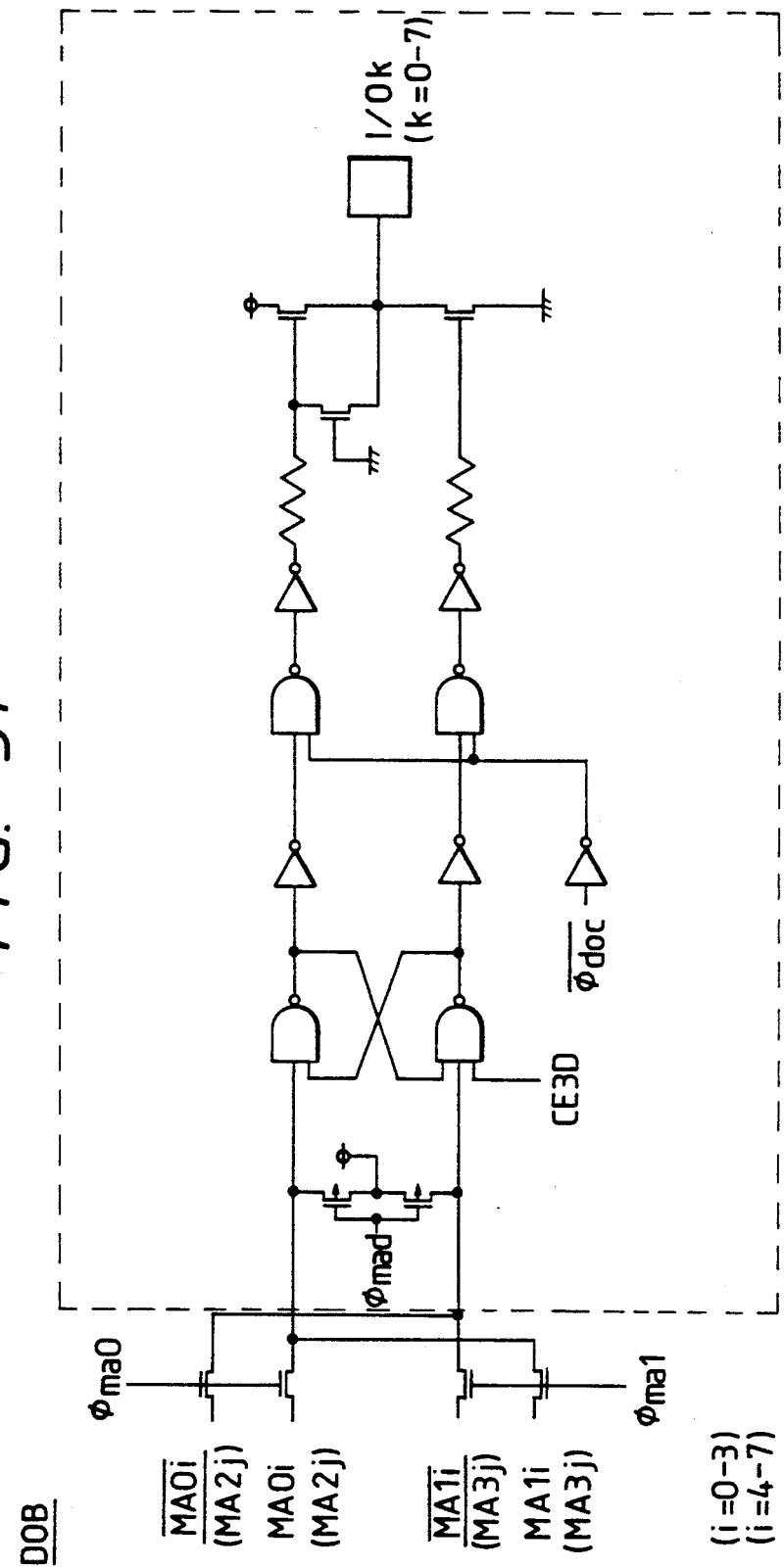

The data output buffer DOB has eight unit circuits DO0 to DO7 corresponding to the data input-output terminals IO0 to IO7. As shown in FIG. 31 by way of example, these unit circuits have each a latch circuit comprising a pair of NAND gate circuits having input and output terminals connected in cross connection, a pair of precharge MOSFETs provided respectively between the noninverted and inverted input terminals of the latch circuit and a supply voltage or its equivalent, a pair of CMOS NAND gate circuits which transfer the inverted signal of the complementary output signal of the latch circuit selectively according to an inverted timing signal $\overline{\phi doc}$ for output control, and a pair of series-connected n-channel output MOSFETs effecting a pull-up/pull-down arrangement which receives the inverted signal of the output signal of the NAND gate circuits. The pair of precharge MOSFETs are set selectively in the ON state according to a timing signal $\phi$mad (second timing signal). The complementary internal output signal of the corresponding main amplifier, i.e., the read data, is transferred through two pairs of MOSFETs (switch means) which are set selectively in the ON state according to the timing signal $\phi$ma0 or $\phi$mal (first timing signal) to the complementary input terminal of the latch circuit. The common nodes of the pair of output MOSFETS are connected respectively to the corresponding data input-output terminals IO0 to IO7.

The unit circuits of the data output buffer DOB are set substantially in the active state when the inverted timing signal $\overline{\phi doc}$ goes LOW to send out the read data transferred from the corresponding main amplifiers through the output selection circuit OSL from the corresponding data input-output terminals IO0 to IO7. When the inverted timing signal $\overline{\phi doc}$ goes HIGH, the outputs of the unit circuits of the data output buffer are set in the high-impedance state.

Figure 49C:
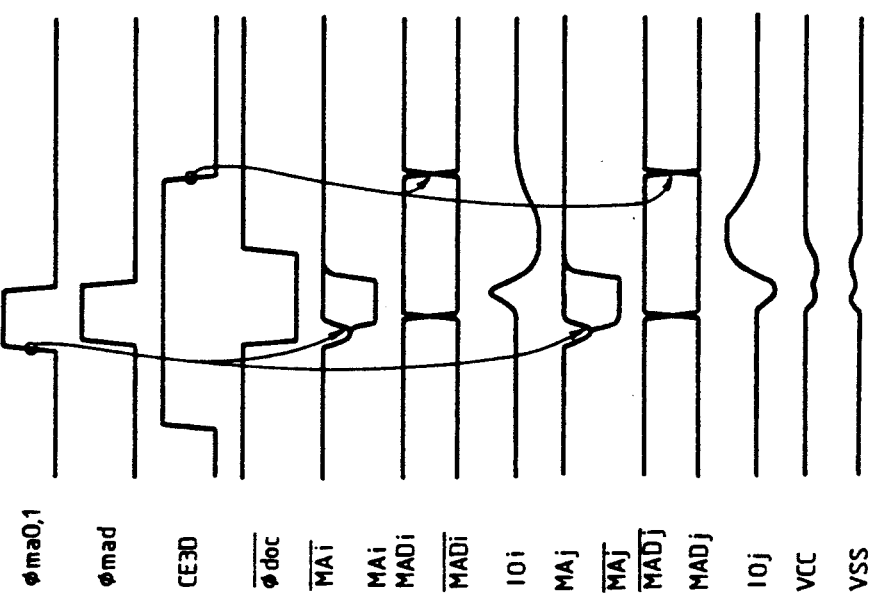
Figure 49A:
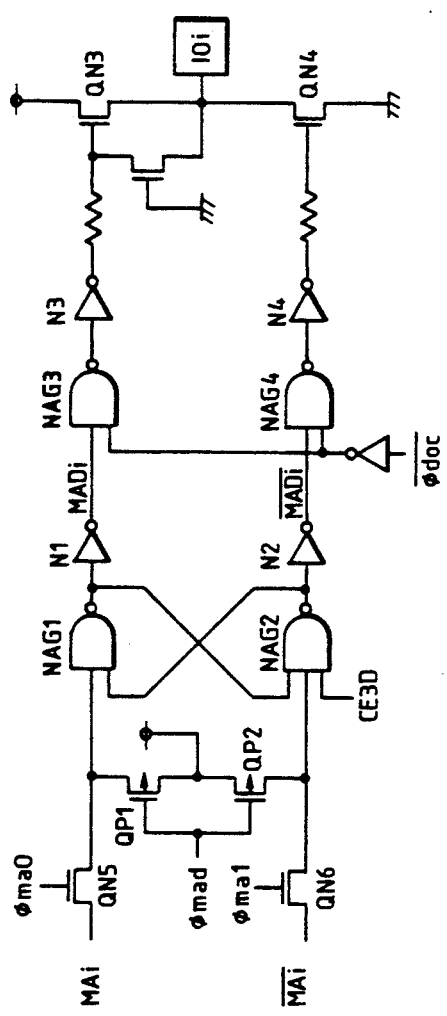
Figure 49B:
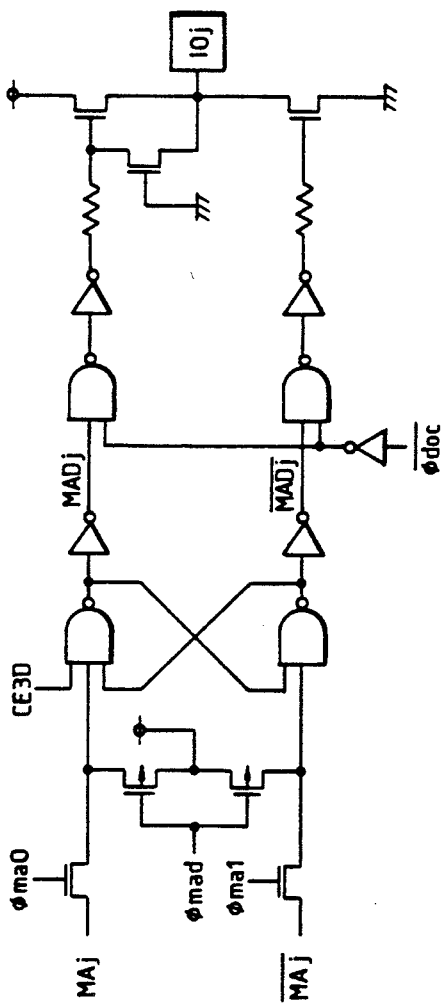

Incidentally, as shown in FIGS. 49(a) and 49(b), the output MOSFETs of the data output buffer DOB of the pseudostatic RAM are a pair of n-channel MOSFETs QN3 and QN4 provided in series between the supply voltage of the circuit and the ground potential of the circuit. Accordingly, the voltage across the gate and source of the output MOSFET QN3 decreases and the output operation of the output MOSFET QN3 is delayed accordingly when the corresponding unit circuit provides read data of a HIGH level.

In order to improve the output operation of the output MOSFET QN3, a timing signal CE3D (third timing signal) is applied to the third input terminal of the NAND gate circuit NAG2 (second CMOS logic gate circuit) of the latch circuit as shown in FIG. 49(a) to preset the latch circuit. As shown in FIG. 49(c), the timing signal CE3D, which normally is LOW, is changed temporarily from LOW to HIGH for a period including a period in which the inverted timing signal $\overline{\phi doc}$ is LOW when the pseudostatic RAM is set in the selected state. Accordingly, when the pseudostatic RAM is in the nonselected state and the timing signal CE3D is LOW, the latch circuit is preset at logic "1", i.e., in the HIGH output state, to change the timing signal CE3D from LOW to HIGH, and hence the latch circuit is set in the latch state according to the read data. Consequently, the data output buffer DOB is set temporarily in the HIGH output state at the start of the output operation regardless of the read data and, subsequently, the data output buffer DOB executes the output operation according to the output data. Thus, the speed of the HIGH output operation of the data output buffer DOB is enhanced accordingly.

1.2.5 Timing Signal Generating Circuit

Although there is no particular restriction, the timing signal generating circuit TG comprises a $\overline{CE}$-system timing signal generating circuit CE, a $\overline{WE}$-system timing signal generating circuit WE, an $\overline{OE}$-system timing signal generating circuit OE, word line clearing circuit WC, and a precharge control circuit PC. The $\overline{OE}$-system timing generating circuit OE functions also as a $\overline{RFSH}$-system timing signal generating circuit, namely, a timing signal generating circuit for refresh control. The configuration and features of the component circuits of the timing signal generating circuit TG of the pseudostatic RAM will be described hereinafter.

(1) $\overline{CE}$-System Timing Signal Generating circuit

Figure 12:
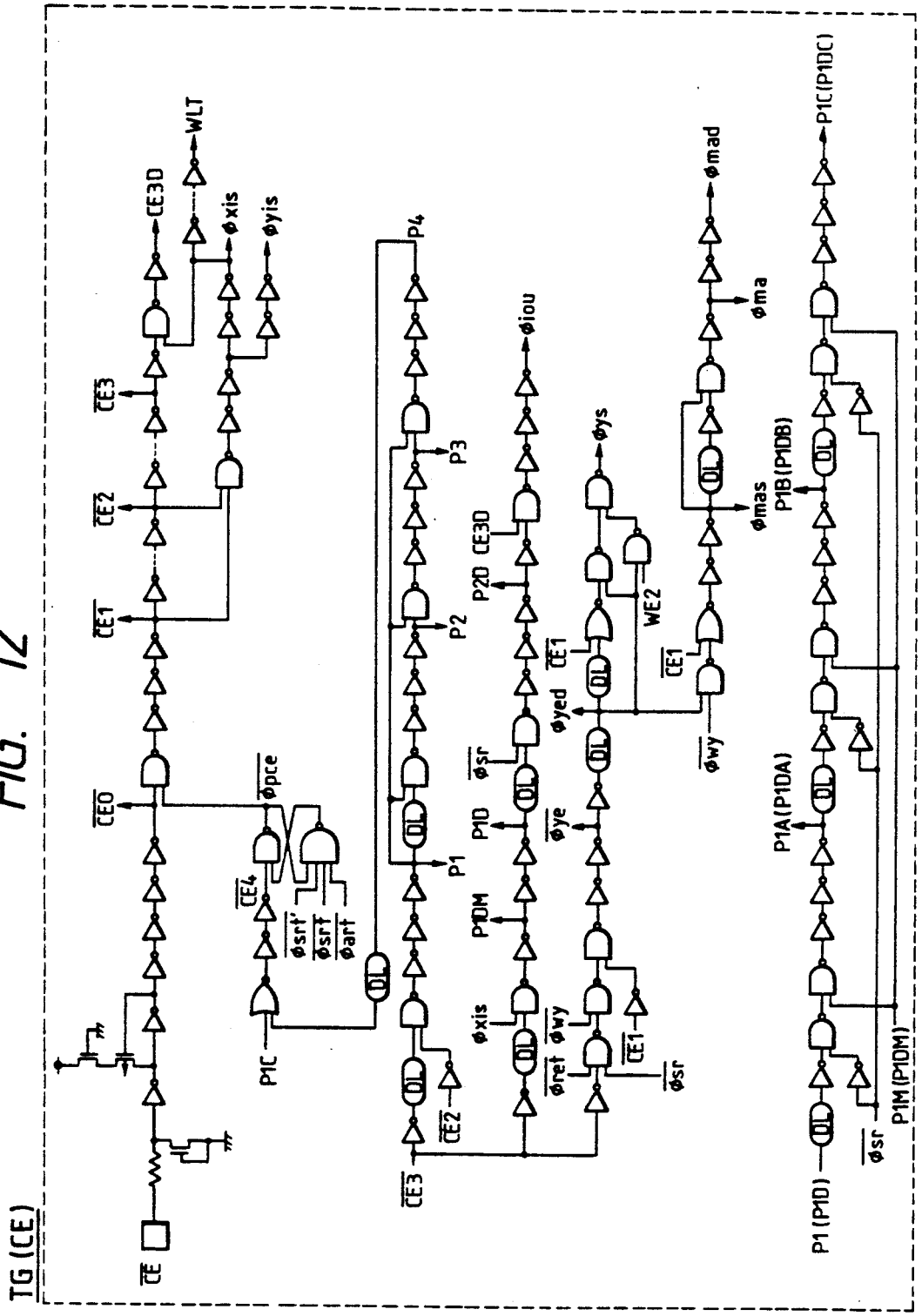
FIGS. 12 to 38 are circuit diagrams respectively showing the specific configurations corresponding to the pseudostatic RAM.

Referring to FIG. 12, the $\overline{CE}$-system timing signal generating circuit CE has an input circuit connected to a pad $\overline{CE}$ to which the chip enable signal $\overline{CE}$ is applied. The chip enable signal $\overline{CE}$ applied to the input circuit is applied as an inverted timing signal $\overline{CEO}$ to one of the input terminals of a 2-input NAND gate circuit. An inverted timing signal $\overline{\phi pce}$ is applied to the other input terminal of the 2-input NAND gate circuit. The output signal of the 2-input NAND gate circuit is used by a predetermined number of logic gate circuits to produce a plurality of inverted timing signals CE1, CE2 and CE3 sequentially.

The inverted timing signal $\overline{\phi pce}$ goes LOW selectively when any one of inverted timing signals $\overline{\phi srf}$, $\overline{\phi srf}$ and $\phi arf$ goes LOW. The inverted timing signal $\overline{\phi pce}$ changes from LOW to HIGH when an inverted timing signal $\overline{CE4}$ goes LOW. As will be described afterward, the inverted timing signal $\overline{\phi srf}$ goes LOW temporarily at the beginning of the self-refresh mode of the pseudostatic RAM, and the inverted timing signal $\overline{\phi srf}$ goes LOW temporarily at every passage of a predetermined refresh period after the pseudostatic RAM has been set in the self-refresh mode. The inverted timing signal $\phi arf$ goes LOW temporarily at the beginning of the autorefresh mode of the pseudostatic RAM. Thus, the pseudostatic RAM is set in the selected state when the chip enable signal $\overline{CE}$ goes LOW or the pseudostatic RAM starts a series of operations under the control of the inverted timing signal $\overline{CE1}$ to $\overline{CE3}$ at the beginning of the autorefresh mode or the self-refresh mode and every passage of the predetermined refresh period after the pseudostatic RAM has been set in the self-refresh mode.

The inverted timing signals $\overline{CE1}$ and $\overline{CE2}$ are applied to a negative OR circuit comprising a 2-input NAND gate and a predetermined number of inverter circuits to produce timing signals φxls and φyls for accepting the X-address signal and the Y-address signal. On the other hand, the inverted timing signal $\overline{CE2}$ is applied to one of the input terminals of a 2-input NAND gate circuit after inversion; the inverted and delayed inverted timing signal $\overline{CE3}$ is applied to the other input terminal of the 2-input NAND gate circuit; the output signal of this 2-input NAND gate circuit is applied to a circuit comprising a predetermined number of logic gate circuits to produce the plurality of timing signals P1, P2, P3 and P4 for controlling the sense amplifiers of the pseudostatic RAM. These timing signals go HIGH sequentially a predetermined period after both the inverted timing signals $\overline{CE2}$ and $\overline{CE3}$ are changed from HIGH to LOW, and these timing signals are changed sequentially from HIGH to LOW when the inverted timing signal $\overline{CE2}$ is changed from LOW to HIGH.

On the other hand, the inverted timing signal $\overline{CE3}$ is combined with the timing signal φxls after inversion, and is applied to a circuit comprising a predetermined number of logic gate circuits to produce the timing signals P1D and P2D for controlling the sense amplifiers of the pseudostatic RAM sequentially and, when the inverted timing signals $\overline{\phi sr}$ and $\overline{\phi ref}$ are LOW, namely, when the pseudostatic RAM is not in the refresh mode, to produce the inverted timing signal $\overline{\phi ye}$ and the timing signal φys for activating the data input-output circuit.

Furthermore, the timing signal P1 is applied to a circuit comprising a predetermined number of logic gate circuits to produce timing signals P1A to P1C sequentially when the inverted timing signal $\overline{\phi sr}$ is HIGH, namely, when the pseudostatic RAM is in the self-refresh mode.

As stated above, these timing signals P1 to P4, P1D, P2D and P1A to P1C are applied to the sense amplifier driving circuits SP and SN to produce a timing signal for setting a plurality of sense amplifier driving MOSFETs in the ON state under predetermined conditions.

(2) $\overline{WE}$-system Timing Signal Generating circuit

Figure 13:
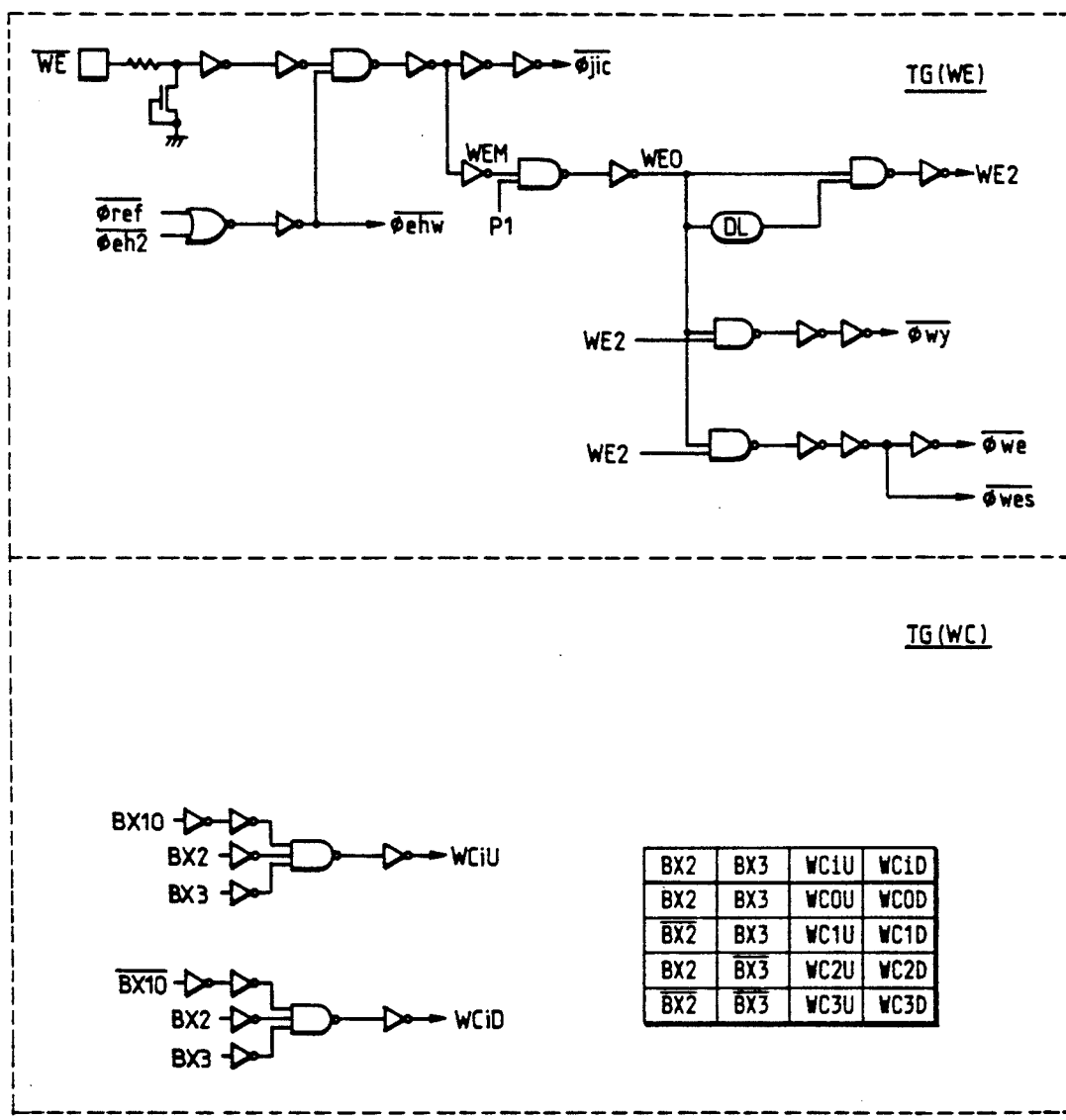

Referring to FIG. 13, the $\overline{WE}$-system timing signal generating circuit has an input circuit connected to a pad WE to which the write enable signal $\overline{WE}$ is applied. The write enable signal WE applied to the input circuit is subjected to a negative OR operation in combination with an inverted timing signal $\overline{\phi ehw}$ to produce an inverted timing signal $\overline{\phi dic}$. The result of the negative OR operation is subjected to an AND operation in combination with the timing signal P1 to produce write control timing signals WE0 and WE2, and inverted timing signals $\overline{\phi wy}$, $\overline{\phi we}$ and $\overline{\phi wes}$. The inverted timing signal $\overline{\phi ehw}$ goes LOW selectively when both the inverted timing signals $\overline{\phi ref}$ and $\overline{\phi eh2}$ go LOW, namely, when the pseudostatic RAM is in the refresh mode and the predetermined high voltage is applied to the pad $\overline{WE}$ to set the pseudostatic RAM in the RCC test mode.

Thus, the inverted timing signal $\overline{\phi dic}$ goes LOW and the corresponding unit circuits of the data input buffer DIB accept 8-bit write data applied to the data input-output terminals IO0 to IO7 when the write enable signal $\overline{WE}$ is changed from HIGH to LOW to set the write system of the pseudostatic RAM in the operating mode or to set the pseudostatic RAM in the RCC test mode. The write data are transferred through the corresponding write circuits and are written simultaneously in the selected eight memory cells when the inverted timing signal $\overline{\phi we}$ goes LOW.

(3) $\overline{OE}$-System Timing Signal Generating Circuit

Although there is no particular restriction, the $\overline{OE}$-system timing signal generating circuit OE has, as shown in FIG. 14, an input circuit connected to a pad to which the output enable signal $\overline{OE}$, i.e., the refresh control signal $\overline{RFSH}$, is applied. A timing signal OE0 produced from the output enable signal $\overline{OE}$ applied to the input circuit is combined with the timing signal P2D to produce the inverted timing signal $\overline{\phi doc}$ for output control. The inverted timing signal $\overline{\phi doc}$ is applied to the data output buffer DOB to control the output of read data.

On the other hand, the timing signal OE0 is transferred through the latch circuit to change an inverted timing signal $\overline{RF0}$ from HIGH to LOW when an inverted timing signal $\overline{CE0}$ is HIGH, namely, when a chip enable signal $\overline{CE}$ is HIGH. The inverted timing signal $\overline{RF0}$ is transferred through a predetermined delay circuit, so that a timing signal RF1 goes HIGH, and then, with a slight delay, an inverted timing signal $\overline{RF2}$ goes LOW.

The timing signal RF1 and the inverted timing signal $\overline{RF2}$ are combined with the inverted timing signal $\overline{CE0}$ to produce an inverted timing signal $\overline{\phi arf}$. The inverted timing signal $\overline{\phi arf}$ goes LOW temporarily when the output enable signal $\overline{OE}$, i.e., the refresh control signal $\overline{RFSH}$, goes LOW while the chip enable signal $\overline{CE}$ is HIGH, namely, at the beginning of setting the pseudostatic RAM in the autorefresh mode.

In this pseudostatic RAM, an internal control signal ENB goes HIGH when the internal timing signal RF1 goes HIGH, and thereby the refresh timer circuit TMR is started. Thus, timing signals φtmr and φcl, and an inverted timing signal $\overline{\phi cl}$ are generated at a predetermined period. The refresh timer counter circuit SRC counts the timing signal φcl. The output signal of the refresh timer counter SRC, i.e., an internal timing signal SCAT goes HIGH temporarily and repeatedly at a period a predetermined number of times that of the inverted timing signal $\overline{\phi cl}$.

On the other hand, the inverted timing signal $\overline{RF2}$ is transferred when both the inverted timing signals $\overline{CE1}$ and $\overline{CE3}$ are HIGH. An inverted timing signal $\overline{\phi sr}$ goes LOW when the inverted timing signal $\overline{\phi cl}$ goes LOW. That is, the inverted timing signal $\overline{\phi sr}$ goes LOW and serves as an internal control signal for assigning the self-refresh mode when the inverted timing signal $\overline{RF2}$, i.e., the output enable signal $\overline{OE}$, remains LOW continuously over a period exceeding the period of the inverted timing signal $\overline{\phi cl}$.

The inverted timing signal $\overline{\phi sr}$ is subjected to a negative OR operation in combination with the result of an AND operation of the combination of the inverted signal of the inverted timing signal $\overline{RF0}$, i.e., the noninverted timing signal RF0, and the inverted timing signal $\overline{RF2}$, and the result of the OR operation is transferred to a latch circuit which is gate-controlled according to the timing signal φxls. As stated above, the output signal of the latch circuit is the inverted timing signal $\overline{\phi ref}$ to make the X-address buffer XAB accept the refresh address signals $\overline{AR0}$ to $\overline{AR10}$; that is, the inverted timing signal $\overline{\phi ref}$ goes LOW when the timing signal φxls goes HIGH to set the pseudostatic RAM in the autorefresh mode or the self-refresh mode.

The inverted timing signal $\overline{\phi sr}$ is applied also to a NAND gate circuit and a one-shot circuit comprising, in combination, an inverter circuit and a predetermined delay circuit DL to produce the inverted timing signal $\overline{\phi srf}$. Thus, the inverted timing signal $\overline{\phi srf}$ goes LOW temporarily when the inverted timing signal $\overline{\phi sr}$ goes LOW, namely, at the beginning of identification of the self-refresh mode of the pseudostatic RAM, which is one of the causes of making the inverted timing signal $\overline{\phi pce}$ go LOW.

On the other hand, a timing signal $\phi cl$ which is produced at a predetermined period by the refresh timer circuit TMR is subjected to an AND operation in combination with the output signal SCAT of the refresh timer counter circuit SRC. The result of the AND operation is transferred to provide the inverted timing signal $\overline{\phi srf}$ when the timing signal RF1 is HIGH, namely, when the refresh control signal $\overline{RFSH}$ is LOW. Furthermore, the result of the AND operation produces an internal control signal LOAD for presetting the refresh timer counter circuit SRC, and produces also an internal control signal FSET for setting the fuse circuit when the inverted timing signal $\overline{CEO}$ is HIGH. The inverted timing signal $\overline{\phi srf}$, similarly to the inverted timing signal $\overline{\phi srf'}$, is one of the causes of making the inverted timing signal $\overline{\phi pce}$ go LOW.

Figure 53A:
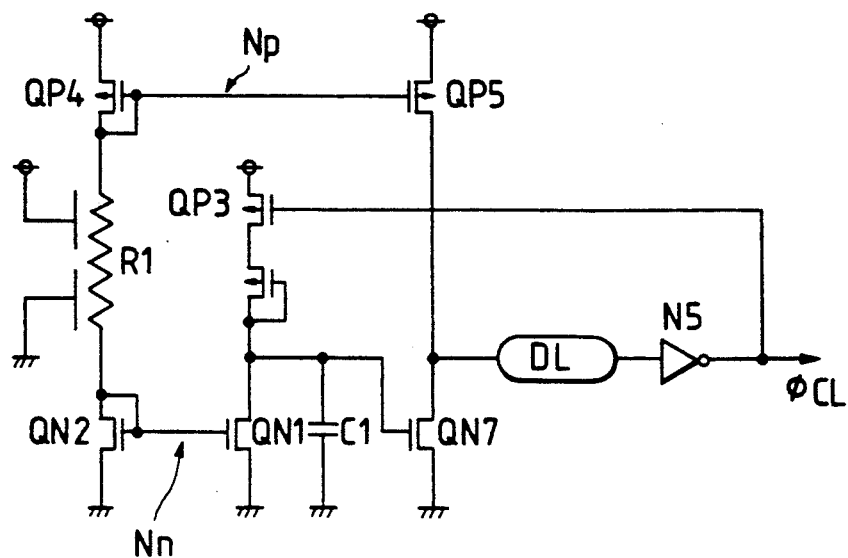

(4) Refresh Timer Circuit Referring to FIG. 15, the refresh timer circuit TMR has seven inverter circuits connected substantially in series, and a capacitor C1. As shown in FIG. 53(a), the four inverter circuits among those seven inverter circuits function as a single delay circuit DL. The inverted signal of the output signal of the delay circuit DL is applied to the gate of a p-channel MOSFET QP3 included in the top inverter circuit to constitute a single ring oscillator. The capacitor C1 is charged when the MOSFET QP3 is in the ON state, and is discharged through an n-channel MOSFET QN1 (first MOSFET) when the MOSFET QP3 is in the OFF state. The discharge current that flows through the MOSFET QN1 is set by a constant-current source including an n-channel MOSFET QN2 (second MOSFET) which is in a current-mirror relation with the MOSFET QN1.

The charge potential of the capacitor C1 is monitored by the last inverter circuit including an n-channel MOSFET QN7. This inverter circuit functions as a so-called level decision circuit. Since a p-channel MOSFET QP5 constituting the level decision circuit in combination with the MOSFET QN7 is in a current-mirror relation with a p-channel MOSFET QP4 included in the constant-current source, the logical threshold level of this inverter circuit is approximately equal to the threshold voltage $V_{THN}$ of the MOSFET QN7. Accordingly, the MOSFET QN7 is turned on when the charge potential of the capacitor C1 is higher than the logical threshold level, and is turned off when the charge potential of the capacitor C1 is lower than the logical-threshold level. Consequently, the seven inverter circuits functions as a single ring oscillator, and the oscillation frequency of the ring oscillator is dependent on the discharge current that flows through the MOSFET QN1.

Figure 53B:
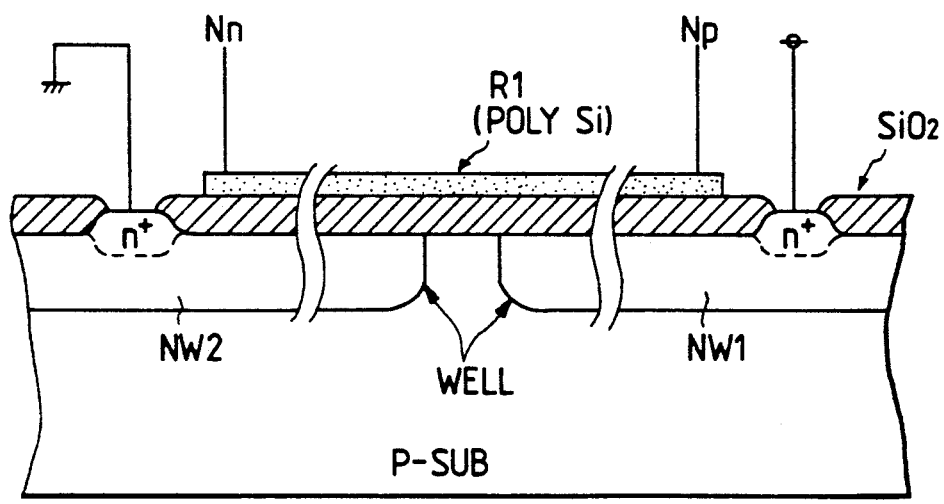

The constant-current source including the MOSFETs QP4 and QN2 further includes a resistor R1 provided between the MOSFETs QP4 and QN2. As shown in FIG. 53(b), the resistor R1 is a polycrystalline silicon film formed over an insulating layer formed of silicon dioxide ($SiO_2$) formed over the surface of a p-type semiconductor substrate. Since the resistor R1 must have a comparatively large value, the polycrystalline silicon film has a comparatively large length. Accordingly, a comparatively large substrate capacitance is coupled equivalently between the polycrystalline silicon film and the p-type semiconductor substrate, and hence the characteristics of the refresh timer circuit TMR are subject to the bumping (variation) of the power source.

To suppress the adverse influence of the bumping of the power source on the characteristics of the refresh timer circuit TMR, in the pseudostatic RAM, a first n-type well region NW1 to be connected to the supply voltage of the circuit (first supply voltage) is formed under a half portion of the polycrystalline silicon film serving as the resistor R1, and a second n-type well region NW2 to be connected to the ground potential of the circuit (second supply voltage) is formed under the other half portion of the polycrystalline silicon film as shown in FIG. 53(b). Since substrate capacitances of substantially the same electrostatic capacity are coupled equivalently between these well regions and the polycrystalline silicon film forming the resistor R1, the sharp variation of the supply voltage due to the bumping of the power source or the like is cancelled. Consequently, the characteristics of the refresh timer circuit TMR are stabilized, so that the refresh period of the pseudostatic RAM is stabilized.

On the other hand, the refresh timer circuit TMR having such a circuit configuration has another problem originating from the bumping of the power source. That is, as stated above, the capacitor C1 is charged to a potential of a predetermined high level based on the supply voltage of the circuit when the MOSFET QP3 is turned on, and the capacitor C1 is discharged through the MOSFET QN1 when the MOSFET QP3 is turned off. The discharge current that flows through the MOSFET QN1 in discharging the capacitor C1 is determined by the constant-current source on the basis of the supply voltage. Accordingly, when the bumping of the supply voltage occurs, for example, while the MOSFET QP3 is in the OFF state, only the reference voltage for setting the discharge current varies causing the variation of the characteristics of the refresh timer circuit TMR.

Figure 54A:
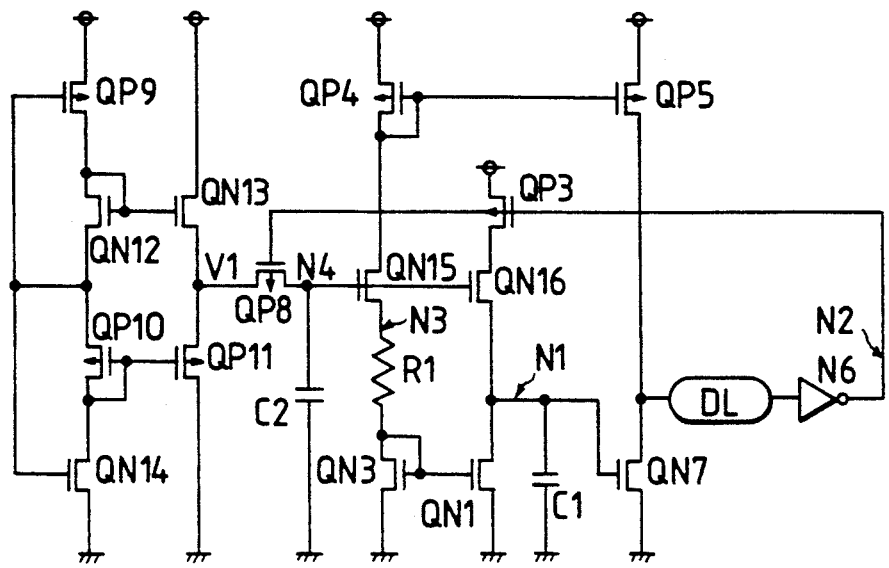
Figure 54B:
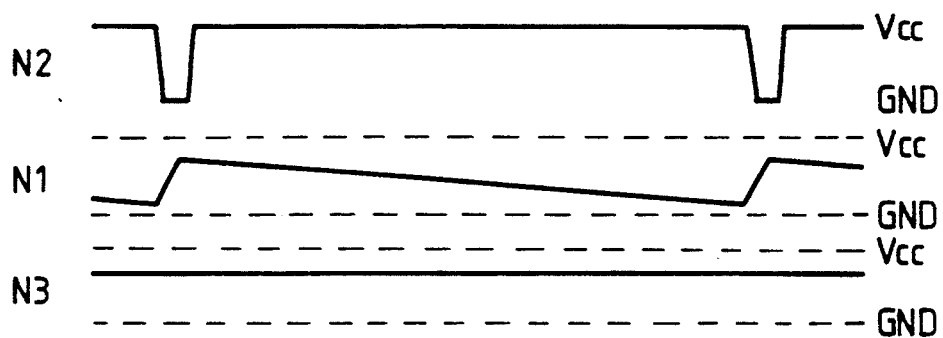

The variation of the characteristics of the refresh timer circuit TMR may be suppressed, for example, by providing an n-channel MOSFET QN15 (seventh MOSFET) between the resistor R1 and a MOSFET QP4 included in the constant-current source as shown in FIG. 54(a), and by setting the gate potential of the MOSFET QN15 by a capacitor C2 (second capacitor) which is set, similarly to the capacitor C1 (first capacitor) in the floating state when the MOSFET QP3 (fifth MOSFET) is set in the OFF state.

One of the electrodes of the capacitor C2, i.e., an internal node N4 (second internal node) is charged to the output voltage V1 of a constant-voltage source including p-channel MOSFETS QP9 to QP11, and n-channel MOSFETs QN12 to QN14. The charge potential of the internal node N4 is applied to the gate of the MOSFET QN15 as a reference potential for setting the discharge current, and is applied also to the gate of an n-channel MOSFET QN16 as a reference potential for setting the charge potential of the capacitor C1. The charge potential of the capacitor C2, together with the MOSFET QP3, is made floating when the MOSFET QP8 and the MOSFET QP3 are set simultaneously in the OFF state, and hence the characteristics of the refresh timer circuit TMR are not affected by the bumping of the power supply during this period. Consequently, the characteristics of the refresh timer circuit TMR are stabilized, so that the refresh period of the pseudostatic RAM is further stabilized.

(5) Refresh Timer Counter Circuit

Referring to FIG. 14, basically the refresh timer counter circuit SRC is an 8-bit binary counter comprising eight unit counter circuits SCNTR connected substantially in series connection. As shown by way of example in FIG. 16, each of the unit counter circuits SCNTR has two cross-connected CMOS inverter circuits, and includes a master latch and a slave latch connected in series substantially in a ring. Each unit counter circuit SCNTR has a fuse circuit, which is similar to that included in the X-system redundant circuit and the like, to set an initial count according to the internal control signal FSET. These unit counter circuits SCNTR act stepwise according to the output signal of the refresh timer circuit, i.e., the timing signal $\phi cl$ and a carry output signal SCAj−1 of the preceding unit counter to provide a carry output signal SCAj. The timing signal RF1 is applied as a start control signal for starting the refresh timer counter circuit SRC instead of the carry output signal of the preceding unit counter circuit to the unit counter circuit SCNTR for the head bit.

The output signal of the refresh timer counter circuit SRC, i.e,, the carry output signal SCAT of the last unit counter circuit SCNTR, is used in combination with the timing signal $\phi cl$ to produce the inverted timing signal $\overline{\phi srf}$ for starting the self-refresh cycle.

(6) Word Line Clear circuit

Referring to FIG. 13, the word line clear circuit WC produces selectively timing signals WC0U to WC3U or WC0D to WC3D for controlling word line clearing operation from the complementary internal address signals $\overline{BX2}$, BX3 and $\overline{BX10}$. Normally, these timing signals are $\overline{LOW}$. When the corresponding combination of the complementary address signals go LOW or HIGH, these timing signals go HIGH alternatively. Consequently, the word line clear MOSFETs between the ground potential of the circuit and all the word lines of each memory array are set selectively in the OFF state and the clear state of the corresponding word lines is cancelled.

(7) Precharge control Circuit

The precharge control circuit PC produces various control signals for precharging the components of the pseudostatic RAM on the basis of the inverted timing signals $\overline{CE1}$, $\overline{CE3}$ and $\overline{\phi sr}$. The precharge control circuit PC produces selectively inverted Y-decoder control signals $\overline{YDP0}$ to $\overline{YDP3}$ for selectively setting the Y-decoders in the active state by combining internal address signals AX0 and AX1.

1.2.6 Voltage Generating Circuits

The pseudostatic RAm has a plurality of voltage generating circuits HVC, VBB and BL, which generate different voltages on the basis of the supply voltage VCC, for example, +5 V, of the circuit.

(1) Voltage Generating Circuit HVC

Referring to FIG. 43, the voltage generating circuit HVC steps down the supply voltage VCC of the circuit to generate an internal voltage HVC, which is approximately half the supply voltage VCC. The internal voltage HVC is applied to the equalize circuits as a so-called half precharge potential.

The operation of the voltage generating circuit HVC is stopped selectively when an inverted internal control signal $\overline{ICT}$, which will be described afterward, goes LOW to reduce the standby current of the pseudostatic RAM.

Figure 55A:
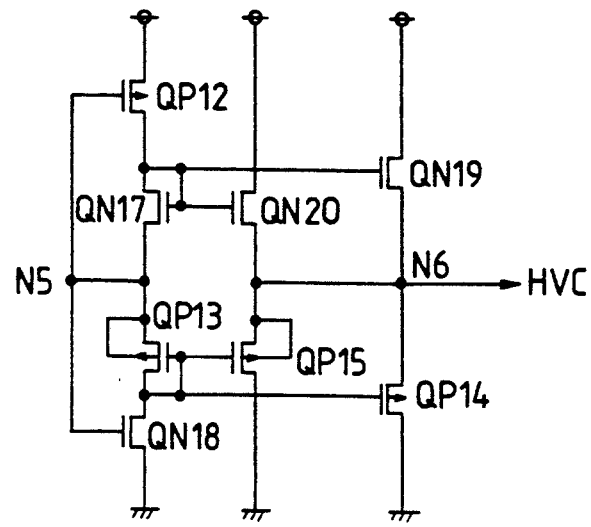
Figure 55B:
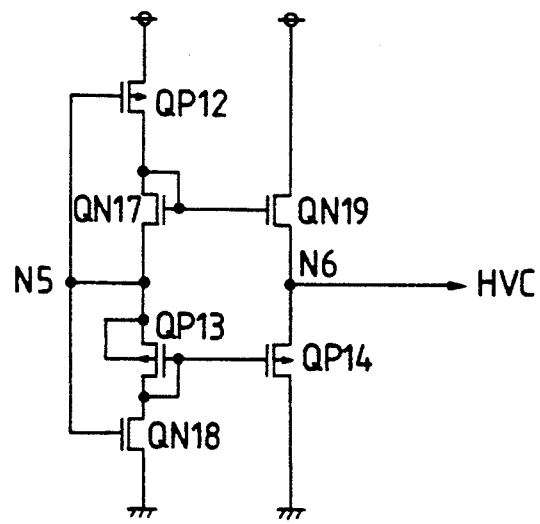

Incidentally, as shown in FIG. 55(b), the output potential, i.e., the internal voltage HVC, of the voltage generating circuit HVC is dependent on the conductance ratio between a P-channel (first conduction type) MOSFET QP12 (tenth MOSFET) and an n-channel (second conduction type) MOSFET QN18 (thirteenth MOSFET), which are provided substantially in series connection between the supply voltage of the circuit (first supply voltage) and the ground potential of the circuit (second supply voltage). The voltage generating circuit HVC has also an output n-channel MOSFET QN19 (fourteenth MOSFET), an output p-channel MOSFET QP14 (fifteenth MOSFET), an n-channel MOSFET QN17 (eleventh MOSFET) provided between an internal node N5 (third internal node) and the MOSFET QP12 in a mirror relation with the latter, and a p-channel MOSFET QP13 (twelfth MOSFET) provided between the internal node N5 and the MOSFET QN18 in a mirror relation with the latter to suppress the variation of the internal voltage HVC attributable to the variation of the output voltage. The respective conductances gm19 and gm14 of the output MOSFETs QN19 and QP14 must meet inequalities:

$$gm19 > gm17$$

$$gm14 > gm13$$

where gm17 and gm13 are the respective conductances of the MOSFETs QN17 and QP13. However, a comparatively large through current flows through the output MOSFETs QN19 and QP14 when the respective conductances of the output MOSFETs QN19 and QP14 are large. Therefore, the gate lengths of the output MOSFETs QN19 and QP14 are determined so that $$v_{THN}19 + v_{THP}14 > V_{THN}17 + V_{THP}13$$

where $v_{THN}19$, $v_{THP}14$, $V_{THN}17$ and $V_{THP}13$ are the respective threshold voltages of the output MOSFETs QN19 and QP14, and the corresponding MOSFETs 1N17 and QP13, to prevent the through current. However, the threshold voltages determined by the gate lengths are subject to the variation of the process, and hence such means is unable to prevent the through current perfectly. On the other hand, the prevention of the through current entails a problem that a dead zone appears in the internal voltage HVC to make the control of its level difficult.

Such a problem may be solved by connecting the well region of the MOSFET QP13 to the drain of the same as shown in FIG. 55(b). When the well region and the drain of the MOSFET QP13 are connected, the threshold voltage $V_{THP}13$ of the MOSFET QP13 is reduced by the substrate effect to readily meet an inequality:

$$V_{THP}14 > V_{THP}13$$

Accordingly, the threshold voltage is not affected by the variation of the process, and hence the foregoing inequality can easily be satisfied.

On the other hand, as regard the dead zone in the internal voltage HVC, it is possible to control the current that flows through the MOSFETs QN17 and QP13 by providing another set of an n-channel MOSFET 1N20 (sixteenth MOSFET) and a p-channel MOSFET QP15 (seventeenth MOSFET) respectively having comparatively small conductances in parallel connection with respect to the output MOSFETs QN19 and QP14 as shown in FIG. 55(a). That is, when those MOSFETs are provided additionally, I2/I1=(gm20+gm15)/(gm17+gm13) where I1 is a current that flows through the MOSFETs QN17 and QP13, I2 is a current that flows through the MOSFETs QN20 and QP15, and CJM20 and CJM15 are the respective conductances of the MOSFETs QN20 and QP15. Consequently, the current I1 that flows through the MOSFETs QN17 and QP13 can comparatively easily be controlled by setting the conductance ratio between those MOSFETS, and thereby the through current that flows through the output MOSFETs QN19 and QP14 can be suppressed without forming a dead zone in the internal voltage HVC.

(2) Voltage Generating Circuit VBB

The voltage generating circuit VBB generates, for example, a substrate back bias voltage VBB of a predetermined negative voltage from the supply voltage VCC of the circuit and applies the substrate back bias voltage VBB to the substrate of the pseudostatic RAM.

Figure 33:
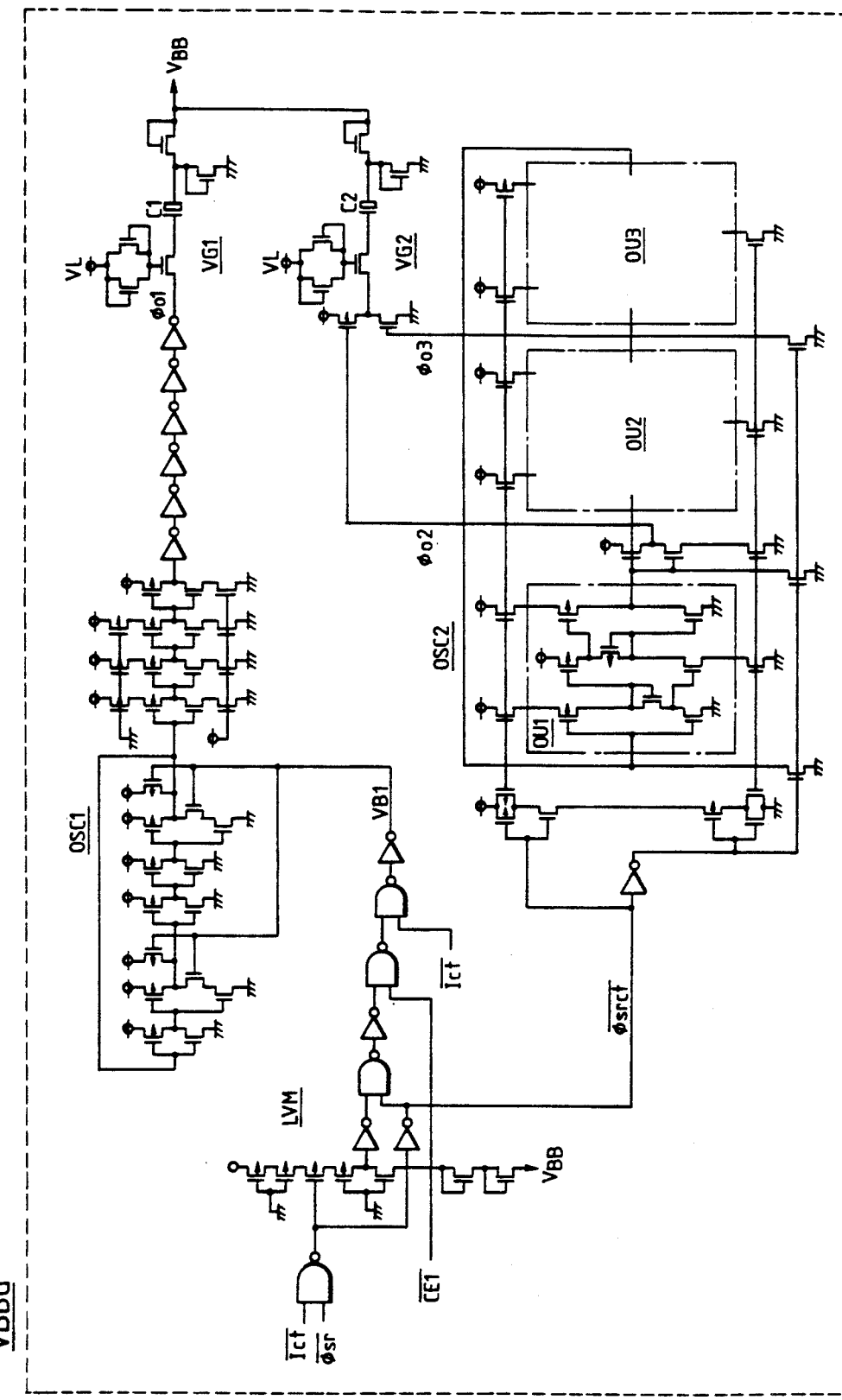

Although there is no particular restriction, the voltage generating circuit VBB comprises, as shown in FIG. 33, an oscillation circuit OSC1 comprising five logic gates connected substantially in series connection in a ring, a charge pumping circuit VG1 which produces a predetermined substrate back bias voltage VBB according to the output pulse signal of the oscillation circuit OSC1, and a level detecting circuit LVM which monitors the level of the substrate back bias voltage VBB to set the oscillation circuit OSC1 selectively in the active state. The voltage generating circuit VBB further comprises an oscillation circuit OSC2 comprising nine inverter circuits connected substantially in series in a ring, and a charge pumping circuit VG2 which generates the substrate back bias voltage according to the output pulse signal of the oscillation circuit OSC2.

Although there is no particular restriction, the level detecting circuit LVM comprises four p-channel MOSFETs and three n-channel MOSFETs provided in series between the supply voltage of the circuit and a substrate back bias voltage applying point VBB. These series-connected MOSFETs monitors the level of the substrate back bias voltage VBB when both the inverted internal control signal ICT and the inverted timing signal $\overline{\phi sr}$ are HIGH. Accordingly, the output signal VB1 of the level detecting circuit LVM goes LOW selectively when the absolute value of the substrate back bias voltage VBB exceeds a set value and the inverted timing signal $\overline{CE1}$ is HIGH.

When the inverted timing signal $\overline{\phi sr}$ is LOW, namely, when the pseudostatic RAM is in the self-refresh mode, the level detecting circuit LVM stops its monitoring operation, while the oscillation circuit OSC2 is in a stationary active state. Consequently, in the self-refresh mode, the through current that flows through the level detecting circuit LVM is prevented to reduce the power consumption of the pseudostatic RAM in the self-refresh mode.

On the other hand, the oscillation circuit OSC1 is set in the active state regardless of the output of the level detecting circuit LVM when the inverted timing signal $\overline{CE1}$ is LOW, namely, when the pseudostatic RAM is in the selected state. Consequently, the drop of the substrate back bias VBB is prevented when the pseudostatic RAM is in the active state. The level detecting circuit LVM and the oscillation circuit OSC1 stop their operation unconditionally and the oscillation circuit OSC2 is set in the active state, when the inverted internal control signal $\overline{ICT}$ goes LOW, namely, when the supply voltage of the circuit is applied to the pad ICT, which will be described afterward. Consequently, the standby current of the pseudostatic RAM in a predetermined probe test or the like enables testing for detecting leakage current.

The charge pumping circuit VG1 has a boost capacitor C1 and employs the charge pumping function of the boost capacitor C1 in generating the predetermined substrate back bias voltage VBB. The boost capacitor C1 has a comparatively large capacitance, and hence the current supply ability of the charge pumping circuit VG1 is comparatively large.

Similarly, the charge pumping circuit VG2 has a boost capacitor C2 to generate the predetermined substrate back bias voltage VBB by the charge pumping action of the boost capacitor C2. Since the capacitance of the boost capacitor C2 is comparatively small, the current supply ability of the charge pumping circuit VG2 is comparatively small.

Incidentally, the voltage generating circuit VBB of the pseudostatic RAM employs the following means to reduce the operating currents of the oscillation circuit OSC2 and the charge pumping circuit VG2.

Figure 56:
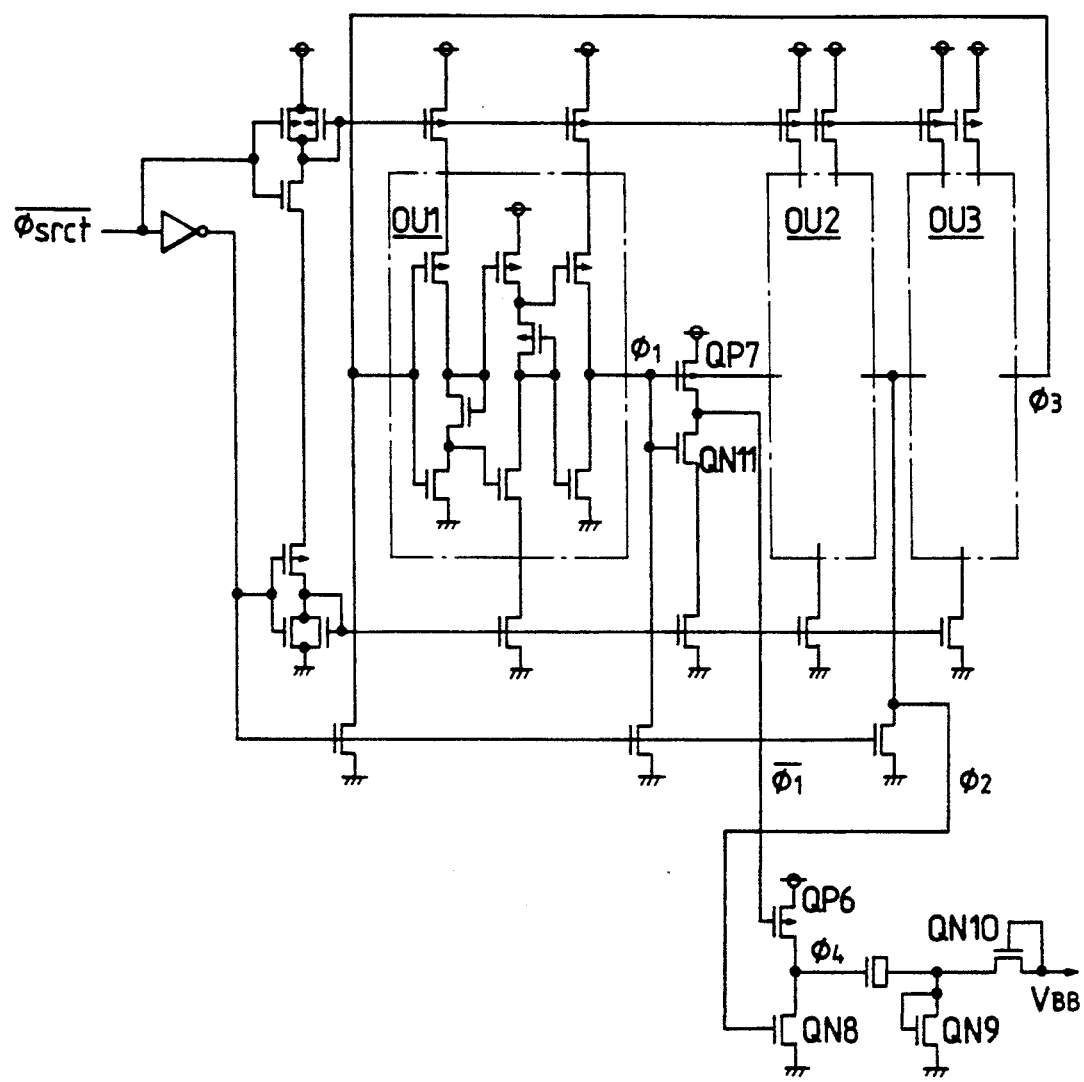

Basically, the oscillation circuit OSC2 is a ring oscillator comprising nine inverter circuits connected substantially in series in a ring as shown in FIG. 56. Each of the inverter circuit comprises MOSFETs each having a very small conductance, and a limited, very small operating current is supplied through p-channel or n-channel MOSFETs connected in a current-mirror relation with each other.

Figure 57:
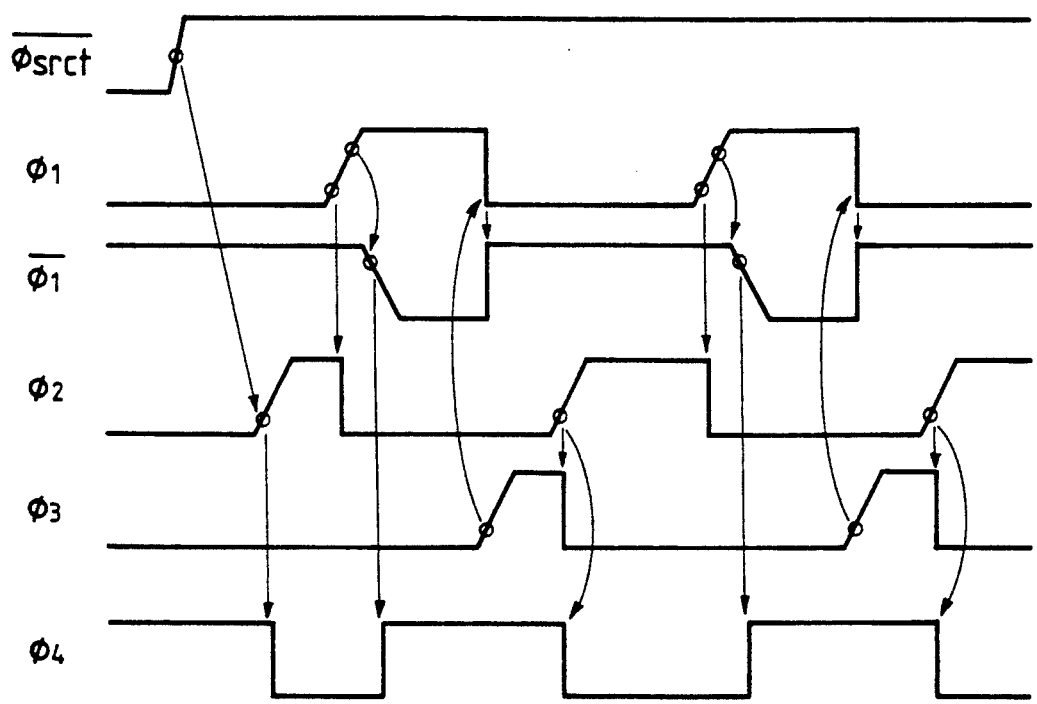

The output signal of the third inverter among the inverters of the oscillation circuit OSC2, i.e., a pulse signal $\phi 1$, is converted into an inverted pulse signal $\overline{\phi 1}$ (first pulse signal) by an inverter circuit consisting of a p-channel MOSFET QP7 and an n-channel FIOSFET QN11. The inverted pulse signal $\overline{\phi 1}$ is applied to the gate of the p-channel MOSFET QP6 (third MOSFET) of the charge pumping circuit VG2. The output signal of the sixth inverter circuit, i.e., a pulse signal $\phi 2$ (second pulse signal), is applied to the gate of the n-channel MOSFET QN8 (fourth MOSFET) of the charge pumping circuit VG. As shown in FIG. 57, the levels of the inverted pulse signal $\overline{\phi 1}$ and the pulse signal $\phi 2$ are always in a complementary relation with each other, and the relation in phase between the same is determined so that the respective periods of inversion of the inverted pulse signal $\overline{\phi 1}$ and the pulse signal $\phi 2$ will not overlap each other, namely, so that the level of one of the pulse signals will not be inverted before and after the inversion of the level of the other pulse signal.

Consequently, the boost capacitor C2 functions for charge pumping operation while the MOSFETs QP6 and QN8 are set in the ON state exclusively to each other. When the MOSFETs QP6 and QN8 constitute an ordinary CMOS inverter, some through current flows in inverting the corresponding pulse signals. When the MOSFETs QP6 and QN8 are set in the ON state exclusively to each other, the through current of the MOSFET is prevented perfectly, so that the power consumption of the voltage generating circuit VBB can be reduced.

Figure 34:
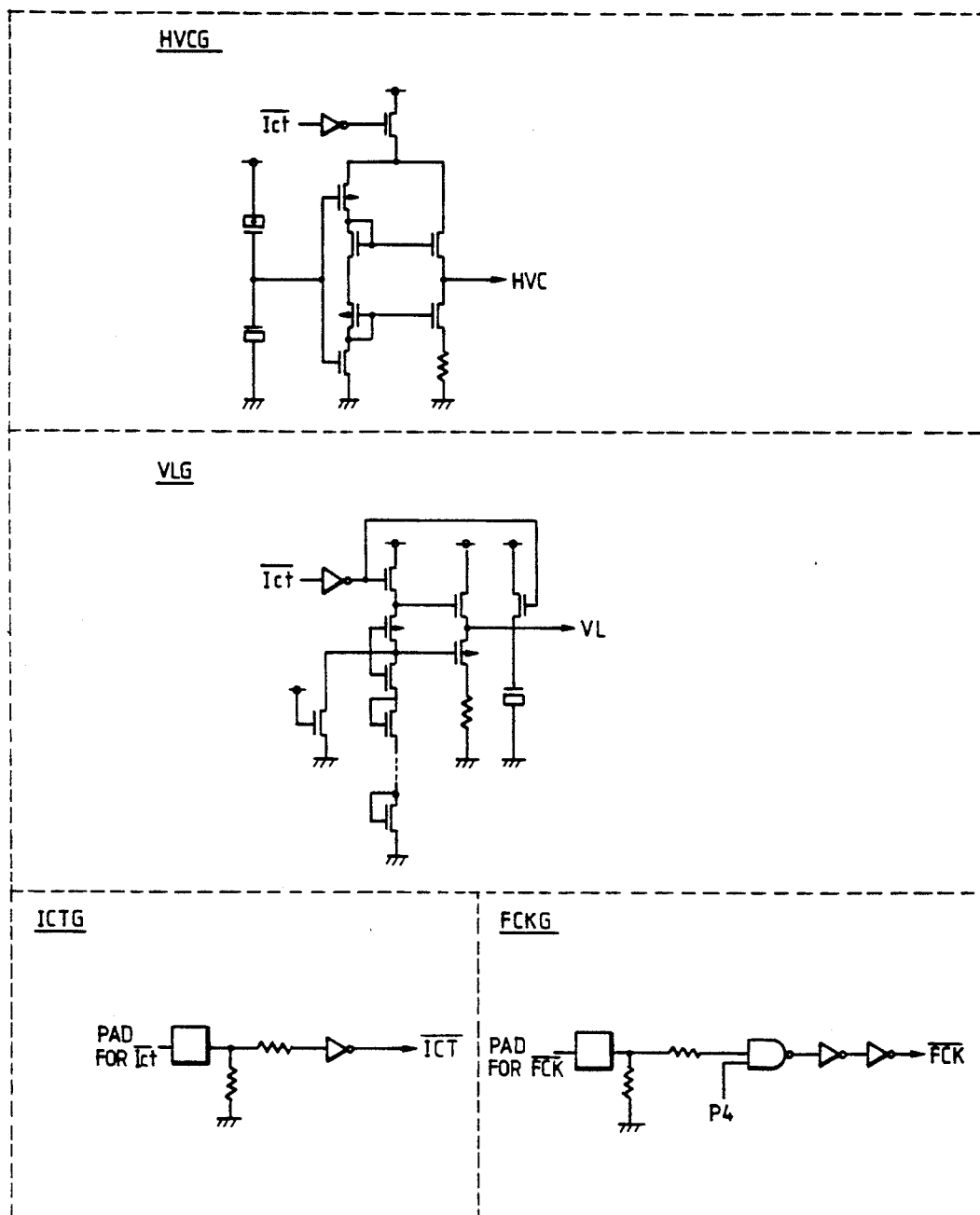

(3) Voltage Generating Circuit VL Referring to FIG. 34, the voltage generating circuit VL steps down the supply voltage VCC of the circuit to generate a predetermined internal voltage VL. The internal voltage VL is used as a reference potential for the clamp circuit and the like of the voltage generating circuit VBB and the like.

The operation of the voltage generating circuit VL is stopped selectively when the inverted internal control signal $\overline{ICT}$ goes LOW to reduce the standby current of the pseudostatic RAM.

1.2.7 Test Circuit (1) High-Voltage Detecting Circuits

As stated above, the pseudostatic RAM is set selectively in the test mode by applying the predetermined high voltage higher than the supply voltage of the circuit to the external terminal $\overline{OE}$, $\overline{WE}$ or $\overline{CE}$ of the pseudostatic RAM. ighen the predetermined high voltage is applied to the address input terminal A4, the pseudostatic RAM sends out a signature signal relating to the redundant circuits. Accordingly, the pseudostatic RAM has four high-voltage detecting circuits EHG corresponding respectively to these external terminals.

As shown in FIG. 35, the high-voltage detecting circuits EHG have each a plurality of MOSFETs provided in series between the corresponding external terminal and the ground potential of the circuit. When the high voltage is applied to the corresponding external terminals of the high-voltage detecting circuits EHG, the respective output signals thereof, i.e., inverted internal control signals $\overline{\phi eh1}$ to $\overline{\phi eh4}$, are set LOW selectively.

The inverted internal control signals $\overline{\phi eh1}$ to $\overline{\phi eh4}$ are applied to the corresponding test circuits or signature circuits SG.

(2) ICT Signal Generating Circuit ICT

Referring to FIG. 34, the output signal, i.e., the inverted internal control signal $\overline{ICT}$ of the ICT signal generating circuit ICT changes selectively from HIGH to LOW when the supply voltage of the circuit is applied to a pad ICT. When the pad ICT is open, the inverted internal control signal $\overline{ICT}$ is fixed HIGH.

As stated above, the inverted internal control signal $\overline{ICT}$ is applied to the voltage generating circuits HVC, VBB and VL to reduce the standby current of the pseudostatic RAM in the predetermined probe test mode.

(3) $\overline{FCK}$ Signal Generating Circuit FCK

Referring to FIG. 34, the output signal of the FCK signal generating circuit FCK, i.e., an inverted internal control signal $\overline{FCK}$, changes from HIGH to LOW when the supply voltage of the circuit is applied to a pad FCK provided that the timing signal P4 is HIGH. When the pad FCK is open, the inverted internal control signal $\overline{FCK}$ is fixed HIGH regardless of the timing signal P4.

As stated above, the inverted internal control signal $\overline{FCK}$ is applied to the X-system redundant circuit and the Y-system redundant circuit for testing the partial disconnection or the like of the fuse.

(4) Signature Circuit SG

Referring to FIG. 35, the signature circuit SG has a single n-channel MOSFET provided between the address input terminal A5 and the ground potential of the circuit. The MOSFET is set in the ON state to short-circuit the address input terminal A5 to the ground potential of the circuit when the internal control signal SIGX or SIGY provided by the X-system redundant circuit or the Y-system redundant circuit is HIGH and the output signal of the high-voltage detecting circuit EHG, i.e., the inverted internal control signal $\overline{\phi eh4}$, is LOW.

Consequently, the assignment of a bad address to either the redundant word line or the redundant complementary data line can be detected by monitoring the address input terminal A5 after completing the pseudostatic RAM.

As is apparent from the foregoing description of the pseudostatic RAM embodying the present invention, the application of the present invention to the semiconductor memory, such as a pseudostatic RAM provides the following functions and advantages.

(1) In the output buffer including a pair of output n-channel MOSFETs arranged in a form resembling a totem pole between the supply voltage of the circuit and the ground potential of the circuit, and latch circuits for holding the output data of the corresponding output MOSFETS, the LOW or HIGH output of the output buffer can be made selectively to rise rapidly by presetting the latch circuits at logic "1" or "0".

(2) In the oscillation circuit including the capacitor, and resistor means for setting the discharge current of the capacitor, and capable of producing a predetermined pulse signal by repeatedly charging and discharging the capacitor, the first well region to be connected to the supply voltage of the circuit is formed under the half portion of the polycrystalline silicon layer serving as the resistor means, and the second well region to be connected to the ground potential of the circuit is formed in the other half portion of the polycrystalline silicon layer to make uniform the substrate capacitance between the resistor means and the supply voltage of the circuit and between the resistor means and the ground potential of the circuit. Accordingly, the deterioration of the characteristics of the oscillation circuit included in the refresh timer circuit or the like attributable to the bumping (varying) of the power source can be suppressed.

(3) The oscillation circuit included in the substrate back bias voltage generating circuit or the like is provided with an odd number of inverter circuits connected substantially in series in a ring, and the paired p-channel and n-channel MOSFETs provided between the output node and the supply voltage or ground potential of the circuit so as to be set exclusively in the ON state by the output signals of the predetermined two inverter circuits among those odd number of inverter circuits to prevent the through current through those MOSFETS, so that the power consumption of the oscillation circuit, hence that of the substrate back bias voltage generating circuit, can be reduced.

(4) In the oscillation circuit including the capacitor which is charged selectively through the p-channel MOSFET which is turned on according to the predetermined timing signal, and discharged selectively through the current-mirror circuit which transfers the predetermined discharge current produced by the constant-current source, the charging voltage of the capacitor and the reference potential of the constant current source are produced by another capacitor which is caused to float at a moment when the p-channel MOSFET is turned off, so that the variation of the frequency of the oscillation circuit included in the refresh timer circuit or the like attributable to the bumping of the power source can be suppressed.

(5) In the voltage generating circuit comprising the first p-channel and n-channel MOSFETs provided in series between the supply voltage of the circuit and the ground potential of the circuit, the second p-channel and n-channel MOSFETs connected in parallel to the first p-channel and n-channel MOSFETS, and the third p-channel and n-channel MOSFETs provided between the first p-channel and n-channel MOSFETs in the current-mirror relation with the second p-channel and n-channel MOSFETS, the drain and well region of the third p-channel MOSFET are connected, so that the through current that flows through the second p-channel and n-channel MOSFETs can be suppressed without being affected by the variation of the process, and the power consumption of the voltage generating circuit can be reduced.

(6) In Paragraph (5), the fourth p-channel and n-channel MOSFETs are provided in parallel too the second p-channel and n-channel MOSFETs and in a current-mirror relation with the third p-channel and n-channel MOSFETS, the through current that flows through the second p-channel and n-channel MOSFETs can be suppressed without forming any dead zone in the voltage generating circuit by setting the conductance ratio between these MOSFETs and the third p-channel and n-channel MOSFETS at an appropriate value, so that the power consumption of the voltage generating circuit can be reduced.

(7) The fuse circuit provided in the redundant circuit or the like and basically having the configuration of a fuse logic gate circuit including fuse means provided between its output node and the p-channel or n-channel MOSFET is simple in construction, and hence the cost of the redundant circuit or the like can be reduced.

(8) In Paragraph (7), the fuse circuit is provided with a pair of fuse logic gate circuits, such as the foregoing fuse logic gate circuit, and the disconnection of the fuse means can be cancelled by subjecting the output signals of the fuse logic gate circuits to an exclusive OR operation, so that the flexibility of the redundant circuit in the bad address assigning process can be enhanced and thereby the yield of the pseudostatic RAM or the like can be improved.

(9) Since the refresh period of the pseudostatic RAM or the like can be changed selectively in the PS (pseudo) refresh mode or the VS (virtual) refresh mode, a pseudostatic RAM or the like applicable to both the PS refresh mode and the VS refresh mode can efficiently be developed and manufactured by using a cormnon semiconductor substrate.

(10) The number of signal lines to be arranged in a comparatively narrow space can be reduced to reduce the area necessary for laying out the components of the pseudostatic RAM or the like by selectively transferring a plurality of signals respectively having different significances signifying operating modes, for example, a predetermined signal line provided between the Y-predecoder and the Y-decoder.

(11) In the pseudostatic RAM or the like including static main amplifiers connected to common I/O lines, and preset MOSFETs for setting the bias voltage of the noninverted and inverted signal lines of the common I/O lines at a bias voltage at which the sensitivity of the main amplifiers is increased to the maximum, the operating current of the main amplifier can be reduced to reduce the power consumption of the pseudostatic RAM or the like by setting the preset MOSFET temporarily in the ON state immediately before setting the main amplifier is set in the active state.

(12) In the redundant circuit including the plurality of redundant address comparing circuits which hold bits corresponding to the bad addresses assigned to the corresponding redundant word lines or redundant data lines and compares the bits with bits corresponding to the address signals for memory access, and the plurality of cascade MOSFETs provided in series between the predetermined detection node and the ground potential of the circuit to receive the output signals of the redundant address comparing circuits, the redundant address comparing circuits and the cascade MOSFETs are distributed over the surface of the semiconductor substrate respectively near the corresponding address input pads, so that the signal transfer delay time of the redundant circuit can be curtailed to enhance the operating speed of the pseudostatic RAM or the like.

(13) In the pseudostatic RAM or the like comprising pairs of memory arrays, each pair of memory arrays being arranged in axial symmetry, and a common I/O line common to each pair of memory arrays, extending across each pair of memory arrays, the noninverted and inverted signal lines of the common I/O line are extended so as to intersect each other at a position between each pair of memory arrays, so that the variation of the parasitic capacitance of the common I/O line attributable, for example, to the misregister of the photomask can be cancelled and hence the operation of the pseudostatic RAM or the like can be stabilized.

(14) In Paragraph (13), the common I/O line is equalized at positions between the corresponding pair of memory arrays and outside the corresponding pair of memory arrays to enhance the speed of the common I/O line equalizing process and to stabilize the common I/O line equalizing process.

(15) In the pseudostatic RAM or the like comprising a plurality of sense amplifiers corresponding to the complementary data lines of the memory arrays, the sources of the p-channel or n-channel MOSFETs of the sense amplifiers are connected in common through the corresponding contacts to a common source line formed of a metallic wiring layer, such as an aluminum wiring layer, and the diffused layer forming the source region is extended to connect in common the sources of the adjacent pairs of p-channel or n-channel MOSFETS, so that troubles in the sense amplifiers attributable, for example, to faulty contact are relieved and thereby the yield of the pseudostatic RAM or the like can be improved.

(16) In the pseudostatic RAM or the like comprising the plurality of memory arrays distributed over the surface of the semiconductor substrate, the plurality of decoders respectively corresponding to the memory arrays, and predecoders which produce predecode signals according to predetermined address signals and apply the predecode signals to the corresponding decoders, the drivers for selectively transferring the predecode signals to the corresponding decoders are distributed near the corresponding decoders to curtail the delay time in transferring the predecode signals and thereby the operating speed of the pseudostatic RAM or the like can be enhanced.

(17) In the pseudostatic RAM or the like comprising the plurality of memory arrays disposed in axial symmetry with respect to the center line of the semiconductor substrate and each including a plurality of redundant word lines or redundant complementary data lines, the redundant word lines or the redundant data lines are arranged in axial symmetry with respect to the center line to increase the rate of occurrence of problems or faults in the outer redundant word lines or the redundant data lines intentionally and to decrease the rate of occurrence of problems or faults in the inner redundant word lines or the redundant data lines so that the general rate of occurrence of problems or faults in the redundant word lines or the redundant data lines is decreased and thereby the yield of the pseudostatic RAM or the like can be improved.

(18) In the pseudostatic RAM or the like including the timer counter circuits and the like which are set for the initial count when the predetermined fuse means are disconnected, a state equivalent to the disconnection of the fuse means can be set, for example, by the test signal applied to the address input terminal in the predetermined test mode to enable the accurate and efficient evaluation of the characteristics of the refresh timer counter circuits of the pseudostatic RAM or the like.

(19) In the pseudostatic RAM or the like capable of operating in the self-refresh mode and provided with the refresh timer counter circuit which periodically starts the refresh operation in the self-refresh mode at a predetermined period, a test start signal applied to a predetermined external terminal can be used in a predetermined test mode instead of the refresh start signal produced by the refresh timer counter, so that an optional refresh period for the self-refresh mode of the pseudostatic RAM or the like can be set to enable the efficient evaluation of the characteristics.

(20) In Paragraph (19), the dependence of the pseudostatic RAM or the like on the address in the refresh operation can efficiently be tested by optionally specifying the refresh address by a signal applied to the address input terminal in the self-refresh mode.

(21) The test circuit of the pseudostatic RAM or the like can be simplified to reduce the cost of the pseudostatic RAM or the like by applying a predetermined high voltage of an absolute value exceeding the supply voltage of the circuit to the plurality of external terminals in a selected combination to set the test mode selectively and to start the substantial test operation.

(22) The foregoing functions and advantages stabilizes the operation of the pseudostatic RAM, enhances the operating speed of the pseudostatic RAM or the like and reduces the power consumption of the pseudostatic RAM or the like.

Although the invention has been described with reference to the preferred embodiments thereof, the present invention is not limited in its practical application to the embodiments specifically described herein and, naturally, many changes and variations may be made therein without departing from the scope and spirit thereof. For example, the number of individual memory arrays and the combination of the memory arrays and the peripheral circuits are optional, and the numbers of the word lines, redundant word lines, complementary data lines, redundant complementary data lines and the common I/O lines are optional. Furthermore, various kinds of operating modes, test modes and operating cycles of the pseudostatic RAM, and various combinations of the corresponding start control signals are possible. Similarly, the numbers, logic levels and combination of the start control signals, the address signals and the input and output data are optional. Still further, the concrete circuit configurations of the components, the concrete layout, and the logic levels and combinations of the internal control signals and the timing signals illustrated in the circuit diagrams and layout diagrams are only for example and not restrictive.

Although the invention has been described as applied to the pseudostatic RAM representing the background field of the present invention, the present invention should not be considered as being limited thereto in its practical application. Also, the improved aspects thereof including that relating to the output buffer, the oscillation circuit, the voltage generating circuit, the fuse circuit, the layout and the test method are applicable to various other semiconductor memories and semiconductor integrated circuits.

EFFECT OF THE INVENTION

Representative inventions disclosed in this application has the following effects. The reference potential of a MOSFET for setting the discharge current of the capacitor of an oscillation circuit included in the refresh timer circuit or the like of a pseudostatic RAM is determined by another capacitor which is made to float in the discharge period; a well region to be connected to the supply voltage of the circuit is formed under the approximately half portion of a polycrystalline silicon layer forming the resistor of the oscillation circuit; a well region to be connected to the ground potential of the circuit is formed Under the other half portion of the polycrystalline silicon layer; and the pseudostatic RAM or the like is prepared for a test mode in which the initial count of the refresh timer counter circuit of the refresh timer circuit can be set at an optional value by applying a signal, for example, to the address input terminal, and a test mode in which the refresh period can be set at an optional value by a test control signal applied to a predetermined external terminal. Accordingly, the discharge current of the capacitor of the oscillation circuit of the refresh timer circuit or the like is stabilized, and the substantially the same parasitic capacitances are connected between the polycrystalline silicon resistor and the supply voltage of the circuit and between the polycrystalline silicon resistor and the ground potential of the circuit to cancel the variation of the output of the power source. Therefore, the variation of the oscillation frequency of the oscillation circuit attributable to the bumping of the power source can be suppressed. Since the operating characteristics of the oscillation circuit and the refresh timer counter circuit, and the dependence of the information holding characteristics of the memory cells on the address can efficiently be tested, the refresh period of the pseudostatic RAM can be set accurately at a value closer to the information holding ability of the memory cells. Thus, the power consumption of the pseudostatic RAM can be reduced stabilizing the operation of the pseudostatic RAM.

What is claimed is:

1. An oscillation circuit comprising: a first MOSFET the charging or discharging current of which determines the frequency of oscillation; a second MOSFET coupled in a current-mirror relation with said first MOSFET; resistor means, coupled in series with said second MOSFET between respective connections supplied with first and second supply voltages, substantially for setting the valve of the charging current or the discharging current; a first logic inverter having an input coupled to an output of said first MOSFET thereby effecting a charging/discharging node; and a series arrangement of a delay circuit and a second logic inverter coupled between an output of said first logic inverter and an output node of said oscillation circuit and being included in a feedback circuit for effecting control of said charging or discharging current, wherein said resistor means includes a polycrystalline silicon layer formed on an insulating layer over a main surface of a semiconductor substrate of a first conductivity type, and wherein said polycrystalline silicon layer is extended over respective first and second main surface well regions of said semiconductor substrate, said first and second wall regions being of a second conductivity type, opposite that of said first conductivity type, and said first and second well regions being biased by said first and second supply voltages, respectively.

2. An oscillation circuit according to claim 1, wherein said polycrystalline silicon layer is a large resistance film extended substantially equally over said first and second well regions, said first and second supply voltages are applied to locations of said first and second well regions in the vicinity of opposing ends of said polycrystalline silicon layer.

3. An oscillation circuit according to claim 2, wherein said first and second conductivity types are p-type and n-type, respectively.

4. An oscillation circuit according to claim 1, wherein said first and second logic inverters are MOSFET inverters, respectively, each of which including a driver MOSFET channel-to-channel series coupled with a load MOSFET between connections applied with said first and second supply voltages.

5. An oscillation circuit according to claim 4, wherein said first MOSFET is channel-to-channel series coupled, between connections applied with said first and second supply voltages, with a complementary channel type third MOSFET having a gate thereof coupled to the output node of said oscillation circuit.

6. An oscillation circuit according to claim 5, wherein said current-mirror relation corresponds to a current-mirror arrangement including a controlling current path and a controlled current path, said controlling current path including the series coupled said second MOSFET and said resistor means, and said controlled current path includes the series coupled said first MOSFET and a complementary, fourth MOSFET associated therewith.

7. An oscillation circuit according to claim 6, wherein said second MOSFET is diode configured and has the gate thereof connected to the gate of said first MOSFET.

8. An oscillation circuit according to claim 7, wherein said controlling current path further includes a fifth MOSFET, said fifth MOSFET being of a channel conductivity type corresponding to that of the load MOSFETs of each inverter and complementary to that of said second MOSFET, said fifth MOSFET being diode configured and having the gate thereof connected to the gate of the load MOSFET of said first logic inverter.

9. An oscillation circuit according to claim 8, wherein said first and second MOSFETs and the driver MOSFET of each logic inverter are of a first channel conductivity type MOSFET and the load MOSFET of each logic inverter and said third MOSFET are of a second channel conductivity type MOSFET.

10. An oscillation circuit according to claim 9, wherein said first and second channel conductivity type MOSFETs are n-channel type and p-channel type MOSFETs, respectively.

11. An oscillation circuit according to claim 10, wherein said polycrystalline silicon layer is a large resistance film extended substantially equally over said first and second well regions, said first and second supply voltage are applied to locations of said first and second well regions in the vicinity of opposing ends of said polycrystalline silicon layer.

12. An oscillation circuit according to claim 11, wherein said first and second conductivity types are p-type and n-type, respectively.

13. An oscillation circuit according to claim 12, wherein said resistor means is arranged in said controlling current path between said diode configured second and fifth MOSFETs.

14. An oscillation circuit according to claim 13, wherein said oscillation circuit constitutes a single ring oscillator included in a refresh timer circuit for activating a refresh operation of a semiconductor memory, said refresh timer circuit being a component of a refresh timer counter circuit provided for effecting control of the refresh operation including the internally controlled refresh period of said semiconductor memory.

15. An oscillation circuit according to claim 14, wherein said first supply voltage corresponds to an operating voltage of said semiconductor memory and said second supply voltage is reference ground.

16. An oscillation circuit according to claim 15, wherein said series arrangement of said delay circuit and said second logic inverter together constitute an odd number of series-connected logic inverters.

17. An oscillation circuit according to claim 16, wherein all inverters in said delay circuit are comprised of n-channel and p-channel MOSFETs series connected channel-to-channel.

18. An oscillation circuit according to claim 14, wherein all inverters in said delay circuit are comprised of n-channel and p-channel MOSFETs series connected channel-to-channel.

19. An oscillation circuit according to claim 10, wherein said resistor means is arranged in said controlling current path between said diode configured second and fifth MOSFETs.

20. An oscillation circuit according to claim 19, wherein said polycrystalline silicon layer is large resistance film extended substantially equally over said first and second well regions, said first and second supply voltages are applied to locations of said first and second well regions in the vicinity of opposing ends of said polycrystalline silicon layer.

21. An oscillation circuit according to claim 20, wherein said first and second conductivity types are p-type and n-type, respectively.

22. An oscillation circuit according to claim 4, wherein said driver and load MOSFETs of each inverter are of complementary channel conductivity type.

23. An oscillation circuit according to claim 22, wherein said oscillation circuit constitutes a single ring oscillator included in a refresh timer circuit for activating a refresh operation of a semiconductor memory, said refresh timer circuit being a component of a refresh timer counter circuit provided for effecting control of the refresh operation including the internally controlled refresh period of said semiconductor memory.

24. An oscillation circuit according to claim 23, wherein said first supply voltage corresponds to an operating voltage of said semiconductor memory and said second supply voltage is reference ground.

25. An oscillation circuit according to claim 24, wherein said series arrangement of said delay circuit and said second logic inverter together constitute an odd number of series-connected logic inverters.

26. An oscillation circuit according to claim 1, wherein said oscillation circuit constitutes a single ring oscillator included in a refresh timer circuit for activating a refresh operation of a semiconductor memory, said refresh timer circuit being a component of a refresh timer counter circuit provided for effecting control of the refresh operation including the internally controlled refresh period of said semiconductor memory.

27. An oscillation circuit according to claim 26, wherein said first supply voltage corresponds to an operating voltage of said semiconductor memory and said second supply voltage is reference ground.

28. An oscillation circuit, powered by first and second supply voltages, comprising: a first capacitor provided between a first internal node of said oscillation circuit and said second supply voltage; a level comparing circuit having an input coupled to said first internal node and having an output; a logic inversion delay circuit which receives the output signal of said level comparing circuit; a first MOSFET which is set to the ON state selectively according to the output signal of said logic inversion delay circuit, provided between said first supply voltage and said first internal node; a second capacitor provided between a second internal node of said oscillation circuit and said second supply voltage; a voltage generating circuit, operating by said first and second supply voltages, which provides a predetermined set voltage at an output node thereof; a second MOSFET which is set to the ON state selectively according to the output signal of the inversion delay circuit and substantially simultaneously with said first MOSFET, provided between the output node of said logic said voltage generating circuit and said second internal node; a third MOSFET having a gate coupled to said second internal node; a series circuit including resistor means and a fourth MOSFET provided between said third MOSFET and said second supply voltage; and a fifth MOSFET provided between said first internal node and said second supply voltage and being coupled in a current-mirror relation with said fourth MOSFET.

29. An oscillation circuit according to claim 28, wherein said level comparing circuit includes a first MOSFET logic inverter having a predetermined threshold, and wherein said first internal node is common to both the drain of said fifth MOSFET and the gate of a driver MOSFET of said first MOSFET logic inverter.

30. An oscillation circuit according to claim 29, wherein in said series circuit said resistor means is coupled between the source of said third MOSFET and the drain of said fourth MOSFET.

31. An oscillation circuit according to claim 30, wherein said first MOSFET is coupled to said first internal node via the channel of a sixth MOSFET having the gate thereof commonly coupled with the gate of said third MOSFET to said second internal node.

32. An oscillation circuit according to claim 31, wherein said current-mirror relation corresponds to a current-mirror arrangement including a control current path and first and second controlled current paths, wherein said controlling current path includes a series connection of said fourth MOSFET, said resistor means, said third MOSFET and a seventh MOSFET, provided in that order, between said second supply voltage and said first supply voltage, and wherein said first controlled current path includes said fifth MOSFET, and wherein said second controlled current path includes an eighth MOSFET, coupled as a load MOSFET of said first MOSFET logic inverter.

33. An oscillation circuit according to claim 32, wherein said fourth and seventh MOSFETS are diode configured MOSFETs in which the drains thereof are connected to the gates of said fifth and eighth MOSFETs, respectively and wherein said sixth MOSFET operates as a non-inverting amplifier.

34. An oscillation circuit according to claim 33, wherein said third, fourth, fifth and sixth MOSFETs and said driver MOSFET are of a first channel conductivity type and said first, second, seventh and eight MOSFETs are of a second, complementary channel conductivity type.

35. An oscillation circuit according to claim 34, wherein said logic inverting delay circuit is constituted by a series arranged odd number of MOS inverters in which an input of the first stage thereof is a logic invert of a signal level at said first node and an output of the last stage thereof is connected in common to the gates of said first and second MOSFETS.

36. An oscillation circuit according to claim 35, wherein said first and second channel conductivity types are n-type and p-type, respectively.

37. An oscillation circuit according to claim 36, wherein said oscillation circuit constitutes a single ring oscillator included in a refresh timer circuit for activating a refresh operation of a semiconductor memory, said refresh timer circuit being a component of a refresh timer counter circuit provided for effecting control of the refresh operation including the internally controlled refresh period of said semiconductor memory.

38. An oscillation circuit according to claim 37, wherein said first supply voltage corresponds to an operating voltage of said semiconductor memory and said second supply voltage is reference ground.

39. An oscillation circuit according to claim 35, wherein said voltage generating circuit includes a voltage division arrangement of complementary MOSFETs.

40. An oscillation circuit according to claim 28, wherein said oscillation circuit constitutes a single ring oscillator included in a refresh timer circuit for activating a refresh operation of a semiconductor memory, said refresh timer circuit being a component of a refresh timer counter circuit provided for effecting control of the refresh operation including the internal controlled refresh period of said semiconductor memory.

41. An oscillation circuit according to claim 40, wherein said first supply voltage corresponds to an operating voltage of said semiconductor memory and said second supply voltage is reference ground.

42. An oscillation circuit according to claim 41, wherein said logic inverting delay circuit is constituted by a series arranged odd number of MOS inverters in which an input of the first stage thereof is a logic invert of a signal level at said first node and an output of the last stage thereof is connected in common to the gates of said first and second MOSFETs.

* * * * *